United States Patent
Campmas et al.

Patent Number: 5,717,928
Date of Patent: Feb. 10, 1998

[54] SYSTEM AND A METHOD FOR OBTAINING A MASK PROGRAMMABLE DEVICE USING A LOGIC DESCRIPTION AND A FIELD PROGRAMMABLE DEVICE IMPLEMENTING THE LOGIC DESCRIPTION

[75] Inventors: Michel J. Campmas, Palo Alto; William A. Johnston, San Jose; Gai-Bing Chen, Cupertino, all of Calif.

[73] Assignee: Matra Hachette SA, Paris, France

[21] Appl. No.: 610,479

[22] Filed: Nov. 7, 1990

[51] Int. Cl.⁶ .................................................. G06F 15/60
[52] U.S. Cl. ................... 395/701; 395/500; 395/185.06; 395/183.13
[58] Field of Search .................................. 395/500, 600, 395/700; 364/578, 488, 451, 452

[56] References Cited

U.S. PATENT DOCUMENTS

| | | | |
|---|---|---|---|
| 4,590,581 | 5/1986 | Widdoes, Jr. | 364/578 |
| 4,829,427 | 5/1989 | Green | 395/600 |
| 4,901,259 | 2/1990 | Watkins | 364/578 |
| 4,967,386 | 10/1990 | Maeda et al. | 364/578 |
| 5,051,938 | 9/1991 | Hyduke | 364/578 |
| 5,089,985 | 2/1992 | Chang et al. | 395/600 |
| 5,201,046 | 4/1993 | Goldberg et al. | 395/600 |
| 5,202,889 | 4/1993 | Aharon et al. | 371/27 |
| 5,258,919 | 11/1993 | Yamanouchi et al. | 364/489 |

OTHER PUBLICATIONS

"Dynamic process for generation of biased pseudo–random test patterns for the functional verificaiton of hardware designs"; Aharon et al, Apr. 1990 (Isarael).

"A VLSI Design Verification Strategy", Aharon Tran et al; IBM Research and Development vol. 26, No. 4, Jul. 1982, p. 475–484.

"The Weighted Random Test–Pattern Generator", Daniel Schmurmann et al, IEEE transaction of computer, vol. c–24, No. 7; Jul. 1975, pp. 695–700.

Dan Powers, "FGPA to Gate Array Migration: The Best of Both Worlds," May 1990, pp. 345–348, Electro Conference Record, vol. 15, No. 9–11.

*Primary Examiner*—Meng-Ai T. An
*Attorney, Agent, or Firm*—Skjerven, Morrill, MacPherson, Franklin & Friel; Edward C. Kwok

[57] ABSTRACT

In accordance with the present invention, a system and method for converting an implementation of a logic description describing a field programmable device into an implementation of the same logic in a factory-programmed device are provided. In one embodiment of the present invention, an expert system synthesizes a logic circuit model based on the logic description. An automatic test pattern generator provides test vectors including expected response signals for the logic circuit model generated by the expert system. The automatically generated test vectors are provided to a tester which applies the test vectors as input stimuli to the field programmable device. The output signals of the field programmable device are verified against the expected response signals. If the output signals of the field programmable device match the expected response signals, the computer model is considered correct, and mask layout may begin for the building a mask-programmable circuit which performs the functions described in the logic description.

8 Claims, 8 Drawing Sheets

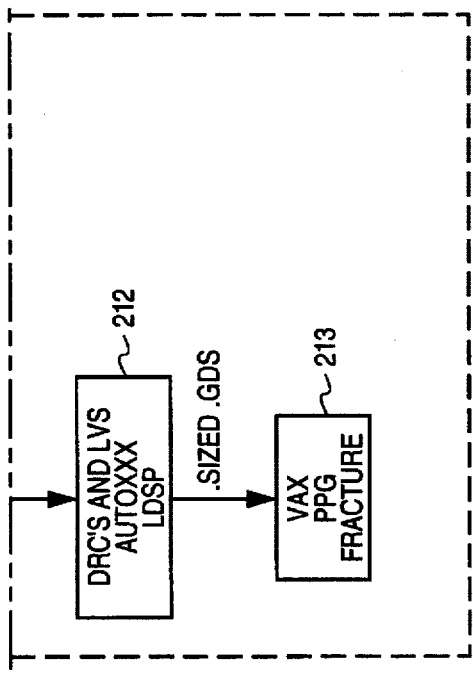

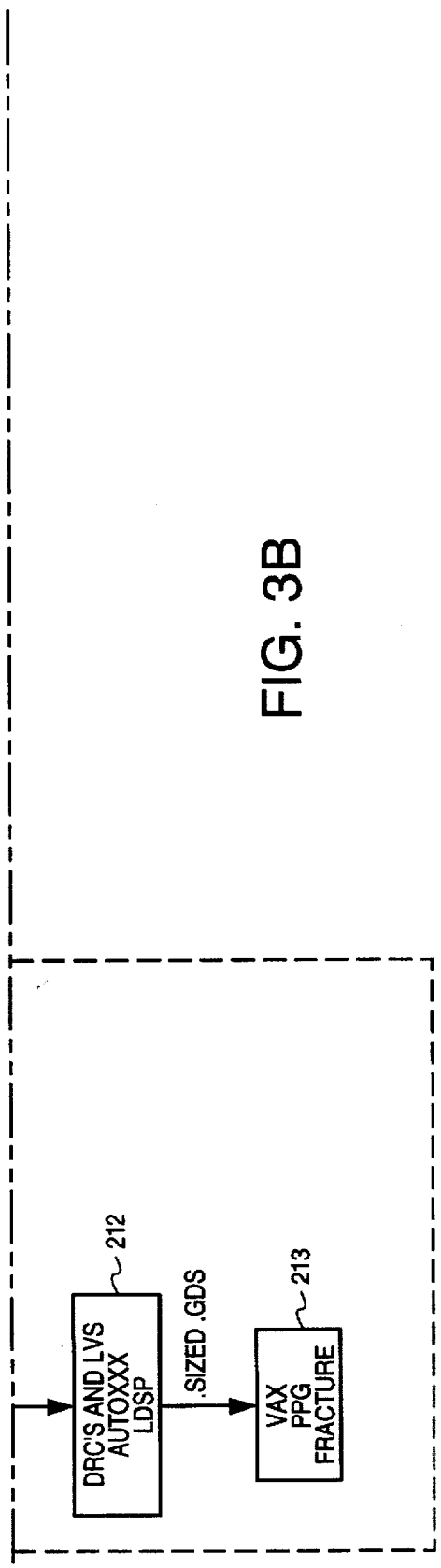

5,717,928

SYSTEM AND A METHOD FOR OBTAINING A MASK PROGRAMMABLE DEVICE USING A LOGIC DESCRIPTION AND A FIELD PROGRAMMABLE DEVICE IMPLEMENTING THE LOGIC DESCRIPTION

FIELD OF THE INVENTION

This invention relates to the field of integrated circuits. In particular, this invention relates to the field of programmable logic devices.

BACKGROUND OF THE INVENTION

Field programmable logic devices, also commonly known as programmable logic devices (PLDs), are programmable integrated circuits sold to the user unprogrammed. The user then programs the device to provide logic functions required by his/her application. Examples of PLDs are discussed in the "PAL Device Data Book," third edition (1988), published by Advanced Micro Devices, Inc. of Sunnyvale, Calif., incorporated herein by reference in its entirety. (PALs and FPLAs are types of PLDs.)

Because a PLD can be conveniently programmed using commercially available programming equipment, PLDs provide design flexibility and quick turn-around, which are important advantages for certain applications. For example, in the development of a product prototype, debugging in the field environment can be accomplished by simply replacing a faulty PLD by one implementing the correct logic. However, because each PLD must be individually programmed, PLDs are more expensive than factory-programmed devices, which are mask programmed in large batches during the fabrication process without additional cost. It is therefore cost effective, when a product is in high volume production, to replace a PLD with a pin-for-pin compatible factory-programmed device, after product development is stabilized.

A gate array circuit is a popular factory-programmed substitute for a PLD. A gate array circuit is typically programmed by providing during fabrication a customized pattern of interconnect metallization, to interconnect the underlying generic array of transistors. The pattern of interconnect metallization is provided using customized photomasks. The gate array circuit emerging from the fabrication process implements application-specific logic functions. Presently, the conversion from a PLD circuit to a factory-programmed circuit involves close cooperation between the supplier of the factory-programmed circuit (hereinafter, the "ASIC vendor") and the user of the PLD (hereinafter, the "customer"). FIG. 1 shows the steps required to accomplish the conversion.

Referring to FIG. 1, the customer provides to the ASIC vendor at step 100 the logic description implemented in the PLD. As illustrated by step 101, this logic description is then translated into a schematic representation of a logic circuit. This step is often accomplished using a software schematic capture program. From this schematic representation, a netlist is generated for use with simulators and verifiers at step 102. These simulators and verifiers are software programs which simulate the operation of the circuit represented by the netlist to ensure that the intended logic functions are correctly provided. Often at this step, propagation delays exhibited by the logic circuit represented by the netlist are estimated to determine if timing performance targets are met.

The process of generating an acceptable schematic representation from logic descriptions as illustrated by the model shown in FIG. 1, is not always straight forward. For example, it is common for a schematic representation to be corrected and resimulated multiple times before arriving at an acceptable final representation. At this point, as illustrated by decision point 110, the customer typically provides a "sign-off" to the ASIC vendor, indicating permission to go ahead to the next step 103, during which the layout of the customized mask is generated ("layout generation"). The customer bases his/her go-ahead decision upon careful perusal of the simulation and verification results.

Layout generation step 103 requires taking the netlist of the schematic representation to create patterns of geometric shapes on the customized "mask" layers. The customized masks created from these patterns are used in some of the photolithographic steps in the circuit fabrication process. These masks are generated according to the design rules of the ASIC vendor's fabrication process and circuit technology. The layout generation step 103 is also typically achieved using a variety of design software programs and databases. Some examples of these software programs and databases are place and route programs and "cell" (component) libraries.

The layout generated by step 103, is provided to a simulation and verification program at step 104 to ensure that logic functions and timing parameters are accurately preserved during the translation from the netlist representation to the layout representation. These simulation and verification programs may be the same as those used in step 102 discussed above. At this point, many parameters specific to the physical implementation of the circuit, such as timing, may be more accurately estimated. Once again, the layout generation process is not always straight forward. Several iterations of the layout generation and post-layout simulation and verification steps (103 and 104) are often necessary. After the customer is satisfied with the layout generated, another "sign-off," represented in FIG. 1 as decision step 120, is provided to the ASIC vendor to indicate permission to begin manufacturing the device. Again, the customer bases his/her decision upon careful perusal of the simulation and verification results.

The generated layout of step 104 is then used to build photolithographic masks, which are used to manufacture the gate array (step 106).

As can be readily seen, to achieve the conversion from a PLD implementation to a factory-programmed circuit implementation, expensive engineering time is often expended by the customer. Throughput time of the conversion process is also prolonged by the time necessary for the customer to verify that the simulation results are acceptable. Such engineering and verification costs add to the cost and time required to build the final device. Hence, it is highly desirable to have an automated mechanism by which the customer's involvement, i.e. expensive engineering time as well as simulation verification, is minimized if not eliminated.

SUMMARY OF THE INVENTION

In accordance with the present invention, a system and a method for converting a PLD device to a factory-programmed circuit are provided, wherein a logic description of a PLD is used to generate a netlist. This netlist, in turn, is used to generate a test program, including test vectors, for testing the PLD. The test program is then used to test a PLD provided by the customer, and if the PLD successfully passes the test, it is known that the netlist accurately describes the PLD. Thus, the netlist can be used to construct masks, and it is not necessary to involve the customer in simulation verification.

The present invention is better understood in light of the following detailed description and accompanying drawings.

DETAILED DESCRIPTION

In accordance with the present invention, a system and a method of designing a factory-programmed circuit to replace a PLD are provided, using the logic description of the PLD circuit and a functioning PLD device.

Figure 1:
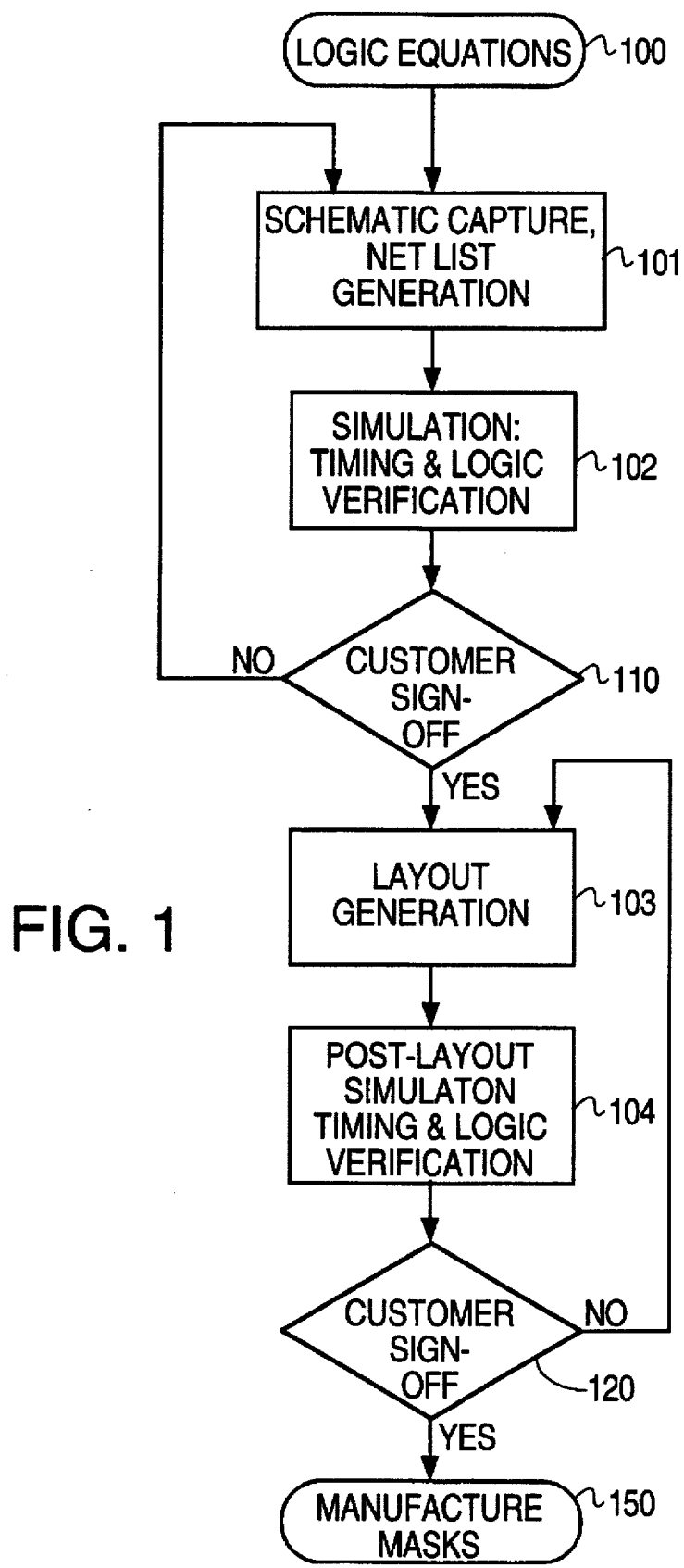
FIG. 1 illustrates the steps necessary to achieve a conversion from a PLD device to a factory-programmed device in the prior art.
Figure 2A:
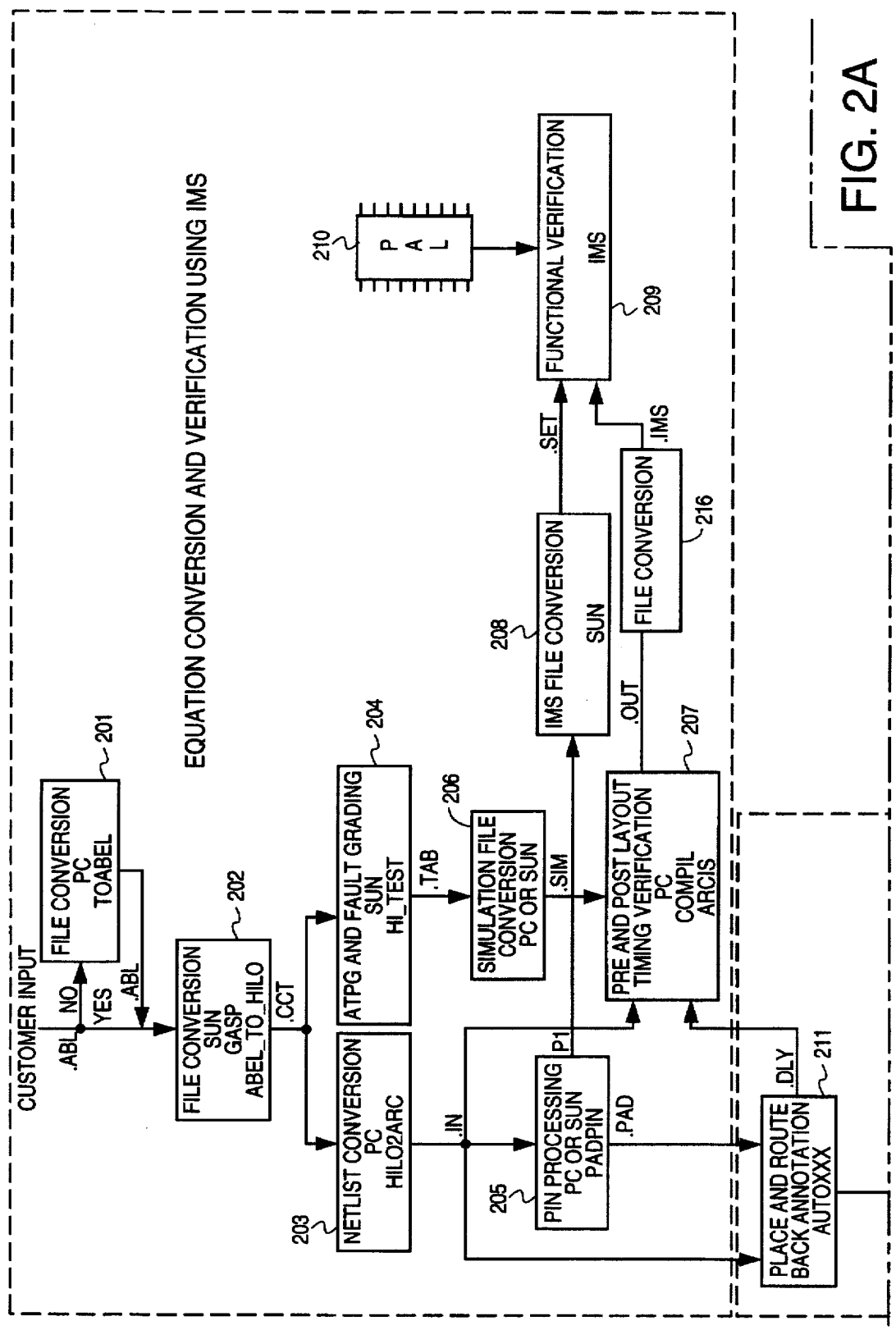
FIG. 2 is a block diagram showing a first embodiment of a system for converting a PLD device to a factory-programmed device in accordance with the present invention.

FIG. 2 is a block diagram of a first embodiment of the system in accordance with the present invention. In accordance with the present invention, the customer needs only provide the ASIC vendor with a logic description and a functioning PLD device in which the logic description is implemented. With substantially no further involvement by the customer, the ASIC vendor provides the customer a factory-programmed circuit suitable for mass production, and which is pin-for-pin compatible with the PLD device.

In the embodiment shown in FIG. 2, block nos. 201 to 208, 211 to 213 and 216 represent execution of programs on data input files (described below). These programs can be executed on an IBM Personal Computer or a machine compatible with an IBM Personal Computer (hereinafter, "IBM PC"), or a Sun Microsystems Model Sun-3 workstation (hereinafter, "Sun-3"). However, other computers or workstations may also be used.

As shown in FIG. 2, a method in accordance with our invention commences when the customer provides a logic description representing the logic functions implemented in a PLD. The logic description can be expressed in a logic equation description language such as ABEL. Details concerning ABEL can be found in "ABEL 3.0", published by Data I/O Corporation, Redmond, Wash., incorporated herein by reference in its entirety. In other embodiments, other logic description languages may be used. Also, in other embodiments, other methods are used to provide a logic description, such as truth tables, or schematic representations of logic circuits.

An example of an input file containing ABEL logic equations is included in Appendix A.1 attached hereto. These equations describe logic to be implemented in an AMD 22V10 logic array, available from Advanced Micro Devices, Inc. of Sunnyvale, Calif. However, in other embodiments, other logic equations are used, which describe PLDs other than the 22V10.

If the customer's logic description is not in the ABEL format, an optional conversion program can be provided, such as shown in block 201 of FIG. 2. For example, in one embodiment, a program TOABEL (represented by block 201) translates PALASM format equations obtained from a file having file name extension .PAL to ABEL format and place the output ABEL logic equations in a file having file name extension .ABL. (PALASM is well known in the art, and is described in "PAL Device Data Book," incorporated herein by reference in its entirety above.) The program TOABEL is well known in the art, and is available also from DATA I/O Corporation, mentioned above. TOABEL runs on IBM PC machines and Sun workstations.

Block 202 shows the .ABL file (i.e. ABEL file) being provided to an expert system known as GASP for generating a netlist of a logic circuit. A script or command file ABEL_TO_HILO is used to execute the various components of GASP. GASP, also called GASP-LUCAS, is a rule-based expert system available from Genrad Limited, Fareham, U.K. The GASP program takes as input files: 1) a file .ABL containing the logic description in the ABEL format (Appendix A.1); 2) a file .MPL which models the PLD device type (Appendix A.2); 3) a "methods library file" .MET (Appendix A.3), which describes how logic devices are constructed in the ASIC vendor's circuit technology; 4) a MD.CEL library (Appendix A.4) which lists logic functions that are available in the ASIC vendor's circuit technology; and 5) a rule base file .RCP, compiled from a set of .BAS files (Appendix A.5), which describe for GASP rules for efficiently converting the logic description into a netlist describing interconnected logic cells of the types listed in the MD.CEL library. In response to these input files, GASP provides therefrom a netlist of a logic circuit which performs the functions described in the .ABL file. Information concerning the operation and use of GASP can be obtained from GenRad Incorporated, Fareham, U.K. As is known in the art, a "netlist" is a type of circuit description which lists all circuit components, for example, the gates, buffers and flip-flops in a circuit. The netlist identifies the input and output leads of each circuit component and its connections to other circuit components.

As mentioned above, the .MPL file models the generic PLD type. For example, to model an AMD 22V10, one would provide a file such as provided in Appendix A.2 attached hereto. If one were to use the present invention to convert a device implemented in a different PAL type into a mask programmable device, one would modify the .MPL file appropriately.

Attached as Appendix A.6 is a netlist file (the .NET file) which GASP prepares from the .ABL, .MPL, MD.CEL, MET and .RCP files discussed above. In the .NET file of Appendix A.7, after the line which states "BEGIN" is the listing describing the logic performed by the circuit. The first term on each line in the listing is a label associated with the logic gate being described, the second item (enclosed in parentheses) is the name or names of the output signal or signals provided by the gate, the third item, after the ":=" punctuation, is the type of logic device represented by the line, and the fourth item is the name or names of the input signal or signals. Thus, for the device described in the first line following "BEGIN", the gate is labeled GN13PD, its output signal is N13PD, it is of device type BUFINTTL (a TTL input buffer), which receives input signal PIN13. Table I below lists the device types and abbreviations used in the .NET file of Appendix A.6.

TABLE I

Figure 4:
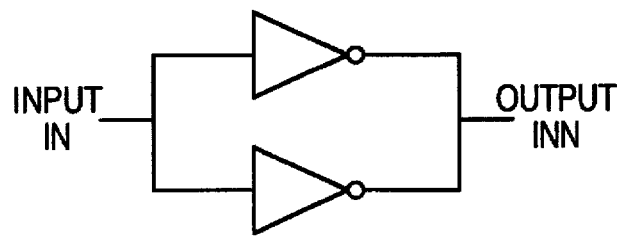
FIGS. 4, 5, 6, 7, 8, 9, 10, 11, 12 and 13 schematically illustrate logic devices used in an example of a programmable logic device being converted to a mask-programmable device.
Figure 5:
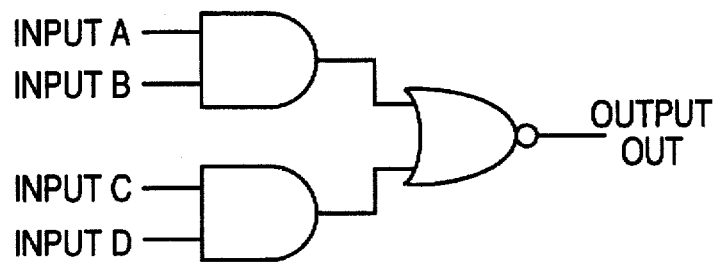
Figure 6:
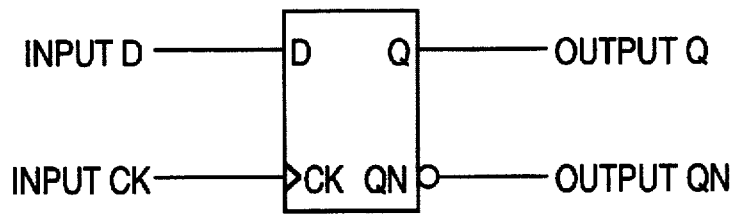
Figure 7:
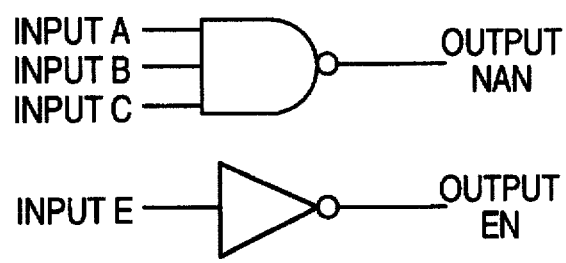
Figure 8:
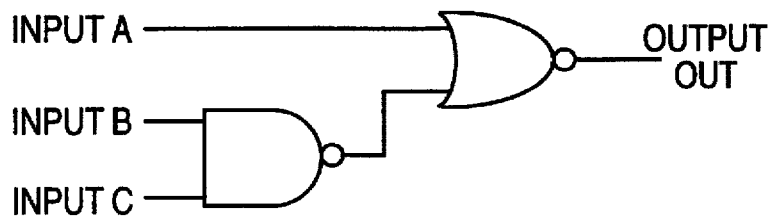
Figure 9:
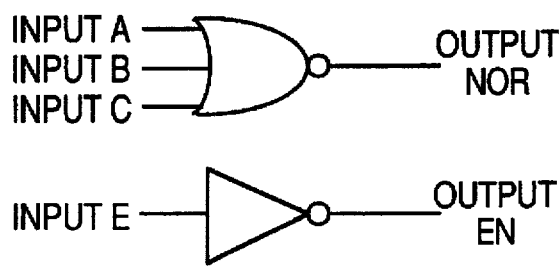
Figure 10:
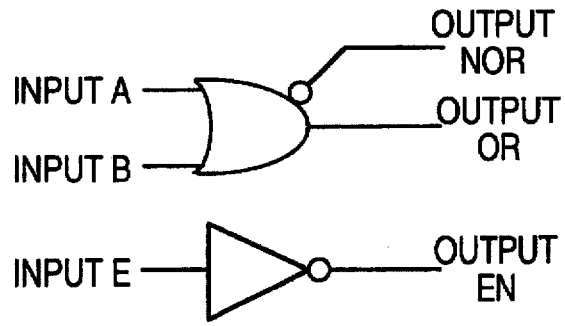
Figure 11:
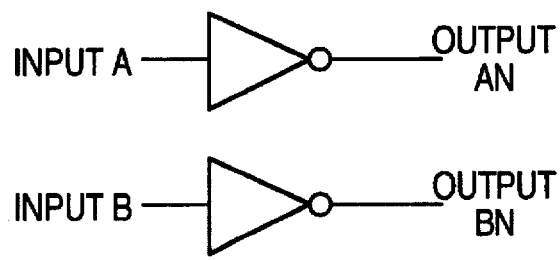
Figure 12:
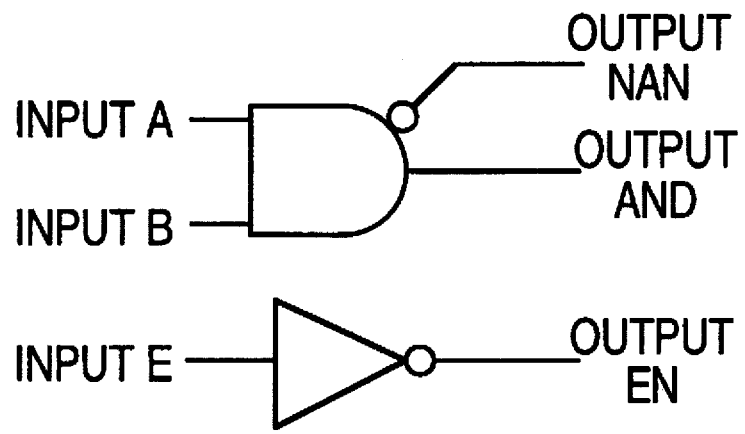
Figure 13:
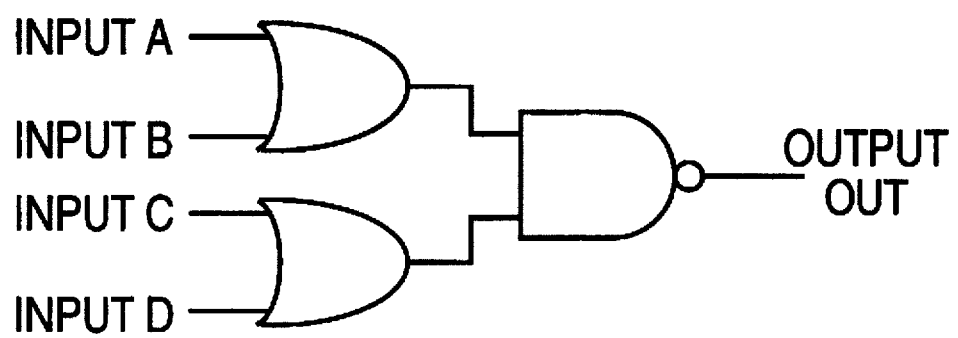

| Device Type | Symbol |
|---|---|
| BUFINTTL | TTL compatible input buffer. |
| INVP | Two parallel inverters (see Figure 4). |
| BO3N4 | Tristate output buffer with 24 mA output drive. |
| NAND2 | 2-input NAND gate. |
| AOI2W22 | 2 wide 2-2 input AND OR INVERT (see Figure 5). |
| DFFRN1 | D-Flip Flop (See Figure 6). |
| NANDI3 | 3-input NAND Gate with an inverter (see Figure 7). |
| AOI2W21 | 2 wide 2-1 input AND OR INVERT (see Figure 8). |
| NORI3 | 3 input NOR gate with an inverter (see Figure 9). |
| ORI2 | 2 input OR gate with an inverter (see Figure 10). |
| INV2 | Two inverters (see Figure 11). |
| ANDI2 | 2 input AND gate with an inverter (see Figure 12). |
| NAND3 | 3 input NAND gate. |
| POR | Power on reset. |
| OAI2W22 | 2 wide 2 input OR AND OR INVERT (see Figure 13). |

The library of logic devices used with GASP may contain other logic devices. However, the circuit specified by the .ABL file of Appendix A.1 requires only devices listed in Table I. Additional logic devices are described in "GATELIB Macrocell and Macro Function Libraries" published by Matra Design Semiconductor, Inc., of Santa Clara, Calif. in 1987.

As can be seen, the .NET file includes a circuit element POR, used for a power on reset of output register flip flops in the output circuitry of the 22V10. For simulation purpose, POR can be modeled as a delay line. As implemented in this embodiment, POR is a circuit with a large capacitance.

Part of the software represented by block 202 includes a conversion program which receives the .NET file and generates therefrom a file .CCT (Appendix A.7). As can be seen from a cursory examination of the .NET and CCT files from Appendices A.6 and A.7, respectively, this conversion software merely rearranges, in a manner readily apparent, the positions of the gate names, types, and signal names on each line.

After the .CCT file has been prepared, it is necessary to generate test vectors which can be used to test a sample PLD provided by the customer. As is well known in the art, test vectors, which are often expressed in table form, are stimulus input signals provided to a circuit and the expected circuit output signals responding to the input signals. A program known as SYSTEM HILO (block 204) is used to generate test vectors from the netlist. SYSTEM HILO is available from Genrad, Limited of Fareham, U.K.

A test pattern generation module HITEST and a fault simulator HIFAULT are separately purchased parts of SYSTEM HILO. The operation of the HITEST module is described in "SYSTEM HILO HITEST-Plus Reference Manual", which is hereby incorporated by reference in its entirety, obtainable from GenRad Incorporated, Fareham, U.K. The HIFAULT fault simulator, which is described in the "HIFAULT Reference Manual", hereby incorporated by reference in its entirety, is also obtainable from Genrad Incorporated, Fareham, U.K. Of course, other automatic test pattern generation systems and fault simulators may also be used. Appropriate format conversion programs may be needed when another automatic test pattern generation system or fault simulator is used. The SYSTEM HILO program runs on the Sun-3.

The HITEST program takes as inputs the .CCT netlist file described above, a .KDB file containing a "knowledge base" description used in test vector generation, and a .DWL file containing parameters of input and output waveforms. The definition and use of the .KDB file is provided in the "HITEST Test Generator Reference Manual", which is hereby incorporated by reference in its entirety, is obtainable from GenRad Fareham Limited, Fareham, U.K. The definition and use of the .DWL file is described in the "HITEST DWL Reference Manual", which is hereby incorporated by reference in its entirety, is obtainable also from GenRad Fareham Limited. An example each of the .KDB and the .DWL files are attached hereto as Appendices A.8 and A.9 respectively. The examples of the .KDB and DWL files are appropriate when converting a device implemented in an AMD 22V10 to a gate array implementation. If one were to convert from other generic device types (e.g. a PAL20RA10, also available from AMD), one would have to modify the .KDB and .DWL files appropriately.

The above described input files allow the HITEST program to provide an output file .TAB including a set of test vectors. This .TAB file (Appendix A.10) is intended for use as stimuli in testing the logic circuit described in the .CCT file. Fault detection analysis is used at this step illustrated by block 204, to ensure proper fault coverage by the test vectors. HITEST provides a log file, identified by file name extension .LOG (Appendix A.11), which summarizes any exception condition encountered during fault simulation and test vector generation. The LOG file is merely a user report, which is not used as an input file for any programs.

Optionally, the HITEST module may also receive a set of "seed" test vectors, e.g. generated by the customer. HITEST learns from and builds upon these seed vectors to more rapidly generate a set of test vectors (which include the seed vectors) to test the customer-provided PLD.

In one embodiment, the .CCT and .TAB files are input to a program ARCIS (block 207), which estimates the propagation delays of signals through a circuit having the logic elements described in the .CCT file, when the stimulus signals provided in the .TAB file are applied to the circuit. The operation and use of ARCIS as discussed in "GATEAID PLUS/PC 2.0 User's Manual", second edition (1988), published by Matra Design Semiconductor, hereby incorporated by reference in its entirety.

Prior to running ARCIS, it is necessary to convert the .CCT and .TAB files into a format that ARCIS can accept. Thus, block 206 represents a conversion program that receives file .TAB and generates therefrom a file SIM (Appendix A.12). As can be seen, the conversion program represented by block 206 deletes the expected output signals from file .TAB because ARCIS will recalculate these signals. The conversion program also causes the columns of the .SIM file to be in an order different from that in the .TAB file. Further, as shown in Appendix A.12, the .SIM file includes the following commands to the ARCIS program.

1. $CYCLE1 is a multiplier (in this case, 1.0) for the times listed in the .SIM file.
2. $LOAD 50 indicates that 50 pF loads are present on pins 14 to 23.
3. VCC CLKO 100 describes the power input waveform necessary to correctly simulate the POR function. Specifically, the VCC input signal is initially low for 10 ns, then goes high and remains high, thereby providing a signal transition to the POR function.

4. $PRINT lists the output signals to be printed by ARCIS.
5. $PATTERN is a truth table format for the input signals. The lines immediately following $PATTERN list the order in which input signals are provided in the .SIM file. The $PATTERN information terminates at the line marked $EOP (end of pattern).
6. $TIME 87000, 2000 instructs ARCIS to simulate, and print at intervals of 200 ns, until 8700 ns have elapsed. (Times listed in the .SIM file are expressed in tenths of nanoseconds).

As mentioned above, it is also necessary to put the CCT file into a format that can be accepted by ARCIS. Block 203 represents a program which converts file .CCT to file .IN (Appendix A.13). As can readily be seen, the .IN file contains all the information of .CCT, but the input/output order is re-arranged slightly. ARCIS also receives information from a built-in library which contains all of the gate, buffer and flip flop propagation delays, and calculates therefrom signal changes at various nodes and output leads throughout the device, taking into account the number of input leads each device must drive (i.e. fan-out). Thus, if the input file SIM instructs ARCIS that at time T=1000 ns, a signal applied to an input buffer goes high, ARCIS looks up in a library parameters regarding the buffer delay and drive capabilities and determines the propagation delay exhibited by the buffer, based on buffer characteristics and the number of input leads the buffer drives. If, based on the buffer fan-out, that buffer has a delay time of 5 ns, ARCIS then calculates that the output signal of that buffer will change state at a time T=1005 ns.

ARCIS makes similar calculations concerning the propagation of signals throughout the circuit.

ARCIS can provide output files in various formats. For example, ARCIS can provide an output file which indicates the time of every signal transition in the circuit. This may be used to determine if the device being simulated meets device timing targets.

ARCIS may also be used to provide an output file indicating the state of the output signals at regular intervals (e.g., every 200 ns). Attached as Appendix A.14 is ARCIS output file .OUT indicating the states of each input and output pin at 200 ns intervals. The .OUT file is used to generate the test vectors to test the customer-provided PLD.

It is noted that because .OUT merely contains the state of the device every 200 ns, it contains essentially no information concerning the timing performance of the device provided in the netlist file .IN described above. Thus, the .OUT file provided by ARCIS does not reflect timing tests on the PLD. This is because, at this point, only functional testing is performed.

While ARCIS is used to generate functional vectors to test the PLD, it is noted that HITEST also provides test vectors that can be used to test the PLD. Thus, one can practice the present invention using either the HITEST-generated test vectors or the ARCIS-generated vectors. In addition to ARCIS, other gate level simulator may be used, e.g., HILO, VIEWSIM (available from ViewLogic, Inc. of Santa Clara, Calif.), etc.

The next step in the method is to generate the actual test program used to test the PLD. To accomplish this, the .OUT test vectors are converted to a format used by IMS tester 209 using a format conversion program (block 216). In this embodiment, the tester used is an IMS tester. IMS testers are available from IMS, Inc., located in Beaverton, Oreg. However, other testers, such as Sentry testers, obtainable from Schlumberger Corporation, may also be used. Of course, format conversion may need to be provided for each tester type used.

A conversion program represented by block 203 receives file .CCT, and in response thereto generates a IN file, which contain the same netlist information as the .CCT file. Of importance, the .IN file is in a format which is received by a conversion program PADPIN (block 205). The PADPIN program extracts from a data base MD.PAD and netlist file .IN pin and pad (layout) information to provide an output file .NP1 (Appendix A.16), which provides test set-up information. (PADPIN also generates a file .PAD, such as the one listed in Appendix A.17, which is used during the device layout process described below.) As shown in the listing of Appendix A.16, the information provided in the .NP1 file includes, for each pin number, whether the pin is an input or output pin, the type of output buffer provided, the type of input or output buffer provided (e.g. if the pin is an input pin, TTL or CMOS compatible and/or including a pullup or pulldown), the IIL/IIH or IOL/IOH current limits (i.e., if the pin is an input pin, the input current limits when the input signal is low and high, respectively, or if the pin is an output pin, output current limits when the output signal is low and high, respectively), and which timing generator (TG) of the tester is assigned. Of importance, since the .IN file indicates which buffer type is connected to each input pin, PADPIN merely retrieves the DC parameter information from a library MD.PAD (Appendix A.18) which contains parameter information for each type of buffer. (The abbreviations PU, PD, and ON in the MD.PAD stand for "pullup", "pulldown", and "open drain", respectively. "O/Z" is a tristate output. "I/O" is a bidirectional pin.)

The .NP1 output file of the PADPIN is provided to a program NP1TOSET (block 208) to provide NP1TOSET output files (identified by file extensions .SET and .PIN) for tester set up. The .SET file is the IMS tester program, and defines in the tester's supported format the tester resource allocation and each pin's attribute. An example of a .SET file is attached hereto as Appendix A.19. NP1TOSET is provided for interfacing the .NP1 file with the IMS tester of this embodiment. If another tester is to be used, a similar software program may be needed to provide the tester interface. The techniques used to convert the information contained in the .NP1 file to the accepted format of each tester is known in the art.

The IMS tester requires a second file .IMS which contains test vectors. This is provided by the translation software of block 216 which receives the input and output waveforms from the ARCIS simulation and the .PIN file from NP1TOSET and generates therefrom an output file, identified by the file name extension .SIM, which is acceptable as an input file by the IMS tester. An example of .IMS file is attached hereto as Appendix A.15. This IMS file will provide to the tester the input waveforms to apply to the PLD under test, and the expected output waveforms which the tester uses to verify the functional correctness of the GASP generated logic circuit by comparing the expected output waveforms with the actual output waveforms of the PLD device.

Based on the input stimulus waveforms provided in the .IMS file, and configuration information from the .SET and .PIN files, the tester applies the stimulus waveforms to the pins of the PLD provided by the customer. The response of the PLD is compared against the expected output waveforms in the .IMS file. This step is known as functional verification. If the logic circuit provided by GASP is an acceptable replacement for the PLD device using a set of test vectors with a high level of fault coverage (96–100%), the PLD output waveforms and the expected output waveforms provided by the circuit simulator ARCIS (or equivalent circuit simulator) will be the same. Otherwise, the netlist must be debugged and resimulated.

Because the synthesized circuit is compared against the actual PLD device using a set of test vectors with a high level of fault coverage (96–100%), the accepted synthesized circuit is necessarily an accurate model of the PLD device. It can then be inferred that the implementation of this model in the factory-programmed device will be a correct substitute for the PLD device, provided the characteristics of this model is preserved through the layout generation process.

The layout generation process is illustrated by block 211. In this embodiment, the layout of the customized mask layer is synthesized by GARDS, which is a program commercially available from Silvar-Lisco Corporation, Menlo Park, Calif. Of course, other layout generation tools suitable for application specific integrated circuit technologies (such as gate arrays), may also be used. The GARDS system is described in "Silvar-Lisco/GARDS™ Command Reference Manual", Vol. 1, Document No. M-GDS-6.0-C1A, Jul. 1988, is hereby incorporated by reference in its entirety.

A software program ARCTOSDL translates the logic netlist provided in the .IN file to the SDL format accepted by the GARDS system. The SDL Format file is identified by the file extension .SDL. An example of the SDL file is attached hereto as Appendix A.20. The SDL format is described in "SDL-The Structured Design Language Reference Manual", published in Jul., 1984 (Document No. M-037-2), available from Silvar-Lisco, is hereby incorporated by reference in its entirety. Of course, if another vendor's layout generation software is used in place of GARDS, a conversion program to convert the .IN file to the layout generation software's accepted format may be needed. GARDS also uses the .PAD file (Appendix A.17), which contains pin-out information.

The GARDS system is provided with the design rules and the designations of the mask layers. The design rules and mask layer designations are specific to the ASIC vendor's intended manufacturing process. The GARDS system also allows manual intervention in the place and route process to allow the layout designer to manually provide placement and routing to suit specific needs. The output of the placement and routing process is provided in a file identified by file extension .SLGDS, which is in the CALMA stream format, well-known in the art. The .SLGDS file contains only cell placement and routing information. As described below, in order to generate the actual mask data, the physical layouts of the cells and array will be merged after timing verification according to the placement and routing information.

A software program is provided to extract parasitic impedances from the layout generated for "back annotation" purpose. This program provides an output file .DLY (Appendix A.21) which describes parasitic impedances from the layout generated. As shown in the listing of Appendix A.21, each path of an electrical node is provided with a delay. For example, on the first line of file .DLY is shown, "LOAD N10PD", indicating that the delay path or paths of node N10PD is to follow, and that the total capacitive load on node N10PD is 156fF. In this instance, N10PD has only one path, which is indicated on the next line preceded by "DELAY N10PD". As shown therein, the electrical path between the "OUT" output of cell "GN10PD" and the "A" input of cell "GZ1231" is estimated to have a delay of 20 ps. If an electrical node has multiple paths, such as node "Z1021" shown on lines 36–42, each path is shown separately. The parasitic impedances are used to perform post-layout simulation. Such a post-layout simulation is desirable because parasitic impedances estimated from the actual geometry of the circuit provides more accurate estimates of circuit performance than are attainable from the previous pre-layout simulation performed by ARCIS. If another simulator other than ARCIS is used, it will be necessary to use the back-annotation technique for that simulator. Such conversion techniques are also known in the art.

The post-layout simulation is carried out in the same manner as the pre-layout simulation described above. The results of the post-layout simulation are analyzed against the timing specified in the PLD manufacturer's data sheet, (in the present embodiment, the 22V10 data sheet available from Advanced Micro Devices, Inc. of Sunnyvale, Calif.). Again, if the simulation yields results which do not match those provided by the PLD data sheet, the ASIC vendor modifies the layout generated, and resimulates the circuit, without the customer's intervention, until an acceptable layout is obtained.

When the ASIC vendor is satisfied with the functional and timing verifications, a final design rule check is performed to provide confidence that the final design complies with the design rules of the intended fabrication process. At this point, the physical layout is completed by merging the placement and routing information obtained above with the physical layout libraries specific to the ASIC vendor's circuit technology. Although this step is normally done manually on a layout workstation, an automated program can be used. Whether the mask data implements the logic circuit netlist provided to generate the layout may also be checked at this point. These verifications are accomplished respectively, in block 212 this embodiment, by DRC (design rule checker) and LVS (logic verification system), both obtainable from Cadence Design Systems, Inc., San Jose, Calif. DRC and LVS systems take as inputs the netlist and the complete physical circuit layout discussed above, and provide error reports for any design rule violations or circuit mismatch, as the case may be.

For comparing the netlist with the mask data, in this embodiment, it is necessary to convert the .IN netlist file into the LOGIS netlist format acceptable by the LVS system. The LOGIS format is obtainable from Cadence Design Systems. The technique for such conversion is well-known.

The DRC system also provides resized mask layers adjusted for the intended fabrication process in an output file identified by the file extension .SIZED.GDS, which are expressed in the popular GDS II format. It should be noted that the DRC and LVS systems may also be substituted by any other systems providing comparable functionalities. Both DRC and LVS systems require libraries which are specific to the circuit technology of the ASIC vendor. Techniques for providing such libraries are known in the art.

Finally, the .SIZED.GDS format is "fractured" to the input specifications of the mask manufacturing equipment and provided in "MEBES" output files readable by such equipment (block 213). The fracturing techniques are well-known in the art, and many commercially available packages are suitable for this purpose. The output files are provided to the mask vendor over a suitable medium. Masks are then produced and used to build integrated circuits for delivery to the customer.

In summary, the present invention provides a process for accurately converting a PLD to a factory-programmed device suitable for mass production. Furthermore, since the process is highly automated, the throughput time from the customer's providing a functional PLD and the logic description thereof to the point when mask layers are synthesized is shortened from a matter of weeks in the prior art, to a few days, or even a few hours, in accordance with the present invention, depending upon the complexity of the PLD device. The advantages of such savings in time and cost are self-evident.

Figure 3A:
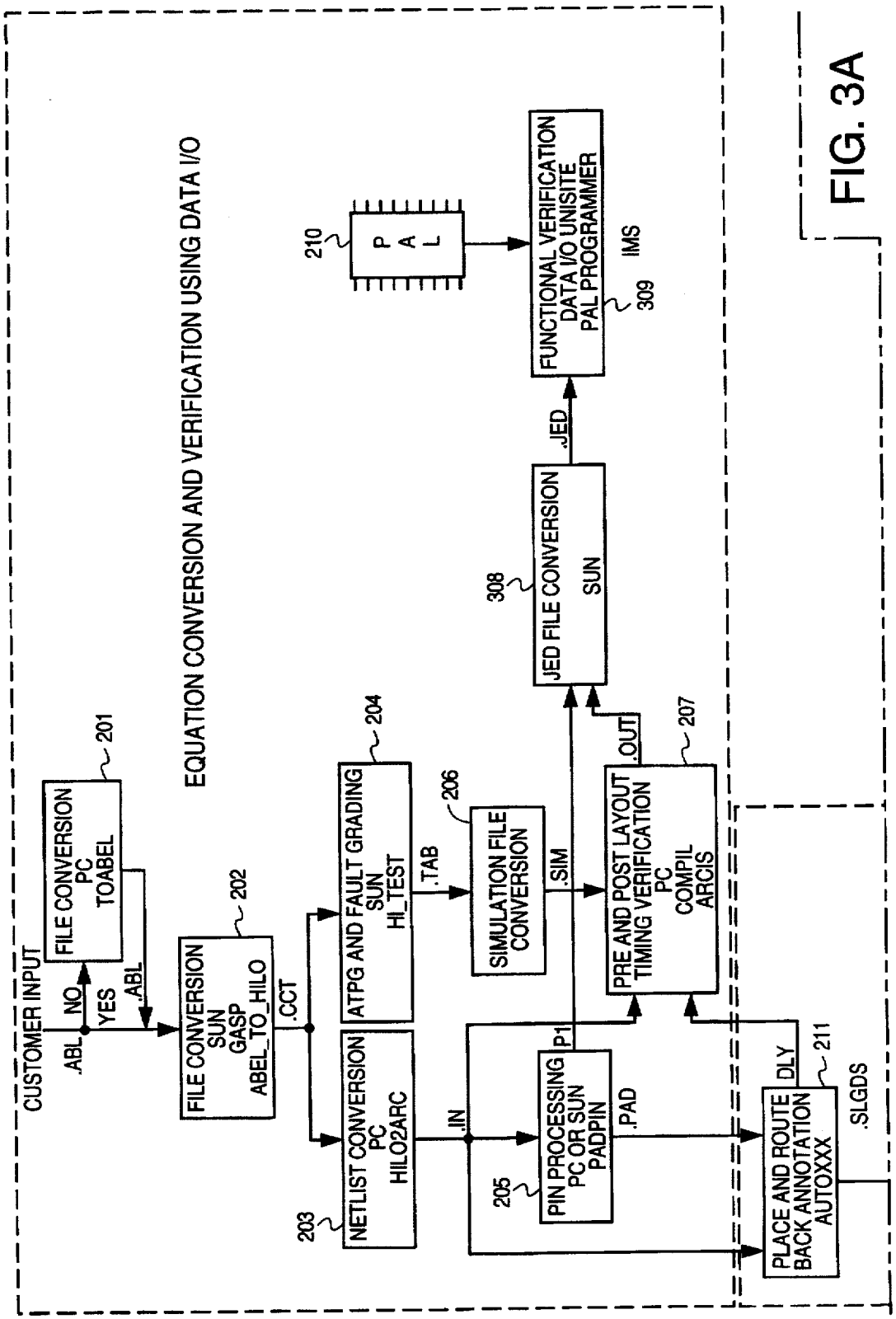
FIG. 3 is a block diagram showing a second embodiment of a system for converting a PLD device to a factory-programmed device in accordance with the present invention.

FIG. 3 illustrates a second embodiment of the present invention using a PLD Programmer, obtainable from Data I/O Corporation. This PLD PROGRAMMER is described in "USUSERMAN" (Document No. 98100 14008), published Apr. 1, 1990 by Data I/O, which is hereby incorporated by reference in its entirety. The difference between the first and second embodiments in FIGS. 2 and 3 is in the tester used (i.e. IMS vs. Data I/O). For ease of comparison, blocks in FIG. 3 identical to those in FIG. 2 are given the same reference numerals as their counterparts in FIG. 2. For the same reason, the descriptions of these corresponding blocks are not provided below to avoid repetition. Only blocks 308 and 309, which are different implementations of the blocks 208, 216 and 209 of FIG. 2 are described.

As shown in FIG. 3, a conversion program (block 308) operates on the ARCIS output file .OUT and the PADPIN output file .NP1 for assembling the tester input file JED, which contains not only configuration directives to the tester, but also the input stimulus waveforms to be applied to the PLD device, and the output waveforms with which to compare the output of the PLD device.

Block 309 is the Data I/O PLD programmer, obtainable from Data I/O Corp, of Beaverton, Oreg.

Other than the differences specifically provided above, the operation of the embodiment illustrated in FIG. 3 is identical to the embodiment illustrated by FIG. 2.

The above-detailed description is intended to illustrate the specific embodiments of the present invention described above. Numerous modifications and variations within the scope of the present invention are possible. Some examples within the scope of the present invention are (i) the automatic layout generation software can be any other automatically layout generation software commercially available; (ii) the tester used in verifying the previously programmed PLD device against the software model can also be any commercially available tester; and (iii) the various file conversion programs can be any commercially available or other file conversion programs, as discussed above.

The PLD can be a fuse-programmable device, an antifuse programmable device, or a floating gate programmable device. The circuit to be a mask-programmed substitute for the PLD may be NMOS, PMOS, CMOS, BICMOS, bipolar, or any other technology. The personalization of the mask programmed device may be accomplished by mask-patterning interconnect metallization, providing vias in mask-programmed locations, providing contacts at mask programmed locations, providing transistor gates at mask-programmed locations or any combination of the above programming techniques. The mask programmable device may be a gate array, mask programmable PAL, a custom cell logic circuit, or a full custom logic circuit. Also, the present invention may be used to construct a mask-programmed device to be substituted for another mask-programmed device (instead of a PLD).

Although in the above-described embodiment, the ASIC vendor receives logic equations from the customer, in other embodiments, the ASIC vendor receives other types of logic circuit descriptions, e.g. a truth table or a schematic description. It should also be noted that the invention may also be practiced such that the user of the PLD is not a customer from another company, but within the same company as the ASIC design group.

Appendix A.1 the .ABL File
© Matra Design Semiconductor, Inc. 1987

```
module m1712_01
flag '-r3','-t2'
title '
U203:MFB
U303:CFB: (Hwregs) Frame buffer CONTROL/STATUS register
Rev. A  (11/30/87)
C22V10 {Cypress:28/28}
======
```

"this pal implements the Control and Status registers and generates interrupts.
"
"Revision History
"
"Rev. 0.01        (06/16/87) P. Treen:
"    Original Creation.
"Rev. 0.02        (09/23/87) P. Treen:
"    Modified to adhere to naming standard.
"Rev. A           (11/30/87) P. Treen
"       Formal Release "Device Type:
"-------------
            eval        device 'P22V10';

"Input Pins:
"----------------------------

| | | |
|---|---|---|
| clk25_ | pin 1; | "inverted 25MHZ clock |
| db00 | pin 2; | "buffered data bit 0 |
| db01 | pin 3; | "buffered data bit 1 |
| db02 | pin 4; | "buffered data bit 2 |
| vsync | pin 5; | "vertical sync bit |
| sccint_ | pin 6; | "SCC chip interrupt |
| hwcyc_ | pin 7; | "decode of CS register |
| ba02 | pin 8; | "buffered address bit 2 selects stat or cntl reg |
| rd_ | pin 9; | "read low active |
| res_ | pin 10; | "system reset |
| ate_ | pin 11; | "tristate enable/disable for ate |
| ba04 | pin 13; | "buffered address bit 4 lo to select hwcyc |

"Output Pins:
"----------------------------

```
vidon         pin 23 = 'pos,reg,feed_reg';    "video enable
sien          pin 22 = 'pos,reg,feed_reg';    "sccint mask
vien          pin 21 = 'pos,reg,feed_reg';    "vsync int mask
vi            pin 20 = 'pos,reg,feed_reg';    "latched vsync
vihld_        pin 19 = 'neg,reg,feed_reg';    "int sig, holds vi
cycntl_       pin 16 = 'neg,reg,feed_reg';    "int sig to gen done
csdone_       pin 15 = 'neg,reg';              done to gen ready
rdstat_       pin 18 = 'neg,com'; "status reg buff enable
rdcntl_       pin 17 = 'neg,com'; "control reg buff enable
intenb_       pin 14 = 'neg,com'; "interupt buff enable
```

"Internal Nodes:
"-------------------------
ASYNC_RESET          node 25;

"Constant Declarations:
"-------------------------
```
data          = [db02,db01,db00];
H,L,X,C,Z     = 1,0,.X.,.C.,.Z.;
out           = [rdstat_,rdcntl_,intenb_,vihld_,vidon,cycntl_];
"
```

EQUATIONS
"-------------

```
ASYNC_RESET   = !res_;

!rdstat_  = (!hwcyc_ & !ba04) & ba02 & !rd_; "enable stat reg buffs.

!rdcntl_  = (!hwcyc_ & !ba04) & !ba02 & !rd_; "enable cntl reg buffs.

!intenb_  = (sien & !sccint_ ) # (vien & vi); "enable int buff.

vi        := (vsync) # (!vihld_) # ((!hwcyc_ & !ba04) & !ba02 & ! rd_); "latch vysnc !vihld_   := vsync # (!vihld_ & ! ((!hwcyc_ & !ba04) & !ba02 & !rd_));"hold vi.

vidon     := (db00 & (!hwcyc_ & !ba04) & !csdone_ & !ba02 & rd_) # (vidon & !((!hwcyc_
              & !ba04) & !csdone_ & !ba02 & rd_)); "enable vid !sien     := (!db01 & (!hwcyc_ & !ba04) & !csdone_ & !ba02 & rd_) # (!sien & !((!hwcyc_
              & !ba04) & !csdone_ & !ba02 & rd_)); "disable sccints !vien     := (!db02 & (!hwcyc_ & !ba04) & !csdone_ & !ba02 & rd_) # (!vien & ! ((!hwcyc_
              & !ba04) & !csdone_ & !ba02 & rd_)); "disable vsync ints !cycntl_  := (!hwcyc_ & !ba04);"control done
```

```
!csdone_   := (!hwcyc_ & !ba04 & cycntl_;"assert done* enable sien  = (!hwcyc_ & !ba04) & !rd_ & !ba02;"enable on control reg read
enable vien  = (!hwcyc_ & !ba04) & !rd_ & !ba02;"enable on control reg read
enable vi    = (!hwcyc_ & !ba04) & !rd_ & !ba02;"enable on control reg read enable csdone_    = (!hwcyc_ & !ba04);"enable done when cycle valid
enable out        = ate_ ; "enable outputs unless low TEST_VECTORS "CONTROL REG write/read
([clk25_,data,hwcyc_,ba04,ba02,rd_,res_,ate_] -> [vidon,sien,vien])
 [ C , X , 1 , X , X , X , 0 , 1 ] -> [ 0 , Z , Z ];
 [ C , X , 1 , X , X , X , 1 , 1 ] -> [ 0 , Z , Z ];
 [ C , X , 0 , 0 , 0 , 1 , 1 , 1 ] -> [ 1 , Z , Z ];
 [ C , 1 , 0 , 0 , 0 , 1 , 1 , 1 ] -> [ 1 , Z , Z ];
 [ C , 1 , 1 , X , X , 1 , 1 , 1 ] -> [ 1 , 0 , 0 ];
 [ C , X , 0 , 0 , 0 , 0 , 1 , 1 ] -> [ 1 , 0 , 0 ];
 [ C , X , 0 , 0 , 0 , 0 , 1 , 1 ] -> [ 1 , Z , Z ];
 [ C , X , 1 , X , X , X , 1 , 1 ] -> [ 1 , Z , Z ];

[ C , X , 0 , 0 , 0 , 1 , 1 , 1 ] -> [ 0 , Z , Z ];
 [ C , 2 , 0 , 0 , 0 , 1 , 1 , 1 ] -> [ 0 , Z , Z ];
 [ C , 2 , 1 , X , X , 1 , 1 , 1 ] -> [ 0 , 1 , 0 ];
 [ C , X , 0 , 0 , 0 , 0 , 1 , 1 ] -> [ 0 , 1 , 0 ];
 [ C , X , 0 , 0 , 0 , 0 , 1 , 1 ] -> [ 0 , Z , Z ];
 [ C , X , 1 , X , X , X , 1 , 1 ] -> [ 0 , Z , Z ];

[ C , X , 0 , 0 , 0 , 1 , 1 , 1 ] -> [ 1 , Z , Z ];
 [ C , 3 , 0 , 0 , 0 , 1 , 1 , 1 ] -> [ 1 , Z , Z ];
 [ C , 3 , 1 , X , X , 1 , 1 , 1 ] -> [ 1 , 1 , 0 ];
 [ C , X , 0 , 0 , 0 , 0 , 1 , 1 ] -> [ 1 , 1 , 0 ];
 [ C , X , 0 , 0 , 0 , 0 , 1 , 1 ] -> [ 1 , Z , Z ];
 [ C , X , 1 , X , X , X , 1 , 1 ] -> [ 1 , Z , Z ];

[ C , X , 0 , 0 , 0 , 1 , 1 , 1 ] -> [ 1 , Z , Z ];
 [ C , 4 , 0 , 0 , 0 , 1 , 1 , 1 ] -> [ 0 , Z , Z ];
 [ C , 4 , 1 , X , X , 1 , 1 , 1 ] -> [ 0 , 0 , 1 ];
 [ C , X , 0 , 0 , 0 , 0 , 1 , 1 ] -> [ 0 , 0 , 1 ];
 [ C , X , 0 , 0 , 0 , 0 , 1 , 1 ] -> [ 0 , Z , Z ];
 [ C , X , 1 , X , X , X , 1 , 1 ] -> [ 0 , Z , Z ];

[ C , X , 0 , 0 , 0 , 1 , 1 , 1 ] -> [ 0 , Z , Z ];
 [ C , 5 , 0 , 0 , 0 , 1 , 1 , 1 ] -> [ 1 , Z , Z ];
 [ C , 5 , 1 , X , X , 1 , 1 , 1 ] -> [ 1 , Z , Z ];
 [ C , X , 0 , 0 , 0 , 0 , 1 , 1 ] -> [ 1 , 0 , 1 ];
 [ C , X , 0 , 0 , 0 , 0 , 1 , 1 ] -> [ 1 , 0 , 1 ];
 [ C , X , 1 , X , X , X , 1 , 1 ] -> [ 1 , Z , Z ];
```

```
[ C , X , 0 , 0 , 0 , 1 , 1 , 1 ] -> [ 1 , Z , Z ];
[ C , 6 , 0 , 0 , 0 , 1 , 1 , 1 ] -> [ 0 , Z , Z ];
[ C , 6 , 1 , X , X , 1 , 1 , 1 ] -> [ 0 , Z , Z ];
[ C , X , 0 , 0 , 0 , 0 , 1 , 1 ] -> [ 0 , 1 , 1 ];
[ C , X , 0 , 0 , 0 , 0 , 1 , 1 ] -> [ 0 , 1 , 1 ];
[ C , X , 1 , X , X , X , 1 , 1 ] -> [ 0 , Z , Z ];

[ C , X , 0 , 0 , 0 , 1 , 1 , 1 ] -> [ 0 , Z , Z ];
[ C , 7 , 0 , 0 , 0 , 1 , 1 , 1 ] -> [ 1 , Z , Z ];
[ C , 7 , 1 , X , X , 1 , 1 , 1 ] -> [ 1 , Z , Z ];
[ C , X , 0 , 0 , 0 , 0 , 1 , 1 ] -> [ 1 , 1 , 1 ];
[ C , X , 0 , 0 , 0 , 0 , 1 , 1 ] -> [ 1 , 1 , 1 ];
[ C , X , 1 , X , X , X , 1 , 1 ] -> [ 1 , Z , Z ];

[ C , X , 1 , X , X , X , 0 , 1 ] -> [ 0 , Z , Z ];

[ C , 1 , 1 , X , X , 1 , 1 , 1 ] -> [ 0 , Z , Z ];
[ C , X , 0 , 0 , 0 , 0 , 1 , 1 ] -> [ 0 , 0 , 0 ];
[ C , X , 0 , 0 , 0 , 0 , 1 , 1 ] -> [ 0 , 0 , 0 ];
[ C , X , 1 , X , X , X , 1 , 1 ] -> [ 0 , Z , Z ];
"
```

TEST_VECTORS "VERTICAL SYNC HOLD"
([clk25_,vsync,hwcyc_,ba02,rd_,res_,ate_ ] -> [vihld_ ])

```
[ C , 1 , 0 , 0 , 1 , 1 , 1 ] -> [ 0 ];
[ C , 1 , 0 , 1 , 1 , 1 , 1 ] -> [ 0 ];
[ C , 0 , 1 , X , X , 1 , 1 ] -> [ 0 ];
[ C , 0 , 0 , 0 , 0 , 1 , 1 ] -> [ 1 ];
[ C , X , X , X , X , 0 , 1 ] -> [ 1 ];
[ C , X , X , X , X , X , 0 ] -> [ Z ];
```

;
;
;TEST_VECTORS "CONTROL/STATUS REG BUFFER ENABLES"
(;[hwcyc_,ba02,rd_,res_,ate_ ] -> [rdcntl_,rdstat_])

```
[ 0 , 0 , 0 , 1 , 1 ] -> [ 0 , 1 ];
[ 0 , 1 , 0 , 1 , 1 ] -> [ 1 , 0 ];
[ 1 , X , X , 1 , 1 ] -> [ 1 , 1 ];
[ X , X , 1 , 1 , 1 ] -> [ 1 , 1 ];
[ X , X , X , X , 0 ] -> [ Z , Z ];
```

TEST_VECTORS "INTERUPTS"
([clk25_,data,hwcyc_,ba02,rd_,res_,sccint_,vsync,ate_ ] -> [intenb_ ])

```
[ C , 0 , X , X , X , 1 , X , X , 1 ] -> [ 1 ];
[ C , 2 , 0 , 0 , 1 , 1 , 0 , 1 , 1 ] -> [ 0 ];
[ C , 2 , 0 , 0 , 1 , 1 , 0 , 0 , 1 ] -> [ 0 ];
[ C , 2 , 0 , 0 , 1 , 1 , 1 , 1 , 1 ] -> [ 1 ];
```

```
[ C , 2 , 0 , 0 , 1 , 1 , 1 , 0 , 1 ] -> [ 1 ];
[ C , 4 , 0 , 0 , 1 , 1 , X , 1 , 1 ] -> [ 0 ];
[ C , 6 , 0 , 0 , 1 , 1 , X , 1 , 1 ] -> [ 0 ];
[ C , 6 , 0 , 0 , 1 , 1 , 0 , X , 1 ] -> [ 0 ];
[ C , X , X , X , X , X , X , X , 0 ] -> [ Z ];
``` end m1712_01

Appendix A.2 the .MPL File
© Matra Design Semiconductor, Inc. 1989

```
WITH PLDMethods;
PLD TI22V10 IS
"inputs, 1 is clock
1      :  (Pin : (In; Feed = Eqn = PD); Attributes = (Pos = Fixed));
          SR, Eqn  =  (25.MX); RE, Eqn = (25.MX);
          AP, Eqn  =  (26.MX); PR, Eqn = (26.MX);
          Netlist  :  (POR       (NPWR, 1);
                      INV        (PWR, NPWR);
                      OR         (PWRRE, PWR, RE);
                      BUFINTTL   (IN, PD))
       );

2..11  :  (Pin : (In; Feed = Eqn = (PD); Attributes = (Pos = Fixed));
          " Notice the Feed definition. Feed is make equivalent to PD to
          " override the default behavior of Abel_To_Gasp which, in that case,
          " would lead to Feed = In (e.g some assoicated name)
          Netlist : (BUFINTTL (In, PD))
       );

12     :  (GND);

"input
13     :  (Pin : (In; Feed = Eqn = (PD); Attributes = (Pos = Fixed));
          Netlist : (BUFINTTL (In, PD))
       );

"registered outputs
14..23 :  (Pin : (In; Out; Feed = (Feed_Pin, Feed_Reg);
          "Attributes = Neg, Pos = Default, Com, Reg, Reg_d = Default));
          Attributes = (Neg, Pos = Default, Com = Defualt, Reg, Reg_d));
          MX, Default = '0; " 0 Default is not mandatory, for clarity reason
          SR, Eqn = (25.MX); RE, Eqn = (25.MX);
          AP, Eqn = (26.MX); PR, Eqn = (26.MX);
          " Preset and Reset signals are redirectioned to Node 25 and 26
          " each pin contribution (e.g an equation) is logicallhy Ored with
          " the 'Eqn' Node
          OE; " No default is set to OE, it will be done automatically by the
              " linker using the following ruless:
          " If Mode (pin) = In       Then OE = 0
          " If Mode (Pin) = Out      Then OE = 1
          " If Mode IN [Tri_In,Tri_Out, Tri_In_Out] Then OE = User Defined
          " If Mode Not defined Then OE = 1
          " Notice that Feed connection is defined in a way that is consistent
          " with output polarity when mode is Feeda_Reg, e.g Output and Feed
          " signals have the same polarity. It has to be done even if the
          " wiring is slightly different from those one of the data bood
          " because Feed_Reg is a buried signal, those it's not directly
          " controlable by the user
```

```
              );

24    :   (VCC);

"Preset and reset signals
25..26 :  (Node : (Attributes = Pos = Fixed));
          MX, Default = '0
          );

27..36 :  (Node : ());

100   :   (PIN : (Name = SCANIN;
                  In; Feed = Eqn = (PD); Attributes = Pos = FIXED));
          Netlist : (BUFINTTL (IN, PD))
          );

101   :   (PIN : (Name = SCANMODE;
                  In; Feed = Eqn = (PD); Attributes = (Pos = FIXED));
          Netlist : (BUFINTTL (IN, PD))
          );

102   :   (PIN : (Name = SCANOUT;
                  Out; Attributes = (Pos = FIXED));
          MX, Default = '0
          Netlist : (BUFOUT      (OUT, MX))
          )
END PLD;
```

Appendix A.3 the .MET File
© Matra Design Semiconductor, Inc. 1989

```
METHOD FOR IS
    IN POWER;
    OUT POR;
    ASK POR, POWER;
END METHOD;

METHOD INV IS
    IN E;
    OUT NE;
    ASK NE, E;
END METHOD;

METHOD MUX IS
    IN I1, I2, CTRL;
    OUT O;
    ASK O, I1, I2, CTRL;
END METHOD;

METHOD MUX4 IS
    IN I1, I2, I3, I4, CTRL1, CTRL2;
    OUT O;
    ASK O, I1, I2, I3, I4, CTRL1, CTRL2;
END METHOD;

METHOD AND IS
    IN I1, I2;
    OUT O;
    ASK O, I1, I2;
END METHOD;

METHOD NAND IS
    IN I1, I2;
    OUT O;
    ASK O, I1, I2;
END METHOD;

METHOD OR IS
    IN I1, I2;
    OUT O;
    ASK O, I1, I2;
END METHOD;

METHOD NOR IS
    IN I1, I2;
    OUT O;
    ASK O, I1, I2;
END METHOD;
```

```
METHOD EXOR IS
      IN I1, I2;
      OUT O;
      ASK O, I1, I2;
END METHOD;

METHOD DFF IS
      IN D, CLK;
      OUT Q, NQ;
      ASK Q, NQ, D, CLK;
END METHOD;

METHOD SCANDFF IS
      IN D, CLK, SCAN, MODE;
      OUT Q, NQ;
      ASK Q, NQ, D, CLK, SCAN, MODE;
END METHOD;

METHOD DFFR IS
      IN D, CLK, RAZ;
      OUT Q, NQ;
      ASK Q, NQ, D, CLK, RAZ;
END METHOD;

METHOD SCANDFFR IS
      IN D, CLK, RAZ, SCAN, MODE;
      OUT Q, NQ;
      ASK Q, NQ, D, CLK, RAZ, SCAN, MODE;
END METHOD;

METHOD DFFNR IS
      IN D, CLK, NRAZ;
      OUT Q, NQ;
      ASK Q, NQ, D, CLK, NRAZ;
END METHOD;

METHOD DFFS IS
      IN D, CLK, SET;
      OUT Q, NQ;
      ASK Q, NQ, D, CLK, SET;
END METHOD;

METHOD SCANDFFS IS
      IN D, CLK, SET, SCAN, MODE;
      OUT Q, NQ;
      ASK Q, NQ, D, CLK, SET, SCAN, MODE;
END METHOD;
```

```
METHOD DFFNS IS
      IN D, CLK, NSET;
      OUT Q, NQ;
      ASK Q, NQ, D, CLK, NSET;
END METHOD;

METHOD DFFRS IS
      IN D, CLK, SET, RAZ;
      OUT Q, NQ;
      ASK Q, NQ, D, CLK, SET, RAZ;
END METHOD;

METHOD SCANDFFRS IS
      IN D, CLK, SET, RAZ, SCAN, MODE;
      OUT Q, NQ;
      ASK Q, NQ, D, CLK, SET, RAZ, SCAN, MODE;
END METHOD;

METHOD DFFNRNS IS
      IN D, CLK, NSET, NRAZ;
      OUT Q, NQ;
      ASK Q, NQ, D, CLK, NSET, NRAZ;
END METHOD;

METHOD TRIINV IS
      IN I, CTRL;
      OUT O;
      ASK O, CTRL, I;
END METHOD;

METHOD TRI IS
      IN I, CTRL;
      OUT O;
      ASK O, CTRL, I;
END METHOD;

METHOD TFF IS
      IN T, CLK, PE, PIN;
      OUT Q, NQ;
      ASK Q, NQ, T, CLK, PE, PIN;
END METHOD;

METHOD JKFF IS
      IN J, K, CLK;
      OUT QK, NQ;
      ASK Q, NQ, J, K, CLK;
END METHOD;
```

```
METHOD SCANJKFF IS
    IN J, K, CLK, SCAN, MODE;
    OUT Q, NQ;
    ASK Q, NQ, J, K, CLK, SCAN, MODE;
END METHOD;

METHOD JKFFNR IS
    IN J, K, CLK, NRAZ;
    OUT Q, NQ;
    ASK Q, NQ, J, K, CLK, NRAZ;
END METHOD;

METHOD JKFFNRNS IS
    IN J, K, CLK, NRAZ, NSET;
    OUT Q, NQ;
    ASK Q, NQ, J, K, CLK, NRAZ, NSET;
END METHOD;

METHOD JKFFNS IS
    IN J, K, CLK, NSET;
    OUT Q, NQ;
    ASK Q, NQ, J, K, CLK, NSET;
END METHOD;

METHOD JKFFR IS
    IN J, K, CLK, RAZ;
    OUT Q, NQ;
    ASK Q, NQ, J, K, CLK, RAZ;
END METHOD;

METHOD SCANJKFFR IS
    IN J, K, CLK, RAZ, SCAN, MODE;
    OUT Q, NQ;
    ASK Q, NQ, J, K, CLK, RAZ, SCAN, MODE;
END METHOD;

METHOD JKFFRS IS
    IN J, K, CLK, RAZ, SET;
    OUT Q, NQ;
    ASK Q, NQ, J, K, CLK, RAZ, SET;
END METHOD;

METHOD SCANJKFFRS IS
    IN J, K, CLK, RAZ, SET, SCAN, MODE;
    OUT Q, NQ;
    ASK Q, NQ, J, K, CLK, RAZ, SET, SCAN, MODE;
END METHOD;
```

```
METHOD JKFFS IS
     IN J, K, CLK, SET;
     OUT Q, NQ;
     ASK Q, NQ, J, K, CLK, SET;
END METHOD;

METHOD SCANJKFFS IS
     IN J, K, CLK, SET, SCAN, MODE;
     OUT Q, NQ;
     ASK Q, NQ, J, K, CLK, SET, SCAN MODE;
END METHOD;

METHOD RSNAND IS
     IN RN, SN;
     OUT Q, NQ;
     ASK Q, NQ, RN, SN;
END METHOD;

METHOD RSNOR IS
     IN R, S;
     OUT Q, NQ;
     ASK Q, NQ, R, S;
END METHOD;

METHOD LATCH IS
     IN D, ENA;
     OUT Q, NQ;
     ASK Q, NQ, D, ENA;
END METHOD;

METHOD BUF3STA IS
     IN IN1, ENA;
     OUT XXX;
     ASK XXX, IN1, ENA;
END METHOD;

METHOD BUFIOTTL IS
     IN IN1, ENA;
     OUT OUT1, XXX;
     ASK OUT1, XXX, IN1, ENA;
END METHOD;

METHOD BUFOUT IS
     IN IN1;
     OUT XXX;
     ASK XXX, IN1;
END METHOD;
```

```
METHOD BUFINTTL IS
    IN XXX;
    OUT OUT1;
    ASK XXX, OUT1;
END METHOD;

METHOD BUFINDIR IS
    IN XXX;
    OUT OUT 1;
    ASK XXX, OUT1;
END METHOD;
```

Appendix A.4 the MD.CEL File
© Matra Design Semiconductor, Inc. 1989

```
*********************************************************************
***
** special cells for implementing virtual components not mapped by regular cells
*********************************************************************
***
** method MUX 4           -> not implemented
** method GASPDFFR        -> GASPDFFR           ~DFFRN1
** method GASPDFFS        -> GASPDFFS           ~DFFSN1
** method DFFRS           -> GASPDFFRS          ~DFFRNSN1

** method SCANDFF         -> SCANDFF            ~expanded
** method SCANDFFR        -> SCANDFFR           ~expanded
** method SCANDFFS        -> SCANDFFS           ~expanded
** method SCANDFFRS       -> SCANDFFRS          ~expanded

** method SCANJKFF        -> SCANJKFF           ~expanded
** method SCANJKFFR       -> SCANJKFFR          ~expanded
** method SCANJKFFRS      -> SCANJKFFRS         ~expanded
** method SCANJKFFS       -> SCANJKFFS          ~expanded

** method BUF3STA         -> GASPBUF3STA        ~BFU3STA
** method BUFIOTTL        -> GASPBUFIOTTL       ~BUFIOTTL
** special cell to implement GASPDFFR method, must be removed by
** the expert system, and replaced by a DFFRN1 with inverter on RAZ
cell GASPDFFR is record
    in              := [D,CK,R];
    out             := [Q,QN];
    class           := seq;
** put same area than DFFRN1 (used for synthesis)
    area            := 6;
    fan_in          := [1,1,1];
    delay           := [0,0];
    fan_out_factor  := [0,0];
    max_fan_out     := 8;
    function        := [D,CK,^R,^ (D.CK. ^R)];
    hilo_order      := [D,CK,R,Q,QN];
    method          := [GASPDFFR [Q,D,CK,R],DFFR[Q,QN,D,CK,R]];
end record;
** special cell to implement GASPDFFS method, must be removed by
** the expert system, and replace by a DFFSN1 with inverter on SET
cell GASPDFFS is record
    in              := [D,CK,S];
    out             := [Q,QN[];
    class           := seq;
** put same area than DFFSN1 (used for synthesis)
    area            := 6;
    fan_in          := [1,1,1];
    delay           := [0,0];
```

```
    fan_out_factor   := [0,0];
    max_fan_out      := 8;
    function         := [D.CK+S,^(D.CK+S];
    hilo_order       := [D,CK,S,Q,QN];
    method           := [GASPDFFS[Q,D,CK,S],DFFS[Q,QN,D,CK,S]];
  end record;
cell SCANDFF is record
    in               := [D,CK,SC,MO];
    out              := [Q,QN];
    class            := seq;
    area             := 4;
    fan_in           := [1,2,1,1];
    delay            := [5,5];
    fan_out_factor   := [1,1];
    max_fan_out      := 8;
    function         := [(MO.SC+^MO.D).CK,^(MO.SC+^MO.D).CK)];
    hilo_order       := [D,CK,Q,QN,SC,MO];
    method           := SCANDFF(Q,QN,D,CK,SC,MO];
  end record;
cell SCANDFFR is record
    in               := [D,CK,R,SC,MO];
    out              := [Q,QN];
    class            := seq;
    area             := 5;
    fan_in           := [1,2,2,1,1];
    delay            := [6,8];
    fan_out_factor   := [2,1];
    max_fan_out      := 8;
    function         := [MO.SC+^MO.D).CK.^R,^((MO.SC+^MO.D).CK.^R];
    hilo_order       := [D,CK,R,Q,QN,SC,MO];
    method           := SCANDFFR[Q,QN,D,CK,R,SC,MO];
  end record;
cell SCANDFFS is record
    in               := [D,CK,S,SC,MO];
    out              := [Q,QN];
    class            := seq;
    area             := 5;
    fan_in           := [1,2,2,1,1];
    delay            := [10,6];
    fan_out_factor   := [1,2];
    max_fan_out      := 8;
    function         := [MO.SC+^MO.D).CK+S,^((MO.SC+^MO.D).CK+S)];
    hilo_order       := [D,CK,S,Q,QN,SC,MO];
    method           := SCANDFFS[Q,QN,D,CK,S,SC,MO];
  end record;
** special cell to implement GASPDFFRS method, must be removed by
** the expert system, and replaced by a DFFRNSN1 with inverter on RAZ & SET
cell GASPDFFRS is record
```

```
    in              := [D,CK,R,S];
    out             := [Q,QN];
    class           := seq;
** put same area than DFFRNSN1 (used for synthesis)
    area            := 7;
    fan_in          := [1,1,1,1];
    delay           := [0,0];
    fan_out_factor  := [0,0];
    max_fan_out     := 8;
    function        := [D.CK.^R+S,^(D.CK.^R+S)];
    hilo_order      := [D,CK,R,S,Q,QN];
    method          := DFFRS[Q,QN,D,CK,S,R];
end record;
cell SCANDFFRS is record
    in              := [D,CK,R,S,SC,MO];
    out             := [Q,QN];
    class           := seq;
    area            := 6;
    fan_in          := [1,2,2,2,1,1];
    delay           := [10,11];
    fan_out_factor  := [1,1];
    max_fan_out     := 8;
    function        := [(MO.SC+^MO.D).CK.^R+S,^((MO.SC+^MO.D).CK.^R+S)];
    hilo_order      := [D,CK,R,S,Q,QN,SC,MO];
** be careful: R and S reverted with method
    method          := [SCANDFFS[Q,QN,D,CK,S,R,SC,MO];
end record;
cell SCANJKFF is record
    in              := [J,K,CK,SC,MO];
    out             := [Q,QN];
    class           := seq;
    area            := 7;
    fan_in          := [1,1,3,1,1];
    delay           := [6,7];
    fan_out_factor  := [1,1];
    max_fan_out     := 8;
    function        := [(MO.SC+^MO.(J$K)).CK,^((MO.SC+^MO.(J$K)).CK)];
    hilo_order      := [J,K,CK,Q,QN,SC,MO];
    method          := SCANJKFF[Q,QN,J,K,CK,SC,MO]:
end record;
cell SCANJKFFR is record
    in              := [J,K,CK,R,SC,MO];
    out             := [Q,QN];
    class           := seq;
    area            := 8;
    fan_in          := [1,1,3,2,1,1];
    delay           := [8,10];
    fan_out_factor  := [2,1];
```

```
        max_fan_out     := 8;
        function        := [MO.SC+^MO.(J$K)).CK.^R,^((MO.SC+^MO.(J$K)).CK.^R)];
        hilo_order      := [J,K,CK,R,Q,QN,SC,MO];
        method          := SCANJKFFR[Q,QN,J,K,CK,R,SC,MO];
end record;
cell SCANJKFFRS is record
        in              := [J,K,CK,R,S,SC,MO];
        out             := [Q,QN];
        class           := seq;
        area            := 9;
        fan_in          := [1,1,3,2,2,1,1];
        delay           := [8,10];
        fan_out_factor  := [2,1];
        max_fan_out     := 8;
        function        :=
[(MO.SC+^MO.(J$K).CK.^R+S,^((MO.SC+^MO.(J$K)).CK.^R+S)];
        hilo_order      :=[J,K,CK,R,S,Q,QN,SC,MO];
        method          := SCANJKFFRS[Q,QN,J,K,CK,R,S,SC,MO];
end record;
cell SCANJKFFS is record
        in              := [J,K,CK,S,SC,MO];
        out             := [Q,QN];
        class           := seq;
        area            := 8;
        fan_in          := [1,1,3,2,1,1];
        delay           := [9,12];
        fan_out_factor  := [1,1];
        max_fan_out     := 8;
        function        := [(MO.SC+^MO.(J$K)).CK+S,^((MO.SC+^MO.(J$K)).CK+S)];
        hilo_order      := [J,K,CK,S,Q,QN,SC,MO];
        method          := SCANJKFFS[Q,QN,J,K,CK,S,SC,MO];
end record;
** special cell to implement BUF3STA method, must be removed by
** the expert system, and replaced by a BUF3STA with inverter on ENA
cell GASPBUF3STA is record
        in              := [IN,ENA];
        out             := [XXX];
        class           := buff;
        area            := 0;
        fan_in          := [1,1];
        delay           := [15];
        fan_out_factor  := [17];
        max_fan_out     := 8;
        function        := [IN.ENA];
        hilo_order      := [IN,ENA,XXX];
        method          := BUF3STA[XXX,IN,ENA];
end record;
** special cell to implement BUFIOTTL method, must be removed by
```

```
**  the expert system, and replaced by a BUFIOTTL with inverter on ENA
cell GASBUFIOTTL is record
    in              := [IN,ENA];
    out             := [XXX,OUT];
    class           := buff;
    area            := 0;
    fan_in          := [1,1];
    delay           := [15,8];
    fan_out_factor  := [17,1];
    max_fan_out     := 8;
    function        := [IN,ENA,IN.ENA];
    hilo_order      := [IN,ENA,XXX,OUT];
    method          := BUFIOTTL[OUT,XXX,IN,ENA];
end record;
*************************************************************************
***
cell POR is record
    class           := unknown;
    in              := [POWER];
    out             := [POR];
    area            := 0;
    fan_in          := [1];
    delay           := [0];
    fan_out_factor  := [0];
    max_fan_out     := 8;
    function        := [POWER];
    hilo_order      := [POWER,POR];
    method          := POR[POR,POWR];
end record;
cell NAND2 is record
    class           := combi;
    in              := [A,B];
    out             := [NAN];
    area            := 1;
    fan_in          := [1,1];
    delay           := [3];
    fan_out_factor  := [1];
    max_fan_out     := [8;
    function        := [^A+^B];
    hilo_order      := [A,B,NAN];
    method          := NAND[NAN,A,B];
end record;
cell NAND3 is record
    class           := combi;
    in              := [A,B,C];
    out             := [NAN];
    area            := 2;
    fan_in          := [1,1,1];
```

```
        delay           := [5];
        fan_out_factor  := [1];
        max_fan_out     := 8;
        function        := [^A+^B+^C];
        hilo_order      := [A,B,C,NAN];
    end record;
    cell NAND4 is record
        class           := combi;
        in              := [A,B,C,D];
        out             := [NAN];
        area            := 2;
        fan_in          := [1,1,1,1];
        delay           := [6];
        fan_out_factor  := [1];
        max_fan_out     := 8;
        function        := [^A+^B+^C+^D];
        hilo_order      := [A<B,C,D,NAN];
    end record;
    cell NAND5 is record
        class           := combi;
        in              := [A,B,C,D,E];
        out             := [NAN];
        area            := 3;
        fan_in          := [1,1,1,1,1];
        delay           := [6]
        fan_out_factor  := [2];
        max_fan_out     := 8;
        function        := [^A+^B+^C+^D+^E];
        hilo_order      := [A,B,C,D,E,NAN];
    end record;
    cell NAND8 is record
        class           := combi;
        in              := [A,B<C,D,E,F,G,H];
        out             := [NAN];
        area            := 6;
        fan_in          := [1,1,1,1,1,1,1,1];
        delay           := [9];
        fan_out_factor  := [1];
        max_fan_out     := 8;
        function        := [^A+^B+^C+^D+^E+^F+^G+^H];
        hilo_order      := [A,B,C,D,E,F,G,H,NAN];
    end record;
    cell NAND13 is record
** replaced combi by unknown, to avoid use at lucas syntesis level,
** because it is used when only three inputs connected
        **class         := combi;
        class           := unknown;
        in              := [A,B,C,E];
```

```
        out             := [NAN,EN];
        area            := 2;
        fan_in          := [1,1,1,1];
        delay           := [5,3];
        fan_out_factor  := [1,1];
        max_fan_out     := 8;
        function        := [^A+^B+^C+^E];
        hilo_order      := [A,B,C,NAN,E,EN];
end record;
cell NOR2 is record
        class           := combi;
        in              := [A,B];
        out             := [NOR];
        area            := 1;
        fan_in          := [1,1];
        delay           := [3];
        fan_out_factor  := [2];
        max_fan_out     := [8];
        function        := [^A.^B];
        hilo_order      := [A,B,NOR];
        method          := NOR[NOR,A,B];
end record;
cell NOR3 is record
        class           := combi;
        in              := [A,B,C];
        out             := [NOR];
        area            := 2;
        fan_in          := [1,1,1];
        delay           := [4];
        fan_out_factor  := [3];
        max_fan_out     := 8;
        function        := [^A.^B.^C];
        hilo_order      := [A,B,C,NOR];
end record;
cell NOR4 is record
        class           := combi;
        in              := [A,B,C,D];
        out             := [NOR];
        area            := 2;
        fan_in          := [1,1,1,1];
        delay           := [11];
        fan_out_factor  := [3];
        max_fan_out     := 8;
        function        := [^A.^B.^C.^D];
        hilo_order      := [A,B,C,D,NOR];
end record;
cell NOR5 is record
        class           := combi;
```

```
    in              := [A,B,C,D,E];
    out             := [OR,NOR];
    area            := 4
    fan_in          := [1,1,1,1,1]
    delay           := [14,14];
    fan_out_factor  := [1,1];
    max_fan_out     := 8;
    function        := [A+B+C+D+E,^A.^B.^C.^D.^E];
    hilo_order      := [A,B,C,D,E,];
end record;
cell NOR8 is record
    class           := combi;
    in              := [A,B,C,D,E,F,G,H];
    out             := [NOR];
    area            :=6;
    fan_in          :=[1,1,1,1,1,1,1,1];
    delay           :=[15];
    fan_out_factor  :=[1];
    max_fan_out     :=8;
    function        :=[^A.^B.^C.^D.^E.^F.^G.^H];
    hilo_order      :=[A,B,C,D,E,F,G,H,NOR];
end record
cell NORI3 is record
** replaced combi by unknown, to avoid use at lucas syntesis level,
** because it is used when only three inputs connected
    **class         := combi;
    class           := unknown;
    in              := [A,B,C,E];
    out             := [NOR,EN];
    area            := 2;
    fan_in          := [1,1,1,1];
    delay           := [4,3];
    fan_out_factor  := [3,1];
    max_fan_out     := 8;
    function        := [^A.^B.^C,^E];
    hilo_order      := [A,B,C,NOR,E,EN];
end record;
cell AND2 is record
    class           := combi;
    in              := [A,B];
    out             := [AND,NAN];
    area            := 2;
    fan_in          := [1,1];
    delay           := [5,5];
    fan_out_factor  := [1,1];
    max_fan_out     := 8;
    function        := [A.B,^(A.B)];
    hilo_order      := [A,B,AND,NAN];
```

```
        method            := AND[AND,A,B];
end record;
cell AND3 is record
        class             := combi;
        in                := [A,B,C];
        out               := [AND,NAN];
        area              := 2;
        fan_in            := [1,1,1];
        delay             := [6,6];
        fan_out_factor    := [1,1];
        max_fan_out       := 8;
        function          := [A.B.C,^(A.B.C)];
        hilo_order        := [A,B,C,AND,NAN];
end record;
cell AND4 is record
        class             :=combi;
        in                := [A,B,C,D];
        out               := [AND,NAN];
        area              := 3;
        fan_in            := [1,1,1,1];
        delay             := [7,7];
        fan_out_factor    := [1,1];
        max_fan_out       := 8;
        function          := [A.B.C.D,^(A.B.C.D)];
        hilo_order        := [A,B,C,D,AND,NAN];
end record;
cell ANDI2 is record
** replaced combi by unknown, to avoid use at lucas synthesis level,
** because it is used when only two inputs conencted
        **class           := combi;
        class             := unknown;
        in                := [A,B,E];
        out               := [AND,NAN,EN];
        area              := 2;
        fan_in            := [1,1,1];
        delay             := [5,5,3];
        fan_out_factor    := [1,1,1];
        max_fan_out       := 8;
        function          := [A.B,^(A.B),^E];
        hilo_order        := [A,B,AND,NAN,E,EN];
        method            := AND[AND,A,B];
end record;
cell ANDI4 is record
** replaced combi by unkonwn, to avoid use at lucas synthesis level.
** because it is used when only four inputs connected
        **class           := combi;
        class             := unknown;
        in                := [A,B,C,D,E];
```

```
        out             := [AND,NAN,EN];
        area            := 3;
        fan_in          := [1,1,1,1,1];
        delay           := [7,7,3];
        fan_out_factor  := [1,1,1];
        max_fan_out     := 8;
        function        := [A.B.C.D,^A.B.C.D),^E];
        hilo_order      := [A,B,C,D,AND,NAN,E,EN];
    end record;
    cell OR2 is record
        class           := combi;
        in              := [A,B];
        out             := [OR,NOR];
        area            := 2;
        fan_in          := [1,1];
        delay           := [5,5];
        fan_out_factor  := [1,1];
        max_fan_out     := 8;
        function        := [A+B,^(A+B)];
        hilo_order      := [A,B,OR,NOR];
        method          := OR[OR,A,B];
    end record;
    cell OR3 is record
        class           := combi;
        in              := [A,B,C];
        out             := [OR,NOR];
        area            := 2;
        fan_in          := [1,1,1];
        delay           := [6,6];
        fan_out_factor  := 1,1];
        max_fan_out     := 8;
        function        := [A+B+C,^(A+B+C)];
        hilo_order      := [A,B,C,OR,NOR];
    end record;
    cell OR4 is record
        class           := combi;
        in              := [A,B,C,D];
        out             := [OR,NOR];
        area            := 3;
        fan_in          := [1,1,1,1];
        delay           := [9,9];
        fan_out_factor  := [1,1];
        max_fan_out     := 8;
        function        := [A=B=C=D,^(A+B+C+D)];
        hilo_order      := [A,B,C,D,OR,NOR];
    end record;
    cell ORI2 is record
** replaced combi by unknown, to avoid use at lucas synthesis level,
```

```
** because it is used when only two inputs connected
    **class         := combi;
    class           := unkonwn
    in              := [A,B,E];
    out             := [OR,NOR,EN];
    area            := 2;
    fan_in          := [1,1,1];
    delay           := [5,5,3];
    fan_out_factor  := [1,1,1];
    max_fan_out     := 8;
    function        := [A+B,^(A+B),^E];
    hilo_order      := [A,B,OR,NOR,E,EN];
    method          := OR[OR,A,B];
end record;
cell ORI4 is record
** replaced combi by unknown, to avoid use at lucas synthesis level,
** because it is used when only four inputs connected
    **class         := combi;
    class           := unknown
    in              := [A,B,C,D,E];
    out             := [OR,NOR,EN];
    area            := 3;
    fan_in          := [1,1,1,1,1];
    delay           :=[9,9,3];
    fan_out_factor  := [1,1,1];
    max_fan_out     := 8;
    function        := [A+B=C+D, ^(A+B+C+D),^E]
    hilo_order      := [A,B,C,D,OR,NOR,E,EN];
end record;
cell EXOR is record
    class           := combi;
    in              := [A,B];
    out             := [XOR,NOR];
    area            := 3;
    fan_in          := [1,1];
    delay           := [2,2];
    fan_out_factor  := [2,2];
    max_fan_out     := 8;
    function        := [A.^B+^A.B,^A.^B];
    hilo_order      := [A,B,XOR,NOR];
    method          := [EXOR [XOR,A,B];
end record;
cell EXNOR is record
    class           := combi;
    in              := [A,B];
    out             := [XNO,NAN];
    area            := 3;
    fan_in          := [,4];
```

```
        delay           := [4,4];
        fan_out_factor  := [1,1];
        max_fan_out     := 8;
        function        := [A.B+^A.^B,^A+^B];
        hilo order      := [A,B,XNO,NAN];
end record;
cell INV2 is record
** replaced combi by unkonwn, to avoid use of lucas synthesis level,
** because it is used when only one input connected
        **class          := combi;
        class            := unknown;
        in               := [A,B];
        out              := [AN,BN];
        area             := 1;
        fan_in           := [1,1];
        delay            := [3,3];
        fan_out-factor   := [1,1];
        max_fan_out      := 8;
        function         := [^A,^B]
        hilo_order       := [A,AN,B,BN];
end record;
cell INVS is record
** replaced combi by unknown, to avoid use at lucas synthesis level,
** because it is used when only one input connected
        **class          := cimbi;
        class            := unknown;
        in               := [AIN];
        out              := [AN,OUT];
        area             := 1;
        fan_in           := [1];
        delay            := [4,5];
        fan_out_factor   := [1,1];
        max_fan_out      := 8;
        function         := [^AIN,AIN];
        hilo_order       := [AIN,AN,OUT];
end record;
cell INVP is record
** replaced combi by unknown, to avoid use at lucas synthesis level,
** because it is used at the place of INV1
        **class          := combi;
        class            := unknown;
        in               := [IN];
        out              := [INN];
        area             := 1;
        fan_in           := [2];
        delay            := [1];
        fan_out_factor   := [1];
        max_fan_out      := 8;
```

```
        function           := [^IN];
        hilo_order          := [IN,INN];
    end record;
        class               := combi;
        in                  := [A];
        out                 := [AN];
        area                := 1;
        fan_in              := [1];
        delay               := [3];
        fan_out_factor      := [1];
        max_fan_out         := 8;
        function            := [^A];
        hilo_order          := [A,AN];
        method              := INV[AN,A];
    end record;
    cell AOI2W44 is record
        class               := combi;
        in                  := [A,B,C,D,E,F,G,H];
        out                 := [OUT];
        area                := 4;
        fan_in              := [1,1,1,1,1,1,1,1];
        delay               := [16];
        fan_out_factor      := [2];
        max_fan_out         := 8;
        function            := [^(A.B.C.D+E.F.G.H)];
        hilo_order          := [A,B,C,D,E,F,G,H,OUT];
    end record;
    cell AOI2W33 is record
        class               := combi;
        in                  := [A,B,C,D,E,F];
        out                 := [OUT];
        area                := 3;
        fan_in              := [1,1,1,1,1,1];
        delay               := [12];
        fan_out_factor      := [2];
        max_fan_out         := 8;
        function            := [^(A.B.C+D.E.F)];
        hilo_order          := [A,B,C,D,E,F,OUT];
    end record;
    cell OAI2W33 is record
        class               := combi;
        in                  := [A,B,C,D,E,F];
        out                 := [OUT];
        area                := 3;
        fan_in              := [1,1,1,1,1,1];
        delay               := [13]
        fan_out_factor      := [3];
        max_fan_out         := 8;
```

```
        function          := [^((A+B+C) . (D+E+F))];
        hilo_order        := [A,B,C,D,E,F,OUT];
end record;
cell AOI2W22 is record
        class             := combi;
        in                := [A,B,C,D];
        out               := [OUT];
        area              := 2;
        fan_in            := [1,1,1,1];
        delay             := [8];
        fan_out_factor    := [2];
        max_fan_out       := 8;
        function          := [^(A.B+C.D)];
        hilo_order        := [A,B,C,D,OUT];
end record;
cell 0AOI2W2 is record
        class             := combi;
        in                := [A,B,C,D];
        out               := [OUT];
        area              := 2;
        fan_in            := [1,1,1,1];
        delay             := [12];
        fan_out_factor    := [2];
        max_fan_out       := 8;
        function          := [^((A+B).C)+D)];
        hilo_order        := [A,B,C,D,OUT];
end record;
cell AOI2W21 is record
        class             := combi;
        in                := [A,B,C];
        out               := [OUT];
        area              := 2;
        fan_in            := [1,1,1];
        delay             := [6];
        fan_out_factor    := [2];
        max_fan_out       := 8;
        function          := [^(A+B.C))];
        hilo_order        := [A,B,C,OUT];
end record;
cell OG0 is record
        class             := combi;
        in                := [A,B,C,D,E,F,G,H,I,J];
        out               := [OUT];
        area              := 5;
        fan_in            := [1,1,1,1,1,1,1,1,1,1];
        delay             := [6];
        fan_out_factor    := [4];
        max_fan_out       := 8;
```

```
        function        := [^A.(B+C).(D+E+F).(G+H+I+J))];
        hilo_order      := [A,B,C,D,E,F,G,H,I,J,OUT];
end record;
cell CG1 is record
        class           := combi;
        in              := [A,B,C,D,E];
        out             := OUT];
        area            := 3;
        fan_in          := [1,1,1,1,1];
        delay           := [9];
        fan_out_factor  := [2];
        max_fan_out     := 8;
        function        := [^((A.B)+C).(E+E))];
        hilo_order      := [A,B,C,D,e,OUT];
end record;
cell 0AIW22
        class           := combi;
        in              := [A,B,C,D];
        out             := [OUT];
        area            := 2;
        fan_in          := [1,1,1,1];
        delay           := [5];
        fan_out_factor  := [2];
        max_fan_out     := 8;
        function        := [^((A+B).(C+D))];
        hilo_order      := [A,B,C,D,OUT];
end record;
cell AOOIW22 is record
        class           := combi;
        in              := [A,B,C,D];
        out             := [OUT];
        area            := 2;
        fan_in          := [1,1,1,1];
        delay           :=-[5];
        fan_out_factor  := [2];
        max_fan_out     := 8;
        function        := [^((A.B)+(C+D))];
        hilo_order      := [A,B,C,D,OUT];
end record;
cell OAI2W21 is record
        class           := combi;
        in              := [A,B,C];
        out             := [OUT];
        area            := 2;
        fan_in          := [1,1,1];
        delay           := [3];
        fan_out_factor  := [2];
        max_fan_out     := 8;
```

```
        function        := [^(A.(B+C))];
        hilo_order      := [A,B,C,OUT];
end record;
cell AOAI2W2 is record
        class           := combi;
        in              := [A,B,C,D];
        out             := [OUT];
        area            := 2;
        fan_in          := [1,1,1,1];
        delay           := [6];
        fan_out_factor  := [2];
        max_fan_out     := 8;
        function        := (^((A.B)+C).D)];
        hilo_order      := [A,B,C,D,OUT];
end record;
cell AOAI2W22 is record
        class           := combi;
        in              := [A,B,C,D];
        out             := [OUT];
        area            := 2;
        fan_in          := [1,1,1,1];
        delay           := [7];
        fan_out_factor  := [2];
        max_fan_out     := 8;
        function        := ^((A.B).(C+D))];
        hilo_order      := [A,B,C,D,OUT];
end record;

cell LATCH is record
        in              := [D,E,EN];
        out             := [Q,QN];
        class           := seq;
        area            := 2;
        fan_in          := [1,1,1];
        delay           := [6,5];
        fan_out_factor  := [1,1];
        max_fan_out     := [D.E,^(CD.E)];
        hilo_order      := [D,E,EN,Q,QN];
end record;
cell LATCHR is record
        in              := [D,E,EN,R];
        out             := [Q,QN];
        class           := seq;
        area            := 3;
        fan_in          := [1,1,1,1];
        delay           := [6,9];
        fan_out_factor  := [2,1];
        max_fan_out     := 8;
```

```
        function         := [(D.E).^,^((D.E).^R)];
        hilo_order       := [D,E,EN,R,Q,QN];
end record;
cell LATCHS is record
        in               := [D,E,EN,S];
        out              := [Q,QN];
        class            := seq;
        area             := 3;
        fan_in           := [1,1,1,1];
        delay            := [5,5];
        fan_out_factor   := [1,2];
        max_fan_out      := 8;
        function         := [(D.E)+S,^((D.E)+S)];
        hilo_order       := [D,E,EN,S,Q,QN];
end record;
cell LATCHRN is record
        in               := [D,E,EN,RN];
        out              := [Q,QN];
        class            := seq;
        area             := 3
        fan_in           := [1,1,1,1];
        delay            := [5,6];
        fan_out_factor   := [1,1];
        max_fan_out      := 8;
        function         := [(D.E).RN,^((D.E).RN)];
        hilo_order       := [D,E,EN,RN,Q,QN];
```

Appendix A.5 - The .BAS file

Matra Design Semiconductor, Inc. 1989.

.AB/.^E_MAC2
.AB/.^E_MAC2_GEN
.AB/.^E_MAC3
.AB/.^E_MAC3_GEN
AND3_EXPAND1
AND3_EXPAND2
AND3_OUT2
GASPBUF3STA_REMOVE
BUF3STA_BO3N4
GASPDFFRS_REMOVE1
GASPDFFRS_REMOVE3
DFFRNSN1_NQ_SUPP1
DFFRNSN1_QNQ_SUPP1
FORK_INV1_OUT_GEN_NOR
FORK_INV1_OUT
FORK_INV1_OUT_GEN
FORK_INV1_IN_OUT_GEN
FIN_DFFRN1_CK_QNQ
FIN_DFFRN1_CK_Q
FIN_DFFRN1_CK_NQ
FIN_DFFRN1_RN_QNQ
FIN_DFFRN1_RN_NQ
NOFAN_SUPP1
F3F3F3_ID13_MRG_GEN
IDI3_F8
IDI4_F8
F2F2_F4_MRG_GEN
F2F2F2_F6_MRG_GEN
F3F3_F6_MRG_GEN
F8_REM1
F8_REM2
ID11_REM
F2_REM
F3_REM
F6_REM
F8_REM
NOFAN_REM
ASS_DFFRN1_Q_GEN
ASS_DFFRN1_Q_QN
ASS_DFFRN1_QN_GEN
ASS_DFFRN1_QN_Q
ASS_DFFRN1_QN_Q_GEN
ASS_DFFRSN1_QN_GEN
INV1_INV1_NOR
INV1_SUPP2_GEN
INV1_INV2
INV1_INV1
NAND22_NAND2_GEN3

NAND2_NOR2_GEN
NANDI3_MACRO1
NAND3_INV1_IN3
NOR2_INV1_11
NOR2_NAND2_GEN
NORI3_MACRO1
MUX1_REM
OR2_EXPAND2
OR2_INV1
OR3_EXPAND2

```
rule ".AB/,^E_MAC2" <6> is
    in              : A,B,E;
    out             : AND,EN;
begin
    if
        (Z6$1)      := NAND2 (A, B);
        (AND, EN)   := INV2 (Z6$1, E);
    then
        (AND, , EN)                := ANDI2 (A, B, E);
    end if;
end;
rule ".AB/,^E_MAC2_GEN" <6> is
    in              : A,B,E;
    out             : AND,EN;
    generic_out     : NAN;
begin
    if
        (NAN)       := NAND2 (A, B);
        (AND, EN)   := INV2 (NAN, E);
    then
        (AND, NAN, EN)             := ANDI2 (A, B, E);
    end if;
end;
rule ".AB/,^E_MAC3" <6> is
    in              : A,B,E;
    out             : AND,EN;
begin
    if
        (Z6$1)      := NAND2 (A, B);
        (EN, AND)   := INV2 (E, Z6$1);
    then
        (AND, , EN)                := ANDI2 (A, B, E);
    end if;
end;
rule ".AB/,^E_MAC3_GEN" <6> is
```

```
    in              : A,B,E;
    out             : AND,EN;
    generic_out     : NAN;
begin
    if
        (NAN)           := NAND2 (A, B);
        (EN, AND)       := INV2 (E, NAN);
    then
        (AND, NAN, EN)          := ANDI2 (A, B, E);
    end if;
end;

rule AND3_EXPAND1 <1> is
    IN              : A, B, E;
    OUT             : C, D;
begin
    if
        (D, C)          := AND3 (A, B, E);
    then
        (C)             := NAND3 (A, B, E); (D) := INV1 (C);
    end if;
end;

rule AND3_EXPAND2 <1> is
    IN              : A, B, E;
    OUT             : D;
begin
    if
        (D,)            := AND3 (A, B, E);
    then
        (C)             := NAND3 (A, B, E); (D) := INV1 (C);
    end if;
end;

rule AND3_OUT2 <1> is
    IN              : A, B, E;
    OUT             : C;
begin
    if
        (, C)           := AND3 (A, B, E);
    then
        (C)             := NAND3 (A, B, E);
    end if;
end;

rule GASPBUF3STA_REMOVE <1> is
    in              : in1, ena;
    out             : xxx;
```

```
begin
  if
      (xxx)          := GASPBUF3STA (inl, ena);
  then
      (nena)         := INV1 (ena);
      (xxx)          := BUF3STA      (inl, nena);
  end if;
end;

rule BUF3STA_BO3N4 <2> is
  in                 : inl, ena;
  out                : outl;
begin
  if
      (outl)         := BUF3STA (in1, ena);
  then
      (outl)         := BO3N4        (inl, ena);
  end if;
end;

rule GASPDFFRS_REMOVE1 <1> is
      in             : d, ck, r, s;
      out            : q, nq;
  begin
    if
        (q, nq)      := GASPDFFRS (d, ck, r, s);
    then
        (rn)         := INV1 (r); (sn)           := INV1 (s);
        (q, nq)      := DFFRNSN1 (d, ck, rn, sn);
    end if;
  end;

rule GASPDFFRS_REMOVE3 <1> is
      in             : d, ck, r, s;
      out            : nq;
  begin
  if
      (, nq)         := GASPDFFRS (d, ck, r, s);
  then
      (rn)           := INV1 (r); (sn)       := INV1 (s);
      (, nq)         := DFFRNSN1 (d, ck, rn, sn);
  end if;
end;

rule DFFRNSN1_NQ_SUPP1 <3> is
   in                : d, ck, rn;
   supply1           : sn;
   out               : nq;
```

```
      generic_out          : sn;
begin
   if
      ( , nq)               := DFFRNSN1 (d, ck, rn, sn);
   then
      ( , nq)               := DFFRN1 (d, ck, rn);
   end if;
end;

rule DFFRNSN1_QNQ_SUPP1 <3> is
   in                       : d, ck, rn;
   supply1                  : sn;
   out                      : q, nq;
   generic_out              : sn;
begin
   if
      (q, nq)               := DFFRNSN1 (d, ck, rn, sn);
   then
      (g, nq)               := DFFRN1 (d, ck, rn);
   end if;
end;

RULE FORK_INV1_OUT_GEN_NOR <1> IS
   IN                       : A;
   OUT                      : B, C;
   GENERIC_OUT              : GEN;
BEGIN
   IF
      (B)                   := INV1 (A); (C)      := INV1 (A);
      (GEN)                 := (A);
   THEN
      (Z)                   := INV1 (A);
      (B)                   := (Z); (C)           := (Z);
      (GEN)                 := (A);
   END IF;
END;

RULE FORK_INV1_OUT <8> IS
   IN      :                A;
   OUT                      : B, C;
BEGIN
   IF
      (B)                   := INV1 (A); (C)      := INV1 (A);
   THEN
      (Z)                   := INV1 (A); (B)      := (Z); (C)    := (Z);
   END IF;
END;
```

```
RULE FORK_INV1_OUT_GEN <8> IS
    IN              : A;
    OUT             : B, C;
    GENERIC OUT     : GEN;
BEGIN
    IF
        (B)         := INV1 (A); (C)      := INV1 (A);
        (GEN)       := (A);
    THEN
        (Z)         := INV1 (A);
        (B)         := (Z); (C)           := (Z);
        (GEN)       := (A);
    END IF;
END;

RULE FORK_INV1_IN_OUT_GEN <8> IS
    IN              : A;
    OUT             : B;
    GENERIC_OUT     : GEN;
BEGIN
    IF
        (GEN)       := INV1 (A); (B)      := INV1 (GEN);
    THEN
        (GEN)       := INV1 (A); (B)      := (A);
    END IF;
END;

rule FIN_DFFRN1_CK_QNQ <11> is
    in              : D, CK, RN;
    out             : Q, QN;
    generic_out     : CK;
begin
    if
        (Q, QN)     := DFFRN1 (D, CK, RN);
    then
        (FANIN)     := FAN3(CK);
        (Q, QN)     := DFFRN1 (D, FANIN, RN);
    end if;
end;

rule FIN_DFFRN1_CK_Q <11> is
    in              : D, CK, RN;
    out             : Q;
    generic_out     : CK;
begin
    if
        (Q,)        := DFFRN1 (D, CK, RN);
    then
```

```
      (FANIN)            := FAN3(CK);
      (Q,)               := DFFRN1 (D, FANIN, RN);
   end if;
end;

rule FIN_DFFRN1_CK_NQ <11> is
   in              : D, CK, RN;
   out             : QN;
   generic_out     : CK;
begin
   if
      (, QN)             := DFFRN1 (D, CK, RN);

then
      (FANIN)            := FAN3(CK);
      (, QN)             := DFFRN1 (D, FANIN, RN);
   end if;
end;

rule FIN_DFFRN1_RN_QNQ <11> is
   in              : D, CK, RN;
   out             : Q, QN;
   generic_out     : RN;
begin
   if
      (Q, QN)            := DFFRN1 (D, CK, RN);
   then
      (FANIN)            := FAN2(RN);
      (Q, QN)            := DFFRN1 (D, CK, FANIN);
   end if;
end;

rule FIN_DFFRN1_RN_NQ <11> is
   in              : D, CK, RN;
   out             : QN;
   generic_out     : RN;
begin
   if
      (, QN)             := DFFRN1 (D, CK, RN);
   then
      (FANIN)            := FAN2(RN);
      (, QN)             := DFFRN1 (D, CK, FANIN);
   end if;
end;

rule "NOFAN_SUPP1" <11> is
   supply1         : ONEIN;
   out             : ONEOUT;
```

```
      generic_out         : GEN;
begin
   if
      (ONEOUT)            := (ONEIN);
      (GEN)               := (ONEIN);
   then
      (ONEOUT, GEN)       := NOFAN (ONEIN);
   end if;
end;

rule "F3F3F3_ID13_MRG_GEN" <11> is
      in                  : A;
      out                 : B,C,D;
      generic_out         : A;
begin
   if
      (D) :               = FAN3 (A);
      (C)                 := FAN3 (A);
      (B)                 := FAN3 (A);
   then
      (B, C, D)           := ID13 (A);
   end if;
end;

rule "ID13_F8" <4> is
      in                  : A;
      out                 : B,C,D;
begin
   if
      (B, C, D)           := ID13 (A);
   then
      (D)                 := FAN8 (A);
      (B)                 := (D);
      (C)                 := (D);
   end if;
end;

rule "ID14_F8" <4> is
      in                  : A;
      out                 : B,C,D,E;
begin
   if
      (B, C, D, E)            := ID14 (A);
   then
      (E)                 := FAN8 (A);
      (B)                 := (E);
      (C)                 := (E);
      (D)                 := (E);
```

```
        end if;
      end;

rule "F2F2_F4_MRG_GEN" <4> is
      in              : A;
      out             : B,C;
      generic_out     : A;
begin
   if
      (C)             := FAN2 (A);
      (B)             := FAN2 (A);
   then
      (C)             := FAN4 (A);
      (B)             := (C);
   end if;
end;

rule "F2F2F2_F6_MRG_GEN" <4> is
      in              : A;
      out             : B,C,D;
      generic_out     : A;
begin
   if
      (D)             := FAN2 (A);
      (C)             := FAN2 (A);
      (B)             := FAN2 (A);
   then
      (D)             := FAN6 (A);
      (B)             := (D);
      (C)             := (D);
   end if;
end;

rule "F3F3_F6_MRG_GEN" <4> is
      in              : A;
      out             : B,C;
      generic_out     : A;

begin
   if
      (C)             := FAN3 (A);
      (B)             := FAN3 (A);
   then
      (C)             := FAN6 (A);
      (B)             := (C);
   end if;
end;
```

```
rule "F8_REM1" <4> is
    in              : A;
    out             : FAN;
    generic_out     : GEN;
begin
    if
        (FAN)       := FAN8 (A);
        (GEN)       := (A);
    then
        (Z4$1)      := ID11 (A);
        (GEN)       := ID11 (Z4$1);
        (FAN)       := ID11 (Z4$1);
    end if;
end;

rule "F8_REM2" <4> is
    in              : A;
    out             : FAN;
    generic_out     : NA,GEN;
begin
    if
        (NA)        := ID11 (A);
        (GEN)       := ID11 (NA);
        (FAN)       := FAN8 (GEN);
    then
        (NA)        := ID11 (A);
        (FAN)       := ID11 (NA);
        (GEN)       := ID11 (NA);
    end if;
end;

rule "ID11_REM" <14> is
    in              : A;
    out             : FAN;
begin
    if
        (FAN)       := ID11 (A);
    then
        (FAN)       := INVP (A);
    end if;
end;

rule "F2_REM" <14> is
        in              : A;
        out             : FAN;
    begin
        if
            (FAN)       := FAN2 (A);
```

```
        then
            (FAN)       := (A);
        end if;
end;

rule "F3_REM" <14> is
    in              : A;
    out             : FAN;
begin
    if
        (FAN)       := FAN3 (A);
    then
        (FAN)       := (A);
    end if;
end;

rule "F6_REM" <14> is
    in              : A;
    out             : FAN;
begin
    if
        (FAN)       := FAN6 (A);
    then
        (FAN)       := (A);
    end if;
end;

rule "F8_REM" <14> is
    in              : A;
    out             : FAN;
begin
    if
        (FAN)       := FAN8 (A);
    then
        (FAN)       := (A);
    end if;
end;

rule "NOFAN_REM" <14> is
    in              : A;
    out             : NF1,NF2;
begin
    if
        (NF1, NF2)  := NOFAN (A);
    then
        (NF1)       := (A);
        (NF2)       := (A);
```

```
        end if;
end;

rule ASS_DFFRN1_Q_GEN <8> is
        in              : D, CK, RN;
        out             : QN;
        generic_out     : Q;
begin
    if
        (Q,)            := DFFRN1 (D, CK, RN);
        (QN)            := INV1 (Q);
    then
        (Q, QN)         := DFFRN1 (D, CK, RN);
    end if;
end;

rule ASS_DFFRN1_Q_QN <8> is
        in              : D, CK, RN;
        out             : QN, NOTQ;
begin
    if
        (Q, QN)         := DFFRN1 (D, CK, RN);
        (NOTQ)          := INV1 (Q);
    then
        (, QN)          := DFFRN1 (D, CK, RN);
        (NOTQ)          := (QN);
    end if;
end;

rule ASS_DFFRN1_QN_GEN <8> is
        in              : D, CK, RN;
        out             : Q;
        generic_out     : QN;
begin
    if
        (, QN)          := DFFRN1 (D, CK, RN);
        (Q)             := INV1 (QN);
    then
        (Q, QN)         := DFFRN1 (D, CK, RN);
    end if;
end;

rule ASS_DFFRN1_QN_Q <8> is
        in              : D, CK, RN;
        out             : Q, NOTQN;
begin
    if
        (Q, QN)         := DFFRN1 (D, CK, RN);
```

```
        (NOTQN)         := INV1 (QN);
    then
        (Q, )           := DFFRN1 (D, CK, RN);
        (NOTQN)         := (Q);
    end if;
end;

rule ASS_DFFRN1_QN_Q_GEN <8> is
    in              : D, CK, RN;
    out             : Q, NOTQN;
    generic_out     : QN;
begin
    if
        (Q, QN)         := DFFRN1 (D, CK, RN);
        (NOTQN)         := INV1 (QN);
    then
        (Q, QN)         := DFFRN1 (D, CK, RN);
        (NOTQN)         := (Q);
    end if;
end;

rule ASS_DFFRNSN1_QN_GEN <8> is
    in              : D, CK, RN, SN;
    out             : Q;
    generic_out     : QN;
begin
    if
        (, QN)          := DFFRNSN1 (D, CK, RN, SN);
        (Q)             := INV1 (QN);
    then
        (Q, QN)         := DFFRNSN1 (D, CK, RN, SN);
    end if;
end;

RULE INV1_INV1_NOR <1> IS
    IN              : A;
    OUT             : B;
BEGIN
    IF
        (Z)             := INV1 (A); (B)    := INV1 (Z);
    THEN
        (B)             := (A);
    END IF;
END;

RULE INV1_SUPP2_GEN <3> IS
```

```
    SUPPLY1         : One;
    SUPPLY0         : Zero;
    OUT             : A, One;
    GENERIC_OUT     : Zero;
BEGIN
    IF
        (A)         := INV1 (Zero);
    THEN
        (A)         := (One);
    END IF;
END;

RULE INV1_INV2 <6> IS
    IN              : A, B;
    OUT             : NA, NB;
BEGIN
    IF
        (NA)        := INV1 (A); (NB)       := INV1 (B);
    THEN
        (NA, NB)    := INV2 (A, B);
    END IF;
END;

RULE INV1_INV1 <8> IS
    IN              : A;
    OUT             : B;
BEGIN
    IF
        (Z)         := INV1 (A); (B)        := INV1 (Z);
    THEN
        (B)         := (A);
    END IF;
END;

RULE NAND22_NAND2_GEN3 <8> IS
    IN              : A, B;
    OUT             : C, D;
    GENERIC_OUT     : A, B;
BEGIN
    IF
        (C)         := NAND2 (A, B);
        (D)         := NAND2 (A, B);
    THEN
        (Z)         := NAND2 (A, B);
        (C)         := (Z); (D)    := (Z);
    END IF;
END;
```

```
RULE NAND2_NOR2_GEN <8> IS
    IN              : A, B;
    OUT             : C;
    GENERIC_OUT     : GEN;
BEGIN
    IF
        (Z)         := INV1 (A); (GEN)    := NAND2 (Z, B);
        (C)         := INV1 (GEN);
    THEN
        (Z)         := INV1 (B); (C)      := NOR2 (A, Z);
        (GEN)       := INV1 (C);
    END IF;
END;

RULE NAND13_MACRO1 <6> IS
    IN              : A, B, C, E;
    OUT             : NAN, EN;
BEGIN
    IF
        (NAN)       := NAND3 (A, B, C);
        (EN)        := INV1 (E);
    THEN
        (NAN, EN)   := NANDI3 (A, B, C, E);
    END IF;
END;

RULE NAND3_INV1_IN3 <8> IS
    IN              : A, B, C;
    OUT             : D;
BEGIN
    IF
        (NA)        := INV1 (A); (NB)     := INV1 (B); (NC)     := INV1
        (D)         := NAND3 (NA, NB, NC);
    THEN
        (Z)         := NOR3 (A, B, C);
        (D)         := INV1 (Z);
    END IF;
END;

RULE NOR2_INV1_11 <8> IS
    IN              : A, B;
    OUT             : Out1;
BEGIN
    IF
        (Z1)        := INV1 (A);
        (Z2)        := INV1 (B);
        (Out1)      := NOR2 (Z1, Z2);
    THEN
```

```
        (Z1)            := NAND2 (A, B);
        (Outl)          := INV1 (Z1);
    END IF;
END;

RULE NOR2_NAND2_GEN <8> IS
    IN              : A, B;
    OUT             : C;
    GENERIC_OUT     : GEN;
BEGIN
    IF
        (Z)         := INV1 (A); (GEN)      := NOR2 (Z, B);
        (C)         := INV1 (GEN);
    THEN
        (Z)         := INV1 (B); (C)        := NAND2 (A, Z);
        (GEN)       := INV1 (C);
    END IF;
END;

RULE NORI3_MACRO1 <6> IS
    IN              : A, B, C, E;
    OUT             : NOR, EN;
BEGIN
    IF
        (NOR)       := NOR3 (A, B, C);
        (EN)        := INV1 (E);
    THEN
        (NOR, EN)   := NORI3 (A, B, C, E);
    END IF;
END;

rule MUX1_REM <1> is
    in              : A, B, E;
    out             : OUT1;
begin
    if
        (OUT1)      := MUX1 (A, B, E);
    then
        (NE)        := INV1 (E);
        (NOUT1)     := AOI2W22 (A, E, B, NE);
        (OUT1)      := INV1 (NOUT1);
    end if;
end;

rule OR2_EXPAND2 <1> is
    IN              : A, B;
    OUT             : D;
begin
```

```
    if
        (D,)            := OR2 (A, B);
    then
        (C)             := NOR2 (A, B); (D)      := INV1 (C);
    end if;
end;

rule OR2_INV1 <8> is
    IN              : A, B;
    OUT             : C;
begin
    if
        (E)             := INV1 (B);
        (Z)             := NOR2 (A, E);
        (C)             := INV1 (Z);
    then
        (Z)             := INV1 (A);
        (C)             := NAND2 (Z, B);
    end if;
end;

rule OR3_EXPAND2 <1> is
    IN              : A, B, E;
    OUT             : D;
begin
    if
        (D,)            := OR3 (A, B, E);
    then
        (C)             := NOR3 (A, B, E); (D)     := INV1 (C);
    end if;
end;
```

Appendix A.6 the .NET File

Matra Design Semiconductor, Inc. 1989

```
*************************************************************************
**
** Date           :   Wed Oct 10 12:32:22 PDT 1990
** Device         :   p22v10
** Technology     :   md
** Path           :   /usr/desdisk2/design/bfl1-
** From Abel(R)   :   eval.abl
** To   Hilo(R)   :   eval.cct
*************************************************************************
*
** PIN 1  -> clk25_      PIN 2    -> db00
** PIN 3  -> db01        PIN 4    -> db02
** PIN 5  -> vsync       PIN 6    -> sccint_
** PIN 7  -> hwcyc_      PIN 8    -> ba02
** PIN 9  -> rd_         PIN 10   -> res_
** PIN 11-> ate_         PIN 13   -> ba04
** PIN 14-> intenb_      PIN 15   -> csdone_
** PIN 16-> cycntl_      PIN 17   -> rdcntl_
** PIN 18-> rdstat_      PIN 19   -> vihld_
** PIN 20-> vi           PIN 21   -> vien
** PIN 22-> sien         PIN 23   -> vidon
*************************************************************************
WITH $LIB/MD;
CIRCUIT EVAL IS IN          : PIN1, PIN2, PIN3, PIN4, PIN5, PIN6, PIN7, PIN8, PIN9, PIN10, PIN11,
              PIN1
SUPPLY0     :SZERO;
SUPPLY1     : SONE;
OUT         : SZERO, SONE, PIN18, PIN19, PIN16, PIN20, PIN15, PIN21, PIN17,
              PIN22, PIN23, PIN14;

BEGIN
GN13PD (N13PD)      := BUFINTTL (PIN13);
GN11PD (N11PD)      := BUFINTTL (PIN11);
GN10PD (N10PD)      := BUFINTTL (PIN10);
GN9PD  (N9PD)       := BUFINTTL (PIN9);
GN8PD  (NSPD)       := BUFINTTL (PIN8);
GN7PD  (N7PD)       := BUFINTTL (PIN7);
GN6PD  (N6PD)       := BUFINTTL (PIN6);
GN5PD  (NSPD)       := BUFINTTL (PIN5);
GN4PD  (N4PD)       := BUFINTTL (PIN4);
GN3PD  (N3PD)       := BUFINTTL (PIN3);
GN2PD  (N2PD)       := BUFINTTL (PIN2);
GZ1271 (Z1271)      := INVP (Z1301);
GZ1281 (Z1281)      := INVP (Z1301);
GZ1291 (Z1291)      := INVP (Z1301);
GZ1301 (Z1301)      := INVP (N1PD);
```

```
GN1PD (N1PD)        := BUFINTTL (PIN1);
GZ1311 (Z1311)      := INVP (Z1401);
GZ1011 (PIN21)      := BO3N4 (Z1381, Z1021);
GZ1021 (Z1021)      := NAND2 (Z1233, Z1031);
GZ1321 (Z1321, Z1322)   := DFFRN1 (Z1112, Z1291, Z1311);
GZ1001 (PIN22)      := BO3N4 (Z1331, Z1021);
GZ951 (Z951)        := AOI2W22 (Z1331, Z1211, N3PD, Z1113);
GZ1331 (Z1331, Z1332)   := DFFRN1 (Z972, Z1271, Z1391);
GZ971 (Z971, Z972)  := NANDI3 (N8PD, Z1233, Z1112, Z951);
GZ1341 (Z1341, Z1342)   := DFFRN1 (Z1091, Z1271, Z1311);
GZ1091 (Z1091, Z1092, Z1093)    := ANDI2 (Z1322, Z1112, Z1021);
GZ1101 (PIN15)      := BO3N4 (Z1342, Z1111);
GZ1111 (Z1111, Z1112, Z1113)    := ORI2 (N7PD, N13PD, Z1211);
GZ1121 (PIN14)      := BO3N4 (Z1032, Z1192);
GZ1131 (PIN17)      := BO3N4 (Z1021, Z1192);
GZ1141 (PIN16)      := BO3N4 (Z1322, Z1192);
GZ1161 (PIN18)      := BO3N4 (Z971, Z1192);
GZ1171 (PIN23)      := BO3N4 (Z1351, Z1192);
GZ1351 (Z1351, Z1352)   := DFFRN1 (Z1191, Z1281, Z1391);
GZ1191 (Z1191, Z1192)   := INV2 (Z1201, N1IPD);
Gz1201 (Z1201)      := AOI2W22 (Z1351, Z1211, N2PD, Z1113);
GZ1211 (Z1211)      := NAND3 (Z1341, N9PD, Z1031);
GZ1031 (Z1031, Z1032)   := NORI3 (N13PD, N7PD, N8PD, N14MX);
GN14MX (N14MX)      := OAI2W22 (N6PD, Z1332, Z1382, Z1362);
GZ1041 (PIN20)      := BO3N4 (Z1361, Z1021);
GZ1361 (Z1361, Z1362)   := DFFRN1 (Z1072, Z1291, Z1391);
GZ1151 (PIN19)      := BO3N4 (Z1372, Z1192);
GNN19MX (NN19MX)    := AOI2W21 (N5PD, Z1371, Z1021);
GZ1371 (Z1371, Z1372)   := DFFRN1 (Z1071, Z1291, Z1311);
GZ1071 (Z1071, Z1072)   := INV2 (NN19MX, Z1081);
GZ1081 (Z1081, Z1082)   := NORI3 (Z1371, Z1093, N5PD, Z981);
GZ981 (Z981)        := AOI2W22 (Z1381, Z1211, N4PD, Z1113);
GZ1381 (Z1381, Z1382)   := DFFRN1 (Z1082, Z1271, Z1391);
GZ1391 (Z1391)      := INVP (Z1401);
GZ1401 (Z1401)      := INVP (Z1231);
GZ1231 (Z1231, Z1232, Z1233)    := ANDI2 (N10PD, N1NPWR, N9PD);
GN1NPWR (N1NPWR)    := POR (SONE);
END;
```

Appendix A.7 the .CCT File

Matra Design Semiconductor, Inc. 1989

```
*** FIRST PAGE OF SCAN ***
************************************************************************
** Date       : Wed Oct 10 12:32:22 PDT1990
** Device     : p22v10
** Technology : md
** Path       : /usr/desdisk2/design/bill
** From Abel(R) : eval.abl
** To   Hilo(R) : eval.cct
************************************************************************
** PIN 1     -> clk25       PIN 2  -> db00
** PIN 3     -> db01        PIN 4  -> db02
** PIN 5     -> vsync       PIN 6  -> sccint
** PIN 7     -> hwcyc_      PIN 8  -> ba02
** PIN 9     -> rd_         PIN 10 -> res_
** PIN 11    -> ate_        PIN 13 > ba04
** PIN 14    -> intenb_     PIN 15 -> csdone_
** PIN 16    -> cycntl_     PIN 17 -> rdcntl_
** PIN 18    -> rdstat_     PIN 19 -> vihld_
** PIN 20    -> vi          PIN 21 -> vien
** PIN 22    -> sien        PIN 23 -> vidon
************************************************************************

CCT CMOS PS 100 EVAL (PIN1, PIN2, PIN3, PIN4, PIN5, PIN6, PIN7, PIN8, PIN9
, PIN10, PIN11, PIN13, PIN14, PIN15, PIN16, PIN17, PIN18
, PIN19, PIN20, PIN21, PIN22, PIN23)

BUFINTTL   GN13PD (PIN13, N13PD);
BUFINTTL   GN11PD (PIN11, N11PD);
BUFINTTL   GN10PD (PIN10, N10PD);
BUFINTTL   GN9PD (PIN9, N9PD);
BUFINTTL   GN8PD (PIN8, N8PD);
BUFINTTL   GN7PD (PIN7, N7PD);
BUFINTTL   GN6PD (PIN6, N6PD);
BUFINTTL   GN5PD (PIN5, N5PD);
BUFINTTL   GN4PD (PIN4, N4PD);
BUFINTTL   GN3PD (PIN3, N3PD);
BUFINTTL   GN2PD (PIN2, N2PD);
INVP  GZ1271 (Z1301, Z1271);
INVP  GZ1281 (Z1301, Z1281);
INVP  GZ1291 (Z1301, Z1291);
INVP  GZ1301 (N1PD, Z1301);
BUFINTTL   GN1PD (PIN1, N1PD);
INVP       GZ1311      (Z1401, Z1311);
BO3N4      GZ1011      (Z1381, Z1021, PIN21);
NAND2      GZ1021      (Z1233, Z1031, Z1021);
DFFRN1     GZ1321      (Z1112, Z1291, Z1311, , Z1322);
BO3N4      GZ1001      (Z1331, Z1021, PIN22);
AOI2W22    GZ951       Z1331, Z1211, N3PD, Z1113, Z951);
```

| | | |
|---|---|---|
| DFFRN1 | GZ1331 | (Z972, Z1271, Z1391, Z1331, Z1332); |
| NANDI3 | GZ971 | (N8PD, Z1233, Z1112, Z971, Z951, Z972); |
| DFFRN1 | GZ1341 | (Z1091, Z1271, Z1311, Z1341, Z1342); |
| ANDI2 | GZ1091 | (Z1322, Z1112, Z1091, , Z1021, Z1093); |
| BO3N4 | GZ1101 | (Z1342, Z1111, PIN15); |
| ORI2 | GZ1111 | (N7PD, N13PD, Z1111, Z1112, Z1211, Z1113); |
| BO3N4 | GZ1121 | (Z1032, Z1192, PIN14); |
| BO3N4 | GZ1131 | (Z1021, Z1192, PIN17); |
| BO3N4 | GZ141 | (Z1322, Z1192, PIN16); |
| BO3N4 | GZ1161 | (Z971, Z1192, PIN18); |
| BO3N4 | GZ1171 | (Z1351, Z1192, PIN23); |
| DFFRN1 | GZ1351 | (Z1191, Z1281, Z1391, Z1351, ); |
| INV2 | GZ1191 | (Z1201, Z1191, N11PD, Z1192); |
| AOI2W22 | GZ1201 | (Z1351, Z1211, N2PD, Z1113, Z1201); |
| NAND3 | GZ1211 | (Z1341, N9PD, Z1031, Z1211); |
| NORI3 | GZ1031 | (N13PD, N7PD, N8PD, Z1031, N14MX, Z1032); |
| OAI2W22 | GN14MX | (N6PD, Z1332, Z1382, Z1362, N14MX); |
| BO3N4 | GZ1041 | (Z1361, Z1021, PIN20); |
| | | |
| DFFRN1 | GZ1361 | (Z1072, Z1291, Z13191, Z1361, Z1362); |
| BO3N4 | GZ1151 | (Z1372, Z1192, PIN19); |
| AOI2W21 | GNN19MX | (N5PD, Z1371, Z1021, NN19MX); |
| DFFRN1 | GZ1371 | (Z1071, Z1291, Z1311, Z1371, Z1372); |
| INV2 | GZ1071 | (NN19MX, Z1071, Z1081, Z1072); |
| NORI3 | GZ1081 | (Z1371, Z1093, N5PD, Z1081, Z981, Z1082); |
| AOI2W22 | GZ981 | (Z1381, Z1211, N4PD, Z1113, Z981); |
| DFFRN1 | GZ1381 | (Z1082, Z1271, Z1391, Z1381, Z1382); |
| INVP | GZ1391 | (Z1401, Z1391); |
| INVP | GZ1401 | (Z1231, Z1401); |
| ANDI2 | GZ1231 | (N10PD, N1NPWR, Z1231, , N9PD, Z1233); |
| POR | GN1NPWR | (SONE, N1NPWR); |
| SUPPLY1 | SONE; | |

WIRE N13PD N11PD N10PD N9PD N8PD N7PD N6PD N5PD N4PD N3PD N2PD Z1271
Z1281 Z1291 Z1301 N1PD Z1311 Z1021 Z1322 Z951 Z1331 Z1332 Z971 Z972
Z1341 Z1342 Z1091 Z1093 Z1111 Z1112 Z1113 Z1351 Z1191 Z1192 Z1201 Z1211
Z1031 Z1032 N14MX Z1361 Z1362 NN19MX Z1371 Z1372 Z1071 Z1072 Z1081
Z1082 Z981 Z1381 Z1382 Z1391 Z1401 Z1231 Z1233 N1NPWR;
INPUT PIN13 PIN11 PIN10 PIN9 PIN8 PIN7 PIN6 PIN5 PIN4 PIN3 PIN2 PIN1 ; WIRE
PIN23 PIN22 PIN21 PIN20 PIN19 PIN18 PIN17 PIN16 PIN15 PIN14 ;

Appendix A.8 the .KDB File

Matra Design Semiconductor, Inc. 1989

```
pld: pal;
type: DFFRNSN;
data_out_term: q;
data_bar_out_term: nq;
data_in_term: d;
clock_waveform:
{
PIN1 :=0; PIN1 :=1; learn;
}
incremental: yes;
display: yes
store_all_edges: yes
constraint_1: { PIN1 } := x;
constraint_2: { PIN13 } := x;
end:pal;
```

Appendix A.9 the .DWL File

© Matra Design Semiconductor, Inc. 1989

WAVEFORM EVAL;

INPUT PIN13 PIN11 PIN10 PIN9 PIN8 PIN7 PIN6 PIN5 PIN4 PIN3
    PIN2 PIN1 ;

OUTPUT PIN23 PIN22 PIN21 PIN20 PIN19 PIN18 PIN17 PIN16 PIN15 PIN14 ;

BASE BIN;

INTERVAL 100;

STROBEOFFSET 70;

BEGIN
    PIN13 := 0
    PIN11 := 0
    PIN10 := 0
    PIN9 := 0
    PIN8 := 0
    PIN7 := 0
    PIN6 := 0
    PIN5 : = 0
    PIN4 := 0
    PIN3 := 0
    PIN2 : = 0
    PIN1 := 0;
    learn ( );
    testgen (pal);
    PIN13 := 1;
    testgen (pal);
    learn ( );
    .END
ENDWAVEFORM Appendix A.10 the .TAB File © Matra Design Semiconductor, Inc. 1989

```
PPPPPPPPPPPP    ZZZ
IIIIIIIIIIIIPPPPPPPPP111
NNNNNNNNNNNNNNIIIIIIIII011
2222111111111NNNNNNNNN219
3210987654310987654321112
```

----TIME----

| Time | Value |
|---|---|
| 0 | Z000ZZZZ1Z000000000000001 |
| 2000 | 0ZZZ1111Z1011111011110110 |
| 4000 | 0ZZZ1111Z1011111011111110 |
| 4041 | 0ZZZ0111ZI011111011111110 |
| 7000 | ZZZZZZZZZ001111011111111 |
| 8000 | ZZZZZZZZZ001111011110111 |
| 9000 | ZZZZZZZZZ001111011111111 |
| 12000 | ZZZZZZZZ1Z001110011111101 |
| 13000 | ZZZZZZZZ1Z001110011110101 |
| 14000 | ZZZZZZZZ1Z001110011111101 |
| 14041 | ZZZZZZZZ0Z001110011111101 |
| 17000 | ZZZZZZZZ0Z001100011111101 |
| 18000 | ZZZZZZZZ0Z001100011110101 |
| 19000 | ZZZZZZZZ0Z001100011111101 |
| 19041 | ZZZZZZZZ1Z001100011111101 |
| 22000 | ZZZZZZZZZ101100011111111 |
| 23000 | ZZZZZZZZZ101100011110111 |
| 24000 | ZZZZZZZZZ101100011111111 |
| 27000 | ZZZZZZZZ1Z001100011111101 |
| 28000 | ZZZZZZZZ1Z001100011110101 |
| 29000 | ZZZZZZZZ1Z001100011111101 |

| | |
|---|---|
| 29041 | ZZZZZZZZ0Z001100011111101 |
| 32000 | Z111ZZZZ0Z001000001111001 |
| 33000 | Z111ZZZZ0Z001000001110001 |
| 34000 | Z111ZZZZ0Z001000001111001 |
| 34041 | Z111ZZZZ1Z001000001111001 |
| 37000 | 111111001001100000111111000 |
| 38000 | 1111110010011000001110000 |
| 39000 | 1111110010011000001111000 |
| 42000 | 1ZZZ1110100111000011111100 |
| 43000 | 1ZZZ111010011100001110100 |
| 44000 | 1ZZZ111010011100001111100 |
| 48000 | 1ZZZI1t010011100001110100 |
| 49000 | 1ZZZ111010011!00001111100 |
| 53000 | 1ZZZ111010011100001110100 |
| 54000 | 1ZZZ111010011100001111100 |
| 57000 | 1ZZZ1110Z0111100001111110 |
| 58000 | 1ZZZ1110Z1111111101111110 |
| 59000 | 1ZZZ1110Z1111111101110110 |
| 60000 | 1ZZZ1110Z1111111101111110 |
| 60041 | 1ZZZ1111Z1111111101111110 |
| 63000 | 1ZZZ1111Z1111111111111110 |
| 64000 | 1ZZZ1111Z1111111111110110 |
| 65000 | 1ZZZ1111Z1111111111111110 |
| 65041 | 1ZZZ0111Z0111111111111110 |
| 68000 | 1ZZZ0111Z0111111101111110 |
| 69000 | 1ZZZ0111Z0111111101110110 |

70000  1ZZZ0111Z01111111101111110

74000  1ZZZ0111Z01111111101110110

75000  1ZZZ0111Z01111111101111110

Appendix A.11 the .LOG file

©Matra Design Semiconductor, Inc. 1989

Log of simulation run on 10-OCT-90 at time 12:36:48

Running the HITEST test generator
Running the HIFAULT simulator
Loading the default version of circuit 'EVAL' time: 0.50 secs
WARNING delay cell evaluated to ZERO on REGISTER GZ1321.Q1.Q1.Q1
    from rise - fall delays 0:0:0(0) - 0:0:0(0)
    its delay cell will be defaulted to UNIT
WARNING delay cell evaluated to ZERO on REGISTER GZ1331.Q1.Q1.Q1
    from rise - fall delays 0:0:0(0) - 0:0:0(0)
    its delay cell will be defaulted to UNIT
WARNING delay cell evaluated to ZERO on REGISTER GZ1341.Q1.Q1.Q1
    from rise - fall delays 0:0:0(0) - 0:0:0(0)
    its delay cell will be defaulted to UNIT
WARNING delay cell evaluated to ZERO on REGISTER GZ1351.Q1.Q1.Q1
    from rise - fall delays 0:0:0(0) - 0:0:0(0)
    its delay cell will be defaulted to UNIT
WARNING delay cell evaluated to ZERO on REGISTER GZ1361.Q1.Q1.Q1
    from rise - fall delays 0:0:0(0) - 0:0:0(0)
    its delay cell will be defaulted to UNIT
WARNING delay cell evaluated to ZERO on REGISTER GZ1371.Q1.Q1.Q1
    from rise - fall delays 0:0:0(0) - 0:0:0(0)
    its delay cell will be defaulted to UNIT
WARNING delay cell evaluated to ZERO on REGISTER GZ1381.Q1.Q1.Q1
    from rise - fall delays 0:0:0(0) - 0:0:0(0)
    its delay cell will be defaulted to UNIT
Circuit Loading Complete took: 1.33 secs time: 1.83 secs
Circuit EVAL has 100 picosecs scaling
Number of subcircuit elements loaded   =    69 (size= 8784 bytes)
Number of primitive gates loaded   =    92 (size= 3912 bytes)
14 declaration expressions; 14 event statements; total size 3112 bytes
Memory used for symbols and objects by loader =    23666 bytes
Memory used for simulator structures by loader =    38344 bytes
DWL Compiler
Waveform EVAL compiled successfully
DWL to Circuit Linker
Reading circuit specific knowledge
Compiling PLD frame PAL
Blocking-off PAL element GZ1321.Q1.Q1
Blocking-off PAL element GZ1331.Q1.Q1
Blocking-off PAL element GZ1341.Q1.Q1
Blocking-off PAL element GZ1351.Q1.Q1
Blocking-off PAL element GZ1361.Q1.Q1
Blocking-off PAL element GZ1371.Q1.Q1
Blocking-off PAL element GZ1381.Q1.Q1
Writing Q-Qbar signal relationships to knowledge data base
Initialising simulator: time: 3.46 secs Default set of faults contains:
    156 top level stuck faults Fault dictionary statistics:
    156 entries
Loading of faults completed : took 0.17 secs (total 3.63 secs)
Full analysis of faults completed : took 0.05 secs (total 3.68 secs)
DWL Execution
111 faults to be simulated
Simulator initialised: took 0.20 secs (total 3.88 secs)
Trying to find stuck gates to block off
Dropping 0 undetectable stuck gate faults
Dropping 0 undetectable fuse faults
No stuck gates found
There are 12 real PIs and 12 Pseudo PIs
There are 10 real POs and 19 Pseudo POs
Decompiling knowledge data base to eval.kbo
Tabular (2.3) PRINTCHNGE with eval.tnm at time: 4.16 secs
Start simulation: took 0.35 secs (total 4.23 secs)

SIMULATOR START, number of faults 111
At time 1700 number of active faults is 78
Running PLD PAL with 78 active faults
** TG ========================================
** TG PLD PAL
** TG ========================================
Dynamic problem inserted:
Name: Spot_Faults; Use_Current_State: Yes; Raps: YES; Max_backtracks: 5
Overwriting value of USE_CURRENT_STATE in frame SPOT_FAULTS
Overwriting value of RAPT in frame SPOT_FAULTS
Overwriting value of MAX_BACKTRACKS in frame SPOT_FAULTS
** TG Problem SPOT_FAULTS
** TG    Constraint PIN1 := X;
** TG    Constraint PIN13 := X;
** TG    Working in Combinational Area (Default)
** TG    Trying to catch stuck-at-0 on NIIPD
** TG    Trying to catch stuck-at-0 on Z1071
** TG    Trying to catch 2 faults
** TG Applying RAPS to combinational area (Default)
** TG End_problem SPOT_FAULTS
At time 2700 number of active faults is 63
At time 5700 number of active faults is 47
** TG ========================================
** TG Task PAL repeated
** TG ========================================
Dynamic problem inserted:
Name: Spot_Faults; Use_Current_State: YES; Raps: YES; Max_backtracks: 5
Overwriting value of USE_CURRENT_STATE in frame SPOT_FAULTS Overwriting value of RAPS in frame SPOT_FAULTS
Overwriting value of MAX_BACKTRACKS in frame SPOT_FAULTS
** TG Problem SPOT_FAULTS
** TG Constraint PIN1 := X;
** TG Constraint PIN13 := X;
Spot_faults was specified for problem SPOT_FAULTS but no faults were found that could be detected in the current state of the circuit.
** TG   No faults spotted
** TG   Applying RAPS to combinational area (Default)
** TG End_problem SPOT_FAULTS
** TG ========================================
** TG Task PAL repeated
** TG ========================================
Dynamic problem inserted:
Name: Spot_Faults; Use_Current_State: NO; Raps: NO; Max_backtracks: 5
Overwriting value of USE_CURRENT_STATE in frame SPOT_FAULTS
Overwriting value of RAPS in frame SPOT_FAULTS
Overwriting value of MAX_BACKTRACKS in frame SPOT_FAULTS
** TG Problem SPOT_FAULTS
** TG Constraint PIN1 := X;
** TG Constraint PIN13 := X;
** TG Working in Combinational Area (Default)
** TG Trying to catch stuck-at-0 on Z1381
** TG Trying to catch stuck-at-0 on Z1331
** TG Trying to catch stuck-at-0 on N14MX
** TG Trying to catch stuck-at-1 on Z1322
** TG Trying to catch stuck-at-0 on Z1351
** TG Trying to catch stuck-at-0 on NN19MX
** TG Trying to catch 6 faults
** TG         Using state-machine knowledge
** TG                 To change PAL
** TG                 From 0000110
** TG                 To  11X1101
Trying to move from state 0000110 to 11X1101
Searching state machine PAL

| Input Wires | Old State | New State |
|---|---|---|
| PPPPPPPPPPPP | ZZZZZZZ | ZZZZZZZ |
| IIIIIIIIIII | 1111111 | 1911111 |
| NNNNNNNNNNNN | 3333333 | 1701000 |
| 111987654321 | 2345678 | 1299778 |
| 310 | 2111111 | 2 11212 |
| | | |
| 0XX000X0XXXX | X111XX1 | 01X1101 |
| 0XX0X0XXXXXX | 1111XX1 | 0111XX1 |
| 0XXXX0XXXXXX | 1101XX1 | 0111XX1 |
| 0XXI00XX111X | 101XXXX | 0111XX1 |
| 1XXXXXXXXXXX | X1X1XX1 | 1101XX1 |

| | | |
|---|---|---|
| 0XX100XX111X | X11XXXX | 01X1XX1 |
| 0XX100XX111X | X01XXXX | 01X1XX1 |
| XXXXXXXXXXXX | X101XX1 | X1X1XX1 |
| 0XX100XXX1XX | 111XXXX | 011XXXX |
| 0XX100XXX1XX | 101XXXX | 011XXXX |
| 0XXXX0XXXXXX | 110XXXX | 011XXXX |
| 0XXXX0XXXXXX | 1000110 | 00101X0 |

\*\* TG     transition from State 0000110 to State X01XXXX
\*\* TG     transition from State X01XXXX to State X1X1XX1
\*\* TG     transition from State X1X1XX1 to State 0101XX1
\*\* TG     transition from State 0101XX1 to State X111XX1
\*\* TG     transition from State X111XX1 to State 11X1101
At time 12700 number of active faults is 46
At time 15700 number of active faults is 42
At time 17700 number of active faults is 40
At time 20700 number of active faults is 39
At time 22700 number of active faults is 38
At time 32700 number of active faults is 24
\*\* TG End_problem SPOT_FAULTS
At time 37700 number of active faults is 16
At time 40700 number of active faults is 15
\*\* TG ================================
\*\* TG Task PAL repeated
\*\* TG ================================
Dynamic problem inserted:
Name: Spot_Faults; Use_Current_State: NO; Raps: NO; Max_backtracks: 5
Overwriting value of USE_CURRENT_STATE in frame SPOT_FAULTS
Overwriting value of RAPS in frame SPOT_FAULTS
Overwriting value of MAX_BACKTRACKS in frame SPOT_FAULTS
\*\* TG Problem SPOT_FAULTS
\*\* TG        Constraint PIN1 := X;
\*\* TG        Constraint PIN13 := X;
\*\* TG        Working in Combinational Area (Default)
\*\* TG        Trying to catch stuck-at-0 on N6PD
\*\* TG        Trying to catch stuck-at-0 on Z1371
\*\* TG        Trying to catch 2 faults
\*\* TG            Using state-machine knowledge
\*\* TG              To    change PAL
\*\* TG              From  1101101
\*\* TG              To    X1XX01X
Trying to move from state 1101101 to X1XX01X
Searching state machine PAL
Search failed
Trying to resolve problem
\*\* TG End_problem SPOT_FAULTS
\*\* TG Problem SPOT_FAULTS
\*\* TG        Constraint PIN1 := X;
\*\* TG        Constraint PIN13 := X;

| | |
|---|---|
| ** TG | Working in Combinational Area (Default) |
| ** TG | Trying to catch stuck-at-1 on N6PD |
| ** TG | Trying to catch stuck-at-1 on Z1371 |
| ** TG | Trying to catch 2 faults |
| ** TG | Using state-machine knowledge |
| ** TG | To    change PAL |
| ** TG | From  1101101 |
| ** TG | To    X1XX00X |

Trying to move from state 1101101 to X1XX00X
Searching state machine PAL

| Input Wires | Old State | New State |
|---|---|---|
| PPPPPPPPPPPP | ZZZZZZZ | ZZZZZZZ |
| IIIIIIIIII | 1111111 | 1911111 |
| NNNNNNNNNNNN | 3333333 | 1701000 |
| 111987654321 | 2345678 | 1299778 |
| 310 | 2111111 | 2 11212 |
| | | |
| XXX1XXX0XXXX | 0101101 | X101001 |

** TG       transition from State 1101101 to State X1XX00X
At time 45700 number of active faults is 13
** TG End_problem SPOT_FAULTS
** TG =====================================
** TG Task PAL repeated
** TG =====================================
Dynamic problem inserted:
Name: Spot_Faults; Use_Current_State: NO; Raps: NO; Max_backtracks: 5
Overwriting value of USE_CURRENT_STATE in frame SPOT_FAULTS
Overwriting value of RAPS in frame SPOT_FAULTS
Overwriting value of MAX_BACKTRACKS in frame SPOT_FAULTS
** TG Problem SPOT_FAULTS

| | |
|---|---|
| ** TG | Constraint PIN1 := X; |
| ** TG | Constraint PIN13 := X; |
| ** TG | Working in Combinational Area (Default) |
| ** TG | Trying to catch stuck-at-0 on Z1081 |
| ** TG | Trying to catch 1 fault |
| ** TG | End_problem SPOT FAULTS |

Failed to reach my fault-limit of 1
** TG =====================================
** TG End_PLD PAL
** TG =====================================
Test Generator: Fault analysis starting:     time: 7.33 secs
Using a value of 50 for Max_backtracks
There are 13 active faults
10 faults left - 3 undetectable faults dropped Fault Analysis Summary:

| | |
|---|---|
| Detectable Faults | 10 |
| Possibly Detectable | 0 |
| Asynchronous Loops | 0 |
| Undetectable Faults | 3 |

Test Generator: Fault analysis ended: took 0.40 secs (total 7.73 secs)
Running PLD PAL with 10 active faults
Exposing fault N6PD stuck-at-0
Exposing fault Z1371 stuck-at-0
Exposing fault Z1081 stuck-at-0
** TG ================================================
** TG PLD PAL
** TG ================================================
Dynamic problem inserted:
Name: Spot_Faults; Use_Current_State: Yes; Raps: YES; Max_backtracks: 5
Overwriting value of USE_CURRENT_STATE in frame SPOT_FAULTS
Overwriting value of RAPS in frame SPOT_FAULTS
Overwriting value of MAX_BACKTRACKS in frame SPOT_FAULTS
** TG Problem SPOT_FAULTS
** TG Constraint PIN1 := X;
** TG Constraint PIN13 := X;
** TG Working in Combinational Area (Default)
** TG Trying to catch stuck-at-0 on N6PD
** TG Trying to catch stuck-at-0 on Z1081
** TG Trying to catch 2 faults
** TG Applying RAPS to combinational area (Default)
** TG End_problem SPOT_FAULTS At time 58700 number of active faults is 8
** TG ================================================
** TG Task PAL repeated
** TG ================================================
Dynamic problem inserted:
Name: Spot_Faults; Use_Current_State: YES; Raps: YES; Max_backtracks: 5
Overwriting value of USE_CURRENT_STATE in frame SPOT_FAULTS
Overwriting value of RAPS in frame SPOT_FAULTS
Overwriting value of MAX_BACKTRACKS in frame SPOT_FAULTS
** TG Problem SPOT_FAULTS
** TG       Constraint PIN1 := X;
** TG       Constraint PIN13 := X;
Spot_faults was specified for problem SPOT_FAULTS but no faults were
found that could be detected in the current state of the circuit.
** TG       NO faults spotted
** TG       Applying RAPS to combinational area (Default)
** TG End_problem SPOT_FAULTS
** TG ================================================
** TG Task PAL repeated
** TG ================================================

Dynamic problem inserted:
Name: Spot_Faults; Use_Current_State: NO; Raps: NO; Max_backtracks: 5
Overwriting value of USE_CURRENT_STATE in frame SPOT_FAULTS
Overwriting value of RAPS in frame SPOT_FAULTS
Overwriting value of MAX BACKTRACKS in frame SPOT FAULTS
** TG Problem SPOT_FAULTS
** TG      Constraint PIN1 := X;
** TG      Constraint PIN13 := X;
** TG      Working in Combinational Area (Default)
** TG      Trying to catch stuck-at-0 on Z1371
** TG      Trying to catch 1 fault
** TG End_problem SPOT_FAULTS
At time 71700 number of active faults is 7
** TG =============================================
** TG Task PAL repeated
** TG =============================================
Dynamic problem inserted:
Name: Spot_Faults; Use_Current_State: NO; Raps: NO; Max_backtracks: 5
Overwriting value of USE_CURRENT_STATE in frame SPOT_FAULTS
Overwriting value of RAPS in frame SPOT_FAULTS
Overwriting value of MAX_BACKTRACKS in frame SPOT_FAULTS
** TG Problem SPOT_FAULTS
** TG      Constraint PIN1 := X;
** TG      Constraint PIN13 := X;
Spot_faults was specified for problem SPOT_FAULTS but no faults were found that could be detected in the current state of the circuit.
** TG      No faults spotted
** TG End_problem SPOT_FAULTS
Failed to reach my fault-limit of 1
** TG =============================================
** TG End PLD PAL
** TG =============================================
Test Generator: Fault analysis starting: time: 8.45 secs
Using a value of 50 for Max_backtracks
There are 7 active faults
7 faults left - 0 undetectable faults dropped Fault Analysis Summary:
Detectable Faults     17
Possibly Detectable    0
Asynchronous Loops    0
Undetectable Faults    3

Test Generator: Fault analysis ended: took 0.35 secs (total 8.80 secs)
Finish simulation: took 4.57 secs (total 8.80 secs)

Simulator finished: took 0.01 secs (total 8.81 secs)
Written Fault Dictionary: took 0.05 secs (total 8.86 secs)

Fault Dictionary Summary:

| fault | all_faults | | | | | simulated_faults | | | | |
|---|---|---|---|---|---|---|---|---|---|---|
| | total | dropd | det'd | pdetd | catas | total | dropd | det'd | pdetd | catas |
| Stuck0 | 78 | 76 | 75 | 1 | 0 | 65 | 64 | 63 | 1 | 0 |
| Stuck1 | 78 | 65 | 63 | 3 | 0 | 46 | 37 | 36 | 2 | 0 |
| All | 156 | 141 | 138 | 4 | 0 | 111 | 101 | 99 | 3 | 0 |
| %'s | | 92.8 | 90.8 | 2.6 | 0.0 | | 93.5 | 91.7 | 2.8 | 0.0 |

%'s are of detectable faults only.

Decompiling waveform produced into eval.tgo
DWL Decompiler
Decompiling knowledge data base to eval.kbo
***** Command 'EXIT' on 'SIMULATOR' page selected Appendix A.12 the .SIM File © Matra Design Semiconductor, Inc. 1989

```
$ Vector interval 200 ns.
$ TABTOARC REV 0.02 conversion for-
$CYCLE1
$NOSPIKE
$ACTIVITY
$LOAD 50    PIN23 PIN22 PIN21 PIN20 PIN19 PIN18 PIN17 PIN16
+           PIN15 PIN14
$
VCC CLK0 100
SPRINT      PIN9 PIN10 PIN11 PIN13 PIN1 PIN2 PIN3 PIN4 PIN5
+           PIN6 PIN7 PIN8
+           PIN14 PIN15 PIN16 PIN17 PIN18 PIN19 PIN20 PIN21
+           PIN22 PIN23
+           Z1192 Z1111 Z1021
$ $POC      PIN9 PIN10 PIN11 PIN13 PIN1 PIN2 PIN3 PIN4
$ +         PIN5 PIN6 PIN7 PIN8
$ +         PIN14 PIN15 PIN16 PIN17 PIN18 PIN19 PIN20
$ +         PIN21 PIN22 PIN23
$ +         Z1192 Z1111 Z1021
SPATTERN    PIN13 PIN11 PIN10 PIN9 PIN8 PIN7 PIN6 PIN5 PIN4 PIN3 PIN2
+           PIN1
        2001    000000000000
        4001    011111011110
        6001    011111011111
        8001    001111011111
       10001    001111011110
       12001    001111011111
       14001    001110011111
       16001    001110011110
       18001    001110011111
       20001    001100011111
       22001    001100011110
       24001    001100011111
       26001    101100011111
       28001    101100011110
       30001    101100011111
       32001    001100011111
       34001    001100011110
       36001    001100011111
       38001    001000001111
       40001    001000001110
       42001    001000001111
       44001    011000001111
       46001    011000001110
       48001    011000001111
       50001    011100001111
       52001    011100001110
       54001    011100001111
```

| | |
|---|---|
| 56001 | 011100001110 |
| 58001 | 011100001111 |
| 60001 | 011100001110 |
| 62001 | 011100001111 |
| 64001 | 111100001111 |
| 66001 | 111111101111 |
| 68001 | 111111101110 |
| 70001 | 111111101111 |
| 72001 | 111111111111 |
| 74001 | 111111111110 |
| 76001 | 111111111111 |
| 78001 | 111111101111 |
| 80001 | 111111101110 |
| 82001 | 111111101111 |
| 84001 | 111111101110 |

$EOP
$TIME 87000 ,2000
$END

Appendix A.13 the .IN File

Matra Design Semiconductor, Inc. 1989

```
$ Hilo2Arcis v1.01  Sept '89
$ Revised Date:  12:57  10/10/1990
$
$ARRAY MD
$VERIFY
$
$***********************************************************************
$ Date          :  Wed Oct 10 12:32:22 PDT 1990
$ Device        :  p22v10
$ Technology    :  md
$ Path          :  /usr/desdisk2/design/bill
$ From Abel(R)  :  eval.abl
$ To  Hilo(R)   :  eval.cct
$***********************************************************************
$ PIN 1     -> clk25_      PIN 2     -> db00
$ PIN 3     -> db01        PIN 4     -> db02
$ PIN 5     -> vsync_      PIN 6     -> sccint_
$ PIN 7     -> hwcyc_      PIN 8     -> ba02
$ PIN 9     -> rd_         PIN 10    -> res
$ PIN 11    -> ate_        PIN 13    -> ba04
$ PIN 14    -> intenb_     PIN 15    -> csdone_
$ PIN 16    -> cycntl_     PIN 17    -> rdcntl_
$ PIN 18    -> rdstat_     PIN 19    -> vihld_
$ PIN 20    -> vi          PIN 21    -> vien
$ PIN 22    -> sien        PIN 23    -> vidon
$***********************************************************************
*GN13PD       BUFINTTL     PIN13 N13PD
*GN11PD       BUFINTTL     PIN11 N11PD
*GN10PD       BUFINTTL     PIN10 N10PD
*GN9PD        BUFINTTL     PIN9 N9PD
*GN8PD        BUFINTTL     PIN8 N8PD
*GN7PD        BUFINTTL     PIN7 N7PD
*GN6PD        BUFINTTL     PIN6 N6PD
*GN5PD        BUFINTTL     PIN5 N5PD
*GN4PD        BUFINTTL     PIN4 N4PD
*GN3PD        BUFINTTL     PIN3 N3PD
*GN2PD        BUFINTTL     PIN2 N2PD
*GZ1271       INVP         Z1301 Z1271
*GZ1281       INVP         Z1301 Z1281
*GZ1291       INVP         Z1301 Z1291
*GZ1301       INVP         N1PD Z1301
*GN1PD        BUFINTTL     PIN1 N1PD
*GZ1311       INVP         Z1401 Z1311
*GZ1011       BO3N4        Z1381 Z1021 PIN21
*GZ1021       NAND2        Z1233 Z1031 Z1021
*GZ1321       DFFRN1       Z1112 Z1291 Z1311 N(0 Z1322
*GZ1001       BO3N4        Z1331 Z1021 PIN22
~GZ951        AOI2W22      Z1331 Z1211 N3PD Z1113 Z951
```

| | | |
|---|---|---|
| *GZ1331 | DFFRN1 | Z972 Z1271 Z1391 Z1331 Z1332 |
| *GZ971 | NANDI3 | N8PD Z1233 Z1112 Z971 Z951 Z972 |
| *GZ1341 | DFFRN1 | Z1091 Z1271 Z1311 Z1341 Z1342 |
| *GZ1091 | ANDI2 | Z1322 Z1112 Z1091 N(1 Z1021 Z1093 |
| *GZ1101 | BO3N4 | Z1342 Z1111 PIN15 |
| *GZ1111 | ORI2 | N7PD N13PD Z1111 Z1112 Z1211 Z1113 |
| *GZ1121 | BO3N4 | Z1032 Z1192 PIN14 |
| *GZ1131 | BO3N4 | Z1021 Z1192 PIN17 |
| *GZ1141 | BO3N4 | Z1322 Z1192 PIN16 |
| *GZ1161 | BO3N4 | Z971 Z1192 PIN18 |
| *GZ1171 | BO3N4 | Z1351 Z1192 PIN23 |
| *GZ1351 | DFFRN1 | Z1191 Z1281 Z1391 Z1351 N(2 |
| *GZ1191 | INV2 | Z1201 Z1191 N11PD Z1192 |
| *GZ1201 | AOI2W22 | Z1351 Z1211 N2PD Z1113 Z1201 |
| *GZ1211 | NAND3 | Z1341 N9PD Z1031 Z1211 |
| *GZ1031 | NORI3 | N13PD N7PD N8PD Z1031 N14MX Z1032 |
| *GN14MX | OAI2W22 | N6PD Z1332 Z1382 Z1362 N14MX |
| *GSZ1361 | DFFRN1 | z1072 Z1291 Z1391 Z1361 Z136Z |
| *GZ1151 | BO3N4 | Z1372 Z1192 PIN19 |
| *GNN19MX | AOI2W21 | N5PD Z1371 Z1021 NN19MX |
| *GZ1371 | DFFRN1 | Z1071 Z1291 Z1311 Z1371 Z1372 |
| *GZ1071 | INV2 | NN19MX Z1071 z1081 Z1072 |
| *GZ1081 | NORI3 | Z1371 Z1093 N5PD z1081 z981 Z1082 |
| *GZ981 | AOI2W22 | Zt381 Z1211 N4PD Zl113 Z981 |
| *GZ1381 | DFFRN1 | Z1082 Z1271 Z1391 Z1381 Z1382 |
| *GZ1391 | IlqVP | Z1401 Z1391 |
| *GZ1401 | INVP | Z1231 Z1401 |
| *GZ1231 | ANDI2 | N10PD N1NPWR Z1231 N(3 N9PD Z1233 |
| *GN1NPWR | POR | VCC N1NPWR |

$INPUT PIN1 PIN10 PIN11 PIN13 PIN2 ?IN3 PIN4 PIN5 PIN6 PIN7 PIN8 PIN9
$OUTPUT PIN14 PIN15 PIN16 PIN17 PIN18 PIN19 PIN20 PIN21 PIN22 PIN23
$
$SEND

Appendix A.14 the .OUT File

Matra Design Semiconductor

ARCIS - timing simulation -
input : EVAL.sim

, Inc. 1989
version SUN 4B.0 Sept 89
Wed Oct 10 13:14:36 1990

--------------------WORST CASE----------------

----VDD =    4.50    ----TEMP =   70.00----

$ Vector interval 200 ns.
$ TABTOARC REV 0.02 conversion for-
$CYCLE1
$NOSPIKE
$ACTIVITY
$LOAD 50    PIN23 PIN22 PIN21 PIN20 PIN19 PIN18 PIN17 PIN16
+           PIN15 PIN14
$
VCC CLK0 100
SPRINT      PIN9 PIN10 PIN11 PIN13 PIN1 PIN2 PIN3 PIN4 PIN5
+           PIN6 PIN7 PIN8
+           PIN14 PIN15 PIN16 PIN17 PIN18 PIN19 PIN20 PIN21
+           PIN22 PIN23
+           Z1192 Z1111 Z1021
$ $POC      PIN9 PIN10 PIN11 PIN13 PIN1 PIN2 PIN3 PIN4
$ +         PIN5 PIN6 PIN7 PIN8
$ +         PIN14 PIN15 PIN16 PIN17 PIN18 PIN19 PIN20
$ +         PIN21 PIN22 PIN23
$ +         Z1192 Z1111 Z1021
SPATTERN    PIN13 PIN11 PIN10 PIN9 PIN8 PIN7 PIN6 PIN5 PIN4 PIN3 PIN2
+           PIN1
       2001     000000000000
       4001     011111011110
       6001     011111011111
       8001     001111011111
      10001     001111011110
      12001     001111011111
      14001     001110011111
      16001     001110011110
      18001     001110011111
      20001     001100011111
      22001     001100011110
      24001     001100011111
      26001     101100011111
      28001     101100011110
      30001     101100011111
      32001     001100011111
      34001     001100011110
      36001     001100011111
      38001     001000001111

| | |
|---|---|
| 40001 | 001000001110 |
| 42001 | 001000001111 |
| 44001 | 011000001111 |
| 46001 | 01t000001110 |
| 48001 | 011000001111 |
| 50001 | 011100001111 |
| 52001 | 011100001110 |
| 54001 | 011100001111 |
| 56001 | 011100001110 |
| 58001 | 011100001111 |
| 60001 | 011100001110 |
| 62001 | 011100001111 |
| 64001 | 111100001111 |
| 66001 | 111111101111 |
| 68001 | 111111101110 |
| 70001 | 111111101111 |
| 72001 | 111111111111 |
| 74001 | 111111111110 |
| 78001 | 111111101111 |
| 80001 | 111111101110 |
| 82001 | r11111101111 |
| 84001 | 111111101110 |

$EOP
$TIME 87000 ,2000
SEND

- Simulation using MD       library.

1
................ PRINT ................

$Listing of selected signal outputs as a function of time

```
          PPPPPPPPPPPPPPPPPPPPPZZZ
          IIIIIIIIIIIIIIIIIIIIIII
          NNNNNNNNNNNNNNNNNNNNNN110
          911112345678111111122229 12
          013   4567890123211
  TIME
     0    000000000000Z1ZZZZ000Z100
  2000    000000000000Z1ZZZZ000Z100
  4000    000000000000Z1ZZZZ000Z100
  6000    111001110111Z1111ZZZ0011
  8000    111011110111Z1111ZZZ0011
 10000    110011111011ZZZZZZZZZ111
 12000    110001111011ZZZZZZZZZ111
 14000    110011111011ZZZZZZZZZ111
 16000    110011111001Z1ZZZZZZZ101
```

| | |
|---|---|
| 18000 | 110001111001Z1ZZZZZZZZ101 |
| 20000 | 110011111001Z1ZZZZZZZZ101 |
| 22000 | 110011111000ZIZZZZZZZZ101 |
| 24000 | 110001111000Z1ZZZZZZZZ101 |
| 26000 | 110011111000ZIZZZZZZZZ101 |
| 28000 | 110111111000ZZZZZZZZZZ111 |
| 30000 | 110101111000ZZZZZZZZZZ111 |
| 32000 | 110111111000ZZZZZZZZZZ111 |
| 34000 | 110011111000Z1ZZZZZZZZ101 |
| 36000 | 110001111000Z1ZZZZZZZZ101 |
| 38000 | 110011111000Z1ZZZZZZZZ101 |
| 40000 | 010011110000Z1ZZZZ000Z100 |
| 42000 | 010001110000ZIZZZZ000Z100 |
| 44000 | 010011110000Z1ZZZZ000Z100 |
| 46000 | 011011100001110110000000 |
| 48000 | 011001100001110110000000 |
| 50000 | 011011100001110110000000 |
| 52000 | 111011100001111111ZZZ0001 |
| 54000 | 111001100001111111ZZZ0001 |
| 56000 | 111011100001111111ZZZ0001 |
| 58000 | 111001100001111111ZZZ0001 |
| 60000 | 111011100001111111ZZZ0001 |
| 62000 | 111001100001111111ZZZ0001 |
| 64000 | 111011100001111111ZZZ0001 |
| 66000 | 111111110001Z1111ZZZ0011 |
| 68000 | 111111101111Z1111ZZZ0011 |
| 70000 | 111101101111Z1111ZZZ0011 |
| 72000 | 111111101111Z1111ZZZ0011 |
| 74000 | 111111111111Z1111ZZZ0011 |
| 76000 | 111101111111Z1111ZZZ0011 |
| 78000 | 111111111111Z1111ZZZ0011 |
| 80000 | 111111101111Z1111ZZZ0011 |
| 82000 | 111101101111Z1111ZZZ0011 |
| 84000 | 111111101111Z1111ZZZ0011 |
| 86000 | 111101101111Z1111ZZZ0011 |

******** TOGGLE STATISTICS *******
** Maximum simulation time =  87000 **

End of simulation time          :   87000
Total number of internal signals :   204
Toggled signals during sequence :   95          ( 46 PERCENT )

Appendix A.15 the .lMS File

Matra Design Semiconductor, Inc. 1989

```
CVT ALL, #TXT
RESTORE_DEFAULTS
units = 1ns
timebase = 100ns
DEFINE ":" = " "

/*      PPPPPPPPPPPPPPPPPPPPPPPPPPPP
/*      IIIIIIIIIIIIIIIIIIIIIIIIIIII
/*      NNNNNNNNNNNNNNNNNNNNNNNNNNNN
/*      12345678911111122211122211112
/*               0134561234561237890
0       :000000000000ZZZZZZZ1Z00ZZZZ0
200     :000000000000ZZZZZZZ1Z00ZZZZ0
400     :000000000000ZZZZZZZ1Z00ZZZZ0
600     :011110111110ZZZZZZZ1Z1ZZ0111Z
800     :111110111110ZZZZZZZ1Z1ZZ0111Z
1000    :111110111100ZZZZZZZZZZZZZZZZ
1200    :011110111100ZZZZZZZZZZZZZZZZ
1400    :111110111100ZZZZZZZZZZZZZZZZ
1600    :111110011100ZZZZZZZ1ZZZZZZZZ
1800    :011110011100ZZZZZZZ1ZZZZZZZZ
2000    :111110011100ZZZZZZZ1ZZZZZZZZ
2200    :111110001100ZZZZZZZ1ZZZZZZZZ
2400    :011110001100ZZZZZZZ1ZZZZZZZZ
2600    :111110001100ZZZZZZZ1ZZZZZZZZ
2800    :111110001101ZZZZZZZZZZZZZZZZ
3000    :011110001101ZZZZZZZZZZZZZZZZ
3200    :111110001101ZZZZZZZZZZZZZZZZ
3400    :111110001100ZZZZZZZ1ZZZZZZZZ
3600    :011110001100ZZZZZZZ1ZZZZZZZZ
3800    :111110001100ZZZZZZZ1ZZZZZZZZ
4000    :111100000100ZZZZZZZ1Z00ZZZZ0
4200    :011100000100ZZZZZZZ1Z00ZZZZ0
4400    :111100000100ZZZZZZZ1Z00ZZZZ0
4600    :111100000110ZZZZZZ11110000110
4800    :011100000110ZZZZZZ11110000110
5000    :111100000110ZZZZZZ11110000110
5200    :111100001110ZZZZZZ111ZZ0111Z
5400    :011100001110ZZZZZZ111ZZ0111Z
5600    :111100001110ZZZZZZ111ZZ0111Z
5800    :011100001110ZZZZZZ111ZZ0111Z
6000    :111100001110ZZZZZZ111ZZ0111Z
6200    :011100001110ZZZZZZ111ZZ0111Z
6400    :111100001110ZZZZZZ111ZZ0111Z
6600    :111100001111ZZZZZZZ1Z1ZZ0111Z
6800    :111101111111ZZZZZZZ1Z1ZZ0111Z
7000    :011101111111ZZZZZZZ1Z1ZZ0111Z
7200    :111101111111ZZZZZZZ1Z1ZZ0111Z
```

```
7400  :111111111111ZZZZZZ1Z1ZZ0111Z
7600  :011111111111ZZZZZZ1Z1ZZ0111Z
7800  :111111111111ZZZZZZ1Z1ZZ0111Z
8000  :111101111111ZZZZZZ1Z1ZZ0111Z
8200  :011101111111ZZZZZZ1Z1ZZ0111Z
8400  :111101111111ZZZZZZ1Z1ZZ0111Z
8600  :011101111111ZZZZZZ1Z1ZZ0111Z
8600  :011101111111ZZZZZZ1Z1ZZ0111Z
CVT END
```

Appendix A. 16 the .NPI File

Matra Design Semiconductor, Inc..1989

EVAL                10/10/1990  12:58
.ARRAY              MD250
.PROBE_CARD         30
.POR                N
.MASK_NO            0Mxx
.IDD_STATIC(ua)     8
.IDD_DYNAMIC(ma)    20
.REVISION           A
.PACKAGE            SD24
.TG_LIST
TG1     10      10
TG2     12      10
TG3
TG4
TH5
TG6
TG7     20      10
TG8
TR      100
.PINLIST

| #Signal #Name ****** | Pad No *** | Pin No *** | Test Pad *** | BUF fun *** | Type Input **** | Type Pin **** | IIL (ua) *** | IIH (ua) *** | IOL (ma) *** | IOH (ma) *** | TG *** | Control Signal ****** |
|---|---|---|---|---|---|---|---|---|---|---|---|---|
| PIN9  | 1  | 9  | 1  | - | TTL | I   | 4.5 | 4.5 | -  | -  | 1 | - |
| PIN10 | 2  | 10 | 2  | - | TTL | I   | 4.5 | 4.5 | -  | -  | 1 | - |
| PIN11 | 3  | 11 | 3  | - | TTL | I   | 4.5 | 4.5 | -  | -  | 1 | - |
| VSS   | 4  | 12 | 4  | - | -   | VSS | -   | -   | -  | -  | - | - |
| VSS   | 5  | 12 | 5  | - | -   | VSS | -   | -   | -  | -  | - | - |
| PIN13 | 6  | 13 | 6  | - | TTL | I   | 4.5 | 4.5 | -  | -  | 1 | - |
| PIN14 | 7  | 14 | 7  | - | -   | O/Z | 4.5 | 4.5 | 24 | 24 | 7 | Z1192 |
| PIN15 | 8  | 15 | 8  | - | -   | O/Z | 4.5 | 4.5 | 24 | 24 | 7 | Z1111 |
| PIN16 | 9  | 16 | 9  | - | -   | O/Z | 4.5 | 4.5 | 24 | 24 | 7 | Z1192 |
| PIN17 | 10 | 17 | 10 | - | -   | O/Z | 4.5 | 4.5 | 24 | 24 | 7 | Z1192 |
| PIN18 | 11 | 18 | 11 | - | -   | O/Z | 4.5 | 4.5 | 24 | 24 | 7 | Z1192 |
| PIN19 | 15 | 19 | 15 | - | -   | O/Z | 4.5 | 4.5 | 24 | 24 | 7 | Z1192 |
| PIN20 | 16 | 20 | 16 | - | -   | O/Z | 4.5 | 4.5 | 24 | 24 | 7 | Z1021 |
| PIN21 | 17 | 21 | 17 | - | -   | O/Z | 4.5 | 4.5 | 24 | 24 | 7 | Z1021 |
| PIN22 | 18 | 22 | 18 | - | -   | O/Z | 4.5 | 4.5 | 24 | 24 | 7 | A1021 |
| PIN23 | 19 | 23 | 19 | - | -   | O/Z | 4.5 | 4.5 | 24 | 24 | 7 | Z1192 |
| VDD   | 20 | 24 | 20 | - | -   | VDD | -   | -   | -  | -  | - | - |
| VDD   | 21 | 24 | 21 | - | -   | VDD | -   | -   | -  | -  | - | - |
| PIN1  | 22 | 1  | 22 | - | TTL | I   | 4.5 | 4.5 | -  | -  | 2 | - |
| PIN2  | 23 | 2  | 23 | - | TTL | I   | 4.5 | 4.5 | -  | -  | 1 | - |
| PIN3  | 24 | 3  | 24 | - | TTL | I   | 4.5 | 4.5 | -  | -  | 1 | - |
| PIN4  | 25 | 4  | 25 | - | TTL | I   | 4.5 | 4.5 | -  | -  | 1 | - |
| PIN5  | 26 | 5  | 26 | - | TTL | I   | 4.5 | 4.5 | -  | -  | 1 | - |
| PIN6  | 27 | 6  | 27 | - | TTL | I   | 4.5 | 4.5 | -  | -  | 1 | - |
| PIN7  | 30 | 7  | 30 | - | TTL | I   | 4.5 | 4.5 | -  | -  | 1 | - |

| | | | | | | | | | | | |
|---|---|---|---|---|---|---|---|---|---|---|---|
| PIN8  | 31 | 8 | 31 | - | TTL | I | 4.5 | 4.5 | - | 1 | - |
| Z1192 | 0  | 0 | 0  | - | -   | C | -   | -   | - | - | - |
| Z1111 | 0  | 0 | 0  | - | -   | C | -   | -   | - | - | - |
| Z1021 | 0  | 0 | 0  | - | -   | C | -   | -   | - | - | - |

Appendix A.17 the .PAD File
Matra Design Semiconductor, Inc. 1989

| | |
|---|---|
| 1 | PIN9 |
| 2 | PIN10 |
| 3 | PIN11 |
| 4 | VSS |
| 5 | VSS |
| 6 | PIN13 |
| 7 | PIN14 |
| 8 | PIN15 |
| 9 | PIN16 |
| 10 | PIN17 |
| 11 | PIN18 |
| 15 | PIN19 |
| 16 | PIN20 |
| 17 | PIN21 |
| 18 | PIN22 |
| 19 | PIN23 |
| 20 | VDD |
| 21 | VDD |
| 22 | PIN1 |
| 23 | PIN2 |
| 24 | PIN3 |
| 25 | PIN4 |
| 26 | PIN5 |
| 27 | PIN6 |
| 30 | PIN7 |
| 31 | PIN8 |

Appendix A.18 the MD.PAD File

© Matra Design Semiconductor, Inc. 1989

```
.MASK_NO              0Mxx
.IDD_STATIC (ua)      8
.IDD_DYNAMIC (ma)     20
.REVISION             A
.PACKAGE              xxxx
.TG LIST
TG1         10    10
TG2         12    10    {This is 10 + (In→Out - Clk→Out), with a width of 10}
TG3
TG4
TG5
TG6
TG7         20    10    {This is 10 + (In→Out spec), with a width of 10}
TG8
TR          100
.PIN_LIST
```

| #Signal<br>#Name<br>#\*\*\*\*\*\* | Pad<br>No<br>\*\*\* | Pin<br>No<br>\*\*\* | Test<br>Pad<br>\*\*\* | BUF<br>fun<br>\*\*\* | Type<br>Input<br>\*\*\*\* | Type<br>Pin<br>\*\*\*\* | IIL<br>(ua)<br>\*\*\* | IIH<br>(ua)<br>\*\*\* | IOL<br>(ma)<br>\*\*\* | IOH<br>(ma)<br>\*\*\* | TG<br>\*\*\* | Control<br>Signal<br>\*\*\*\*\*\* |
|---|---|---|---|---|---|---|---|---|---|---|---|---|
| $ | | | | | | | | | | | | |
| $ | | | | | | | | | | | | |
| $component<br>$name<br>$\*\*\*\*\*\*\*\*\*\*\* | | | | BUF<br>fun<br>\*\*\* | Type<br>input<br>\*\*\*\* | Type<br>Pin<br>\*\*\* | IIL<br>(ua)<br>\*\*\* | IIH<br>(ua)<br>\*\*\* | IOL<br>(ma)<br>\*\*\* | IOH<br>(ma)<br>\*\*\* | TG<br>\*\*\* | |
| $ | | | | | | | | | | | | |
| BUFINDDN | | | | PD | - | I | 4.5 | 9 | - | - | 1 | |
| BUFINDUP | | | | PU | - | I | 9 | 4.5 | - | - | 1 | |
| BUFINDIR | | | | - | - | I | 4.5 | 4.5 | - | - | 1 | |
| BUF3STA | | | | - | - | O/Z | 4.5 | 4.5 | 6 | 6 | 7 | |
| BO3N2 | | | | - | - | O/Z | 4.5 | 4.5 | 12 | 12 | 7 | |
| BO3N3 | | | | - | - | O/Z | 4.5 | 4.5 | 18 | 18 | 7 | |
| BO3N4 | | | | - | - | O/Z | 4.5 | 4.5 | 24 | 24 | 7 | |
| BUFINTTL | | | | - | TTL | I | 4.5 | 4.5 | - | - | 1 | |
| BUFINTDN | | | | PD | TTL | I | 4.5 | 9 | - | - | 1 | |
| BUFINTUP | | | | PU | TTL | I | 9 | 4.5 | - | - | 1 | |
| BUFIONT | | | | ON | TTL | I/O | 9 | 9 | 6 | 6 | 1/7 | |
| BIONTN2 | | | | ON | TTL | I/O | 9 | 9 | 12 | 12 | 1/7 | |
| BIONTN3 | | | | ON | TTL | I/O | 9 | 9 | 18 | 18 | 1/7 | |
| BIONTN4 | | | | ON | TTL | I/O | 9 | 9 | 24 | 24 | 1/7 | |
| BUFIOTTL | | | | - | TTL | I/O | 9 | 9 | 6 | 6 | 1/7 | |
| BIOTN2 | | | | - | TTL | I/O | 9 | 9 | 12 | 12 | 1/7 | |
| BIOTN3 | | | | - | TTL | I/O | 9 | 9 | 18 | 18 | 1/7 | |
| BIOTN4 | | | | - | TTL | I/O | 9 | 9 | 24 | 24 | 1/7 | |
| BUFOUT | | | | - | - | O | - | - | 6 | 6 | 7 | |
| BON2 | | | | - | - | O | - | - | 12 | 12 | 7 | |
| BON3 | | | | - | - | O | - | - | 18 | 18 | 7 | |
| BON4 | | | | - | - | O | - | - | 24 | 24 | 7 | |
| BUFINCUP | | | | PU | - | I | 9 | 4.5 | - | - | 1 | |

| | | | | | | | | |
|---|---|---|---|---|---|---|---|---|
| BUFINCDN | PD | - | I | 4.5 | 9 | - | - | 1 |
| BUFINMOS | - | - | I | 4.5 | 4.5 | - | - | 1 |
| BUFIOTUP | PU | TTL | I/O | 9 | 9 | 6 | 6 | 1/7 |
| BIOTUPN2 | PU | TTL | I/O | 9 | 9 | 12 | 12 | 1/7 |
| BIOTUPN3 | PU | TTL | I/O | 9 | 9 | 18 | 18 | 1/7 |
| BIOTUPN4 | PU | TTL | I/O | 9 | 9 | 24 | 24 | 1/7 |
| BUFPOR | - | - | O | | | | | 7 |
| BUFIOCUP | PU | - | I/O | 9 | 9 | 6 | 6 | 1/7 |
| BIOCUPN2 | PU | - | I/O | 9 | 9 | 12 | 12 | 1/7 |
| BI0CUPN3 | PU | - | I/O | 9 | 9 | 18 | 18 | 1/7 |
| BIOCUPN4 | PU | - | I/O | 9 | 9 | 24 | 24 | 1/7 |
| BUFIODIR | - | - | I/O | 4.5 | 4.5 | 6 | 6 | 1/7 |
| BIODN2 | PD | - | I/O | 9 | 9 | 12 | 12 | 1/7 |
| BIODN3 | PD | - | I/O | 9 | 9 | 18 | 18 | 1/7 |
| BIODN4 | PD | - | I/O | 9 | 9 | 24 | 24 | 1/7 |
| BUFIODUP | PU | - | I/O | 9 | 9 | 6 | 6 | 1/7 |
| BIODUPN2 | PU | - | I/O | 9 | 9 | 12 | 12 | 1/7 |
| BIODUPN3 | PU | - | I/O | 9 | 9 | 18 | 18 | 1/7 |
| BIODUPN4 | PU | - | I/O | 9 | 9 | 24 | 24 | 1/7 |
| BUFIOMOS | - | - | I/O | 9 | 9 | 6 | 6 | 1/7 |
| BIOMN2 | - | - | I/O | 9 | 9 | 12 | 12 | 1/7 |
| BIOMN3 | - | - | I/O | 9 | 9 | 18 | 18 | 1/7 |
| BIOMN4 | - | - | I/O | 9 | 9 | 24 | 24 | 1/7 |
| BUFIONC | ON | - | I/O | 9 | 9 | 6 | 6 | 1/7 |
| BIONCN2 | ON | - | I/O | 9 | 9 | 12 | 12 | 1/7 |
| BIONCN3 | ON | - | I/O | 9 | 9 | 18 | 18 | 1/7 |
| BIONCN4 | ON | - | I/O | 9 | 9 | 24 | 24 | 1/7 |
| BUFIOND | ON | - | I/O | 9 | 9 | 6 | 6 | 1/7 |
| BIONDN2 | ON | - | I/O | 9 | 9 | 12 | 12 | 1/7 |
| BIONDN3 | ON | - | I/O | 9 | 9 | 18 | 18 | 1/7 |
| BIONDN4 | ON | - | I/O | 9 | 9 | 24 | 24 | 1/7 |
| BUFOUTN | ON | - | O | - | - | 6 | 6 | 7 |
| BONN2 | ON | - | O | - | - | 12 | 12 | 7 |
| BONN3 | ON | - | O | - | - | 18 | 18 | 7 |
| BONN4 | ON | - | O | - | - | 24 | 24 | 7 |
| BIT | - | TTL | I | 4.5 | 4.5 | - | - | 1 |
| BOC24 | - | - | O | - | - | 24 | 24 | 7 |

Appendix A.19 the .SET File

©Matra Design Semiconductor, Inc. 1989

Rem ID Logic Master HS V2.1a    Options: Standard
Rem IMS BOARD = 20R
Init
SRQ 7
FAST verify disable, sample disable
Clk Internal,l00ns
Event 0=Off, Off
Event l=User-1.Off
Event 2=BeginTest,Off
Event 3=Error, On
Config 1,"STM         16/ 8K     Force","PGM","PGM:1A","PGM:1C"
Config 2,"STM         16/ 8K     Force","PGM","PGM:ID","PGM:1F"
Config 3,"STM         16/ 8K     Force","PGM","PGM:1I","PGM:1J"
Config 4,"STM         16/ 8K     Force","PGM","PGM:1G","PGM:1L"
Config 5,"STM         16/ 8K     Compare (Expect)"
Config 6,"ACQ         16/ 8K     Compare (Acquire) ","INP","PGM:1B","PGM:1B"
Config 7,"STM         16/ 8K     Compare (Expect)"
Config 8,"ACQ         16/ 8K     Compare (Acquire)","INP","PGM:1E","PGM:1E"
Config 9,"STM         16/ 8K     Compare (Expect)"
Config 10,"ACQ        16/ 8K     Compare (Acquire)","INP","PGM:1H","PGM:1H"
Config 11,"STM        16/ 8K     Compare (Expect)"
  Config 12,"ACQ      16/ 8K     Compare (Acquire)","INP","PGM","PGM"
Resource ingroup1=Force #TXT
1 A7 PIN1 1
1 A6 PIN2 2
1 A5 PIN3 3
1 A4 PIN4 4
1 A3 PIN5 5
1 A2 PIN6 6
1 A1 PIN7 7
1 A0 PIN8 8
Resource End
Radix ingroup1=Bin
Polarity ingroup1=Pos
Hidrive ingroup1=5.00V
Lodrive ingroup1=0V
Format ingroup1=NRZ
Resource ingroup2=Force #TXT
1 B7 PIN9 9
1 B6 PIN10 10
1 B5 PIN11 11
1 B4 PIN13 13
Resource End
Radix ingroup2=Bin
Polarity ingroup2=Pos
Hidrive ingroup2=5.00V
Lodrive ingroup2=0V
Format ingroup2=NRZ

```
Resource ingroup3=Force #TXT
2 /3 PIN14 14
Resource End
Radix ingroup3=Bin
Polarity ingroup3=Pos
Hidrive ingroup3=5.00V
Lodrive ingroup3=0V
Format ingroup3=NRZ
Resource ingroup4=Force #TXT
2 B3 PIN15 15
Resource End
Radix ingroup4=Bin
Polarity ingroup4=Pos
Hidrive ingroup4=5.00V
Lodrive ingroup4=0V
Format ingroup4=NRZ
Resource ingroup5=Force #TXT
3 A3 PIN16 16
Resource End
Radix ingroup5=Bin
Polarity zngroup5=Pos
Hidrive ingroup5=5.00V
Lodrive ingroup5=0V
Format ingroup5=NRZ
Resource ingroup6=Force #TXT
3 B3 PIN21 21
Resource End
Radix ingroup6=Bin
Polarity zngroup6=Pos
Hidrive ingroup6=5.00V
Lodrive ingroup6=0V
Format ingroup6=NRZ
Resource ingroup7=Force #TXT
4 A3 PIN22 22
Resource End
Radix ingroup7=Bin
Polarity ingroup7=Pos
Hidrive ingroup7=5.00V
Lodrive ingroup7=0V
Format ingroup7=NRZ
Resource Ingroup8=Force #TXT
4 B3 PIN23 23
Resource End
Radix ingroup8=Bin
Polarity Ingroup8=Pos
Hidrive ingroup8=5.00V
Lodrive ingroup8=0V
Format ingroup8=NRZ
```

```
Resource outgroup8=Compare #TXT
6 A3 PIN14 14
Resource End
Radix outgroup1=Bin
Polarity outgroup1=Pos
Threshold outgroup1=1.50V
Sample outgroup1=35.00ns
Resource outgroup2=Compare #TXT
6 B3 PIN15 15
Resource End
Radix outgroup2=Bin
Polarity outgroup2=Pos
Threshold outgroup2=1.50V
Sample outgroup2=35.00ns
Resource outgroup3=Compare #TXT
8 A3 PIN16 16
Resource End
Radix outgroup3=Bin
Polarity outgroup3=Pos
Threshold outgroup3=1.50V
Sample outgroup3=35.00ns
Resource outgroup4=Compare #TXT
8 B3 PIN21 21
Resource End
Radix outgroup4=Bin
Polarity outgroup4=Pos
Threshold outgroup4=1.50V
Sample outgroup4=35.00ns
Resource outgroup5=Compare #TXT
10 A3 PIN22 22
Resource End
Radix outgroup5=Bin
Polarity outgroup5=Pos
Threshold outgroup5=1.50V
Sample outgroup5=35.00ns
Resource outgroup6=Compare #TXT
10 B3 PIN23 23
Resource End
Radix outgroup6=Bin
Polarity outgroup6=Pos
Threshold outgroup6=1.50V
Sample outgroup6=35.00ns
Resource outgroup7=Compare #TXT
12 A3 PIN17 17
12 A2 PIN18 18
12 A1 PIN19 19
12 A0 PIN20 20
Resource End
```

```
Radix outgroup7=Bin
Polarity outgroup7=Pos
Threshold outgroup7=1.50V
Sample outgroup7=35.00ns
Resource veedeedee=Power #TXT
1 V0 vdd 24
Resource End
Power veedeedee=5.00V, 250mA, 0s,HIZ
Aclk System
Fail 0
Mask "1 1 1 1 1 1 1111 "
End
```

Appendix A.20 the .SDL File

© Matra Design Semiconductor, Inc. 1989

```
USER: "MATRA_DESIGN";
NAME: SDL;
PURPOSE: SL2000_LAYOUT;
LEVEL: CIRCUIT;
TYPES: NAND2,NANDI3,NAND3,NORI3,ANDI2,ORI2,INV1,INTV2,INVP,AOI2W22,
    AOI2W21,OAI2W22,TGATE,DFFRN1,BUFINTTL,BO3N4,
    VDD,GND,CHIP;

NAND2      :GZ1021;
NANDI3     :GZ971;
NAND3      :GZ1211;
NORI3      :GZ1031, GZ1081;
ANDI2      :GZ1091, GZ1231;
ORI2       :GZ1111;
INV1       :POR1, POR9;
iNV2       :GZ1191, GZ1071;
INVP       :GZ1271, GZ1281, GZ1291, GZ1301, GZ1311, GZ1391, GZ1401;
AOI2W22    :GZ951, GZ1201, GZ981;
AOI2W21    :GNN19MX;
OAI2W22    :GN14MX;
TGATE      :PORIN, POR2, POR3, POR4, POR5, POR6, POR71 POR8, POR11,
            POR12, POR13, POR14, POR15, POR16, POR17, POR18, POR19,
            POR20, POR21, POR22, POR23, POR24, POR25, POR26, POR27,
            POR28, POR29, POR30, POR31, POR32, POR33, POR34;
DFFRN1     :GZ1321, GZ1331, GZ1341, GZ1351, GZ1361, GZ1371, GZ1381;
BUFINTTL   :GN13PD, GNIIPD, GN10PD, GN9PDr GN8PD, GN7PD, GN6PD,
            GN5PD, GN4PD, GN3PD, GN2PD, GN1PD;
BO3N4      :GZ1011, GZ1001, GZ1101, GZ1121, GZ1131, GZ1141, GZ1161,
            GZ1171, GZ1041, GZ1151;
CHIP       :CHIP1;
VDD        :
            VDD1,
            VDD2;
GND        :
            GND1,
            GND2;
END;

COMPSEGMENT;

CHIP1      =VDDPIN*VDD,GNDPIN*GND;
VDD1 = VDDPIN*VDDNUL1;
VDD2 = VDDPIN*VDDNUL2;
GND1 = GNDPIN*GNDNUL1;
GND2 = GNDPIN*GNDNUL2;
POR1           =A*VDD,AN*PORS;
GN13PD         =OUT*N13PD;
GN11PD         =OUT*N11PD;
```

```
GN10PD      =OUT*N10PD;
GN9PD       =OUT*N9PD;
GN8PD       =OUT*N8PD;
GN7PD       =OUT*N7PD;
GN6PD       =OUT*N6PD;
GN5PD       =OUT*N5PD;
GN4PD       =OUT*N4PD;
GN3PD       =OUT*N3PD;
GN2PD       =OUT*N2PD;
GZ1271      =IN*Z1301,INN*Z1271;
GZ1281      =IN*Z1301,INN*Z1281;
GZ1291      =IN*Z1301,INN*Z1291;
GZ1301      =IN*N1PD,INN*Z1301;
GN1PD       =OUT*N1PD;
GZ1311      =IN*Z1401,INN*Z1311;
GZ1011      =IN*Z1381,ENA*Z1021;
GZ1021      =A*Z1233,B*Z1031,NAN*Z1021;
GZ1321      =D*Z1112,CK*Z1291,RN*Z1311,QN*Z1322;
GZ1001      =IN*Z1331,ENA*Z1021;
GZ951       =A*Z1331,B*Z1211,C*N3PD,D*Z1113,OUT*Z951;
GZ1331      =D*Z972,CK*Z1271,RN*Z1391,Q*Z1331,QN*Z1332;
GZ971       =A*N8PD,B*Z1233,C*Z1112,NAN*Z971,E*Z951,EN*Z972;
GZ1341      =D*Z1091,CK*Z1271,RN*Z1311,Q*Z1341,QN*Z1342;
GZ1091      =A*Z1322,B*Z1112,AND*Z1091,E*Z1021,EN*Z1093;
GZ1101      =IN*Z1342,ENA*Z1111;
GZ1111      =A*N7PD,B*N13PD,OR*Z1111,NOR*Z1112,E*Z1211,EN*Z1113;
GZ1121      =IN*Z1032,ENA*Z1192;
GZ1131      =IN*Z1021,ENA*Z1192;
GZ1141      =IN*Z1322,ENA*Z1192;
GZ1161      =IN*Z971,ENA*Z1192;
GZ1171      =IN*Z1351,ENA*Z1192;
GZ1351      =D*Z1191,CK*Z1281,RN*Z1391,Q*Z1351;
GZ1191      =A*Z1201,AN*Z1191,B*N11PD,BN*Z1192;
GZ1201      =A*Z1351,B*Z1211,C*N2PD,D*Z1113,OUT*Z1201;
GZ1211      =A*Z1341,B*N9PD,C*Z1031,NAN*Z1211;
GZ1031      =A*N13PD,B*N7PD,C*N8PD,NOR*Z1031,E*N14MX,EN*Z1032;
GN14MX      =A*N6PD,B*Z1332,C*Z1382,D*Z1362,OUT*N14MX;
GZ1041      =IN*Z1361,ENA*Z1021;
GZ1361      =D*Z1072,CK*Z1291,RN*Z1391,Q*Z1361,QN*Z1362;
GZ1151      =IN*Z1372,ENA*Z1192;
GNN19MX     =A*N5PD,B*Z1371,C*Z1021,OUT*NN19MX;
GZ1371      =D*Z1071,CK*Z1291,RN*Z1311,Q*Z1371,QN*Z1372;
GZ1071      =A*NN19MX,AN*Z1071,B*Z1081,BN*Z1072;
GZ1081      =A*Z1371,B*Z1093,C*N5PD,NOR*Z1081,E*Z981,EN*Z1082;
GZ981       =A*Z1381,B*Z1211,C*N4PD,D*Z1113,OUT*Z981;
GZ1381      =D*Z1082,CK*Z1271,RN*Z1391,Q*Z1381,QN*Z1382;
GZ1391      =IN*Z1401,INN*Z1391;
GZ1401      =IN*Z1231,INN*Z1401;
```

```
GZ1231        =A*N10PD,B*N1NPWR,AND*Z1231,E*N9PD,EN*Z1233;
POR9          =A*ZPORNOD2,AN*N1NPWR;
POR1N         =IN*ZPORNOD1,E*VDD,EN*VDD,OUT*VDD;
POR2          =IN*ZPORNODCAP,E*ZPORNOD1,EN*VDD,OUT*ZPORNOD1;
POR3          =IN*ZPORNOD2,E*GND,EN*ZPORNODCAP,OUT*VDD;
POR4          =IN*ZPORNOD3,E*ZPORNODCAP,EN*VDD,OUT*ZPORNOD2;
POR5          =IN*GND,E*ZPORNODCAP,EN*VDD,OUT*ZPORNOD3;
POR6          =IN*ZPORNOD4,E*ZPORNOD2,EN*VDD,OUT*ZPORNOD3;
POR7          =IN*VDD,E*ZPORNOD2,EN*VDD,OUT*ZPORNOD4;
POR8          =IN*GND,E*GND,EN*VDD,OUT*ZPORNODCAP
POR11         =IN*GND,E*ZPORNODCAP,EN*GND,OUT*GND,
POR12         =IN*GND,E*ZPORNODCAP,EN*GND,OUT*GND,
POR13         =IN*GND,E*ZPORNODCAP,EN*GND,OUT*GND,
POR14         =IN*GND,E*ZPORNODCAP,EN*GND,OUT*GND,
POR15         =IN*GND,E*ZPORNODCAP,EN*GND,OUT*GND,
POR16         =IN*GND,E*ZPORNODCAP,EN*GND,OUT*GND,
POR17         =IN*GND,E*ZPORNODCAP,EN*GND,OUT*GND,
POR18         =IN*GND,E*ZPORNODCAP,EN*GND,OUT*GND,
POR19         =IN*GND,E*ZPORNODCAP,EN*GND,OUT*GND,
POR20         =IN*GND,E*ZPORNODCAP,EN*GND,OUT*GND,
POR21         =IN*GND,E*ZPORNODCAP,EN*GND,OUT*GND,
POR22         =IN*GND,E*ZPORNODCAP,EN*GND,OUT*GND,
POR23         =IN*GND,E*ZPORNODCAP,EN*GND,OUT*GND,
POR24         =IN*GND,E*ZPORNODCAP,EN*GND,OUT*GND,
POR25         =IN*GND,E*ZPORNODCAP,EN*GND,OUT*GND,
POR26         =IN*GND,E*ZPORNODCAP,EN*GND,OUT*GND,
POR27         =IN*GND,E*ZPORNODCAP,EN*GND,OUT*GND,
POR28         =IN*GND,E*ZPORNODCAP,EN*GND,OUT*GND,
POR29         =IN*GND,E*ZPORNODCAP,EN*GND,OUT*GND,
POR30         =IN*GND,E*ZPORNODCAP,EN*GND,OUT*GND,
POR31         =IN*GND,E*ZPORNODCAP,EN*GND,OUT*GND,
POR32         =IN*GND,E*ZPORNODCAP,EN*GND,OUT*GND,
POR33         =IN*GND,E*ZPORNODCAP,EN*GND,OUT*GND,
POR34         =IN*GND,E*ZPORNODCAP,EN*GND,OUT*GND
ENDC;
END_OF_FILE;
```

Appendix A.21 the .DLY File

© Matra Design Semiconductor, Inc. 1989

| | | | | | | | |
|---|---|---|---|---|---|---|---|
| *LOAD | N10PD | | | | | 156 | fF |
| *DELAY | N10PD | GN10PD | OUT | GZ1231 | A | 20 | PS |
| *LOAD | N11PD | | | | | 192 | fF |
| *DELAY | N11PD | GN11PD | OUT | GZ1191 | B | 54 | PS |
| *LOAD | N13PD | | | | | 295 | fF |
| *DELAY | N13PD | GN13PD | OUT | GZ1031 | A | 29 | PS |
| *DELAY | N13PD | GN13PD | OUT | GZ1111 | B | 29 | PS |
| *LOAD | N14MX | | | | | 199 | fF |
| *DELAY | N14MX | GN14MX | OUT | GZ1031 | E | 55 | PS |
| *LOAD | N1NPWR | | | | | 157 | fF |
| *DELAY | N1NPWR | POR9 | AN | GZ1231 | B | 6 | PS |
| *LOAD | N1PD | | | | | 184 | fF |
| *DELAY | N1PD | GN1PD | OUT | GZ1301 | IN | 59 | PS |
| *LOAD | N2PD | | | | | 218 | fF |
| *DELAY | N2PD | GN2PD | OUT | GZ1201 | C | 65 | PS |
| *LOAD | N3PD | | | | | 232 | fF |
| *DELAY | N3PD | GN3PD | OUT | GZ951 | C | 71 | PS |
| *LOAD | N4PD | | | | | 294 | fF |
| *DELAY | N4PD | GN4PD | OUT | GZ981 | C | 266 | PS |
| *LOAD | N5PD | | | | | 344 | fF |
| *DELAY | N5PD | GN5PD | OUT | GZ1081 | C | 345 | PS |
| *DELAY | N5PD | GN5PD | OUT | GNN19MX | A | 352 | PS |
| *LOAD | N6PD | | | | | 257 | fF |
| *DELAY | N6PD | GN6PD | OUT | GN14MX | A | 101 | PS |
| *LOAD | N7PD | | | | | 349 | fF |
| *DELAY | N7PD | GN7PD | OUT | GZ1031 | B | 37 | PS |
| *DELAY | N7PD | GN7PD | OUT | GZ1111 | A | 37 | PS |
| *LOAD | N8PD | | | | | 320 | fF |
| *DELAY | N8PD | GN8PD | OUT | GZ1031 | C | 82 | PS |
| *DELAY | N8PD | GN8PD | OUT | GZ971 | A | 82 | PS |
| *LOAD | N9PD | | | | | 298 | fF |
| *DELAY | N9PD | GN9PD | OUT | GZ1231 | E | 41 | PS |
| *DELAY | N9PD | GN9PD | OUT | GZ1211 | B | 39 | PS |
| *LOAD | NN19MX | | | | | 126 | fF |
| *DELAY | NN19MX | GNN19MX | OUT | GZ1071 | A | 7 | PS |
| *LOAD | Z1021 | | | | | 881 | fF |
| *DELAY | Z1021 | GZ1021 | NAN | GZ1011 | ENA | 571 | PS |
| *DELAY | Z1021 | GZ1021 | NAN | GZ1001 | ENA | 563 | PS |
| *DELAY | Z1021 | GZ1021 | NAN | GZ1131 | IN | 281 | PS |
| *DELAY | Z1021 | GZ1021 | NAN | GZ1041 | ENA | 654 | PS |
| *DELAY | Z1021 | GZ1021 | NAN | GNN19MX | C | 174 | PS |
| *DELAY | Z1021 | GZ1021 | NAN | GZ1091 | E | 211 | PS |
| *LOAD | Z1031 | | | | | 198 | fF |
| *DELAY | Z1031 | GZ1031 | NOR | GZ1211 | C | 0 | PS |
| *DELAY | Z1031 | GZ1031 | NOR | GZ1021 | B | 0 | PS |
| *LOAD | Z1032 | | | | | 199 | fF |
| *DELAY | Z1032 | GZ1031 | EN | GZ1121 | IN | 38 | PS |
| *LOAD | Z1071 | | | | | 34 | fF |

| | | | | | | |
|---|---|---|---|---|---|---|
| *DELAY | Z1071 | GZ1071 AN | GZ1371 | D | 0 | PS |
| *LOAD | Z1072 | | | | 75 | fF |
| *DELAY | Z1072 | GZ1071 BN | GZ1361 | D | 6 | PS |
| *LOAD | Z1081 | | | | 147 | fF |
| *DELAY | Z1081 | GZ1081 NOR | GZ1071 | B | 0 | PS |
| *LOAD | Z1082 | | | | 109 | fF |
| *DELAY | Z1082 | GZ1081 EN | GZ1381 | D | 6 | PS |
| *LOAD | Z1091 | | | | 107 | fF |
| *DELAY | Z1091 | GZ1091 AND | GZ1341 | D | 7 | PS |
| *LOAD | Z1093 | | | | 185 | fF |
| *DELAY | Z1093 | GZ1091 EN | GZ1081 | B | 27 | PS |
| *LOAD | Z1111 | | | | 196 | fF |
| *DELAY | Z1111 | GZ1111 OR | GZ1101 | ENA | 34 | PS |
| LOAD | Z1112 | | | | 308 | fF |
| *DELAY | Z1112 | GZ1111 NOR | GZ1321 | D | 9 | PS |
| *DELAY | Z1112 | GZ1111 NOR | GZ1091 | B | 12 | PS |
| *DELAY | Z1112 | GZ1111 NOR | GZ971 | C | 5 | PS |
| *LOAD | Z1113 | | | | 361 | fF |
| *DELAY | Z1113 | GZ1111 EN | GZ981 | D | 98 | PS |
| *DELAY | Z1113 | GZ1111 EN | GZ1201 | D | 98 | PS |
| *DELAY | Z1113 | GZ1111 | GZ951 | | 98 | PS |
| *LOAD | Z1191 | | | | 105 | fF |
| *DELAY | Z1191 | GZ1191 AN | GZ1351 | D | 8 | PS |
| *LOAD | Z1192 | | | | 637 | fF |
| *DELAY | Z1192 | GZ1191 BN | GZ1171 | ENA | 760 | PS |
| *DELAY | Z1192 | GZ1191 BN | GZ1121 | ENA | 1080 | PS |
| *DELAY | Z1192 | GZ119t BN | GZ1141 | ENA | 1172 | PS |
| *DELAY | Z1192 | GZ1191 BN | GZ1131 | ENA | 1105 | PS |
| *DELAY | Z1192 | GZ1191 BN | GZ1161 | ENA | 1077 | PS |
| *DELAY | Z1192 | GZli91 BN | GZ1151 | ENA | 793 | PS |
| *LOAD | Z1201 | | | | 164 | fF |
| *DELAY | Z1201 | GZ1201 OUT | GZ1191 | A | 23 | PS |
| *LOAD | Z1211 | | | | 440 | fF |
| *DELAY | Z1211 | GZ1211 NAN | GZ1111 | E | 0 | PS |
| *DELAY | Z1211 | GZ1211 NAN | GZ981 | B | 114 | PS |
| *DELAY | Z1211 | GZ1211 NAN | GZ1201 | B | 114 | PS |
| *DELAY | Z1211 | GZ1211 NAN | GZ951 | B | 114 | PS |
| *LOAD | Z1231 | | | | 127 | fF |
| *DELAY | Z1231 | GZ1231 AND | GZ1401 | IN | 4 | PS |
| *LOAD | Z1233 | | | | 273 | fF |
| *DELAY | Z1233 | GZ1231 EN | GZ1021 | A | 9 | PS |
| *DELAY | Z1233 | GZ1231 EN | GZ971 | B | 1 | PS |
| *LOAD | Z1271 | | | | 464 | fF |
| *DELAY | Z1271 | GZt271 INN | GZ1331 | CK | 12 | PS |
| *DELAY | Z1271 | GZ1271 INN | GZ1341 | CK | 72 | PS |
| *DELAY | Z1271 | GZ1271 INN | GZ1381 | CK | 25 | PS |
| *LOAD | Z1281 | | | | 124 | fF |
| *DELAY | Z1281 | GZ1281 INN | GZ1351 | CK | 8 | PS |

| | | | | | | |
|---|---|---|---|---|---|---|
| *LOAD | Z1291 | | | | 437 | fF |
| *DELAY | Z1291 | GZ1291 INN | GZ1361 | CK | 61 | PS |
| *DELAY | Z1291 | GZ1291 INN | GZ132i | CK | 127 | PS |
| *DELAY | Z1291 | GZ1291 INN | GZ1371 | CK | 108 | PS |
| *LOAD | Z1301 | | | | 353 | fF |
| *DELAY | Z1301 | GZ1301 INN | GZ!281 | IN | 42 | PS |
| *DELAY | Z1301 | GZ1301 INN | GZ1271 | IN | 48 | PS |
| *DELAY | Z1301 | GZ1301 INN | GZ1291 | IN | 48 | PS |
| *LOAD | Z1311 | | | | 445 | fF |
| *DELAY | Z1311 | GZ1311 INN | GZ1341 | RN | 8 | PS |
| *DELAY | Z1311 | GZ1311 INN | GZ1321 | RN | 44 | PS |
| *DELAY | Z1311 | GZ1311 INN | GZ1371 | RN | 41 | PS |
| *LOAD | Z!322 | | | | 395 | fF |
| *DELAY | Z1322 | GZ1321 QN | GZ1141 | IN | 152 | PS |
| *DELAY | Z1322 | GZ1321 QN | GZ1091 | A | 17 | PS |
| *LOAD | Z1331 | | | | 365 | fF |
| *DELAY | Z1331 | GZ1331 Q | GZ1001 | IN | 114 | PS |
| *DELAY | Z1331 | GZ1331 Q | GZ951 | A | 31 | PS |
| *LOAD | Z1332 | | | | 120 | fF |
| *DELAY | Z1332 | GZ1331 QN | GN14MX | B | 11 | PS |
| *LOAD | Z1341 | | | | 139 | fF |
| *DELAY | Z1341 | GZ1341 Q | GZ1211 | A | 11 | PS |
| *LOAD | Z1342 | | | | 151 | fF |
| *DELAY | Z1342 | GZ1341 QN | GZ1101 | IN | 16 | PS |
| *LOAD | Z1351 | | | | 321 | fF |
| *DELAY | Z1351 | GZ1351 Q | GZ1171 | IN | 66 | PS |
| *DELAY | Z1351 | GZ!351 Q | GZ1201 | A | 7 | PS |
| *LOAD | Z1361 | | | | 262 | fF |
| *DELAY | Z1361 | GZ1361 Q | GZ1041 | IN | 128 | PS |
| *LOAD | Z1362 | | | | 141 | fF |
| *DELAY | Z1362 | GZ1361 QN | GN14MX | D | 8 | PS |
| *LOAD | Z1371 | | | | 238 | fF |
| *DELAY | Z1371 | GZ1371 Q | GZ1081 | A | 16 | PS |
| *DELAY | Z1371 | GZ1371 Q | GNN19MX | B | 16 | PS |
| *LOAD | Z1372 | | | | 286 | fF |
| *DELAY | Z1372 | GZ1371 QN | GZ1151 | | 107 | PS |
| *LOAD | Z1381 | | | | 320 | fF |
| *DELAY | Z1381 | GZ1381 Q | QZ1011 | IN | 45 | PS |
| *DELAY | Z1381 | GZ1381 Q | GZ981 | A | 1 | PS |
| *LOAD | Z1382 | | | | 142 | fF |
| *DELAY | Z1382 | GZ1381 QN | GN14MX | C | 11 | PS |
| *LOAD | Z1391 | | | | 569 | fF |
| *DELAY | Z1391 | GZ1391 INN | GZ1351 | RN | 9 | PS |
| *DELAY | Z1391 | GZ1391 INN | GZ1331 | RN | 58 | PS |
| *DELAY | Z1391 | GZ1391 INN | GZ1381 | RN | 107 | PS |
| *DELAY | Z1391 | GZ1391 INN | GZ1361 | RN | 108 | PS |
| *LOAD | Z1401 | | | | 298 | fF |
| *DELAY | Z1401 | GZ1401 INN | GZ1311 | IN | 47 | PS |

| *DELAY | Z1401 | GZ1401 | INN | GZ1391 | IN | 37 | PS |
|---|---|---|---|---|---|---|---|
| *LOAD | Z951 | | | | | 198 | fF |
| *DELAY | Z951 | GZ951 | OUT | GZ971 | E | 50 | PS |
| *LOAD | Z971 | | | | | 283 | fF |
| *DELAY | Z971 | GZ971 | NAN | GZ1161 | IN | 68 | PS |
| *LOAD | Z972 | | | | | 118 | fF |
| *DELAY | Z972 | GZ971 | EN | GZ1331 | D | 6 | PS |
| *LOAD | Z981 | | | | | 198 | fF |
| *DELAY | Z981 | GZ981 | OUT | GZ1081 | E | 35 | PS |
| *LOAD | ZPORNOD1 | | | | | 131 | fF |
| *DELAY | ZPORNOD1 | POR2 | OUT | POR1N | IN | 0 | PS |
| *DELAY | ZPORNOD1 | POR2 | OUT | POR2 | E | 0 | PS |
| *LOAD | ZPORNOD2 | | | | | 383 | fF |
| *DELAY | ZPORNOD2 | POR4 | OUT | POR9 | A | 42 | PS |
| *DELAY | ZPORNOD2 | POR4 | OUT | POR7 | E | 42 | PS |
| *DELAY | ZPORNOD2 | POR4 | OUT | POR6 | E | 42 | PS |
| *DELAY | ZPORNOD2 | POR4 | OUT | POR3 | IN | 1 | PS |
| *LOAD | ZPORNOD3 | | | | | 0 | fF |
| *DELAY | ZPORNOD3 | POR6 | OUT | POR4 | IN | 58 | PS |
| *LOAD | ZPORNOD4 | | | | | 34 | fF |
| *DELAY | ZPORNOD4 | POR7 | OUT | POR6 | IN | 0 | PS |
| *LOAD | ZPORNODCAP | | | | | 2960 | fF |
| *DELAY | ZPORNODCAP | POR8 | OUT | POR2 | IN | 59 | PS |
| *DELAY | ZPORNODCAP | POR8 | OUT | POR4 | E | 47 | PS |
| *DELAY | ZPORNODCAP | POR8 | OUT | POR5 | E | 50 | PS |
| *DELAY | ZPORNODCAP | POR8 | OUT | POR3 | EN | 47 | PS |
| *DELAY | ZPORNODCAP | POR8 | OUT | POR28 | E | 25 | PS |
| *DELAY | ZPORNODCAP | POR8 | OUT | POR11 | E | 0 | PS |
| *DELAY | ZPORNODCAP | POR8 | OUT | POR12 | E | 0 | PS |
| *DELAY | ZPORNODCAP | POR8 | OUT | POR15 | E | 0 | PS |
| *DELAY | ZPORNODCAP | POR8 | OUT | POR16 | E | 0 | PS |
| *DELAY | ZPORNODCAP | POR8 | OUT | POR17 | E | 0 | PS |
| *DELAY | ZPORNODCAP | POR8 | OUT | POR20 | E | 193 | PS |
| *DELAY | ZPORNODCAP | POR8 | OUT | POR18 | E | 0 | PS |
| *DELAY | ZPORNODCAP | POR8 | OUT | POR13 | E | 184 | PS |
| *DELAY | ZPORNODCAP | POR8 | OUT | POR19 | E | 0 | PS |
| *DELAY | ZPORNODCAP | POR8 | OUT | POR14 | E | 0 | PS |
| ~DELAY | ZPORNODCAP | POR8 | OUT | POR21 | E | O | PS |
| *DELAY | ZPORNODCAP | POR8 | OUT | POR22 | E | 0 | PS |
| *DELAY | ZPORNODCAP | POR8 | OUT | POR34 | E | 184 | PS |
| *DELAY | ZPORNODCAP | POR8 | OUT | POR23 | E | 0 | PS |
| *DELAY | ZPORNODCAP | POR8 | OUT | POR33 | E | 184 | PS |
| *DELAY | ZPORNODCAP | POR8 | OUT | POR24 | E | 0 | PS |
| *DELAY | ZPORNODCAP | POR8 | OUT | POR32 | E | 184 | PS |
| *DELAY | ZPORNODCAP | POR8 | OUT | POR25 | E | 0 | PS |
| *DELAY | ZPORNODCAP | POR8 | OUT | POR31 | E | 184 | PS |
| *DELAY | ZPORNODCAP | POR8 | OUT | POR26 | E | 0 | PS |
| *DELAY | ZPORNODCAP | POR8 | OUT | POR30 | E | 198 | PS |

```
*DELAY   ZPORNODCAP   POR8   OUT   POR27      E       0   PS
*DELAY   ZPORNODCAP   POR8   OUT   POR29      E     198   PS
```

We claim:

1. A system for creating a factory-programmed device using a sample device and a logic description of said sample device, comprising:

means, receiving said logic description, for generating a computer model of a logic circuit therefrom;

means, coupled to said means for generating a computer model, for generating a test program from said computer model, said test program including data representing stimulus signals to said sample device and expected output signals of said sample device when said stimulus signals are applied to said sample device; and means, coupled to said means for generating a test program, for testing said sample device, wherein said means for testing (i) applies said stimulus signals in accordance with said test program; (ii) obtains output signals from said sample device, and (iii) compares said expected output signals with said output signals from said sample device.

2. A system as in claim 1, further comprising means, coupled to said means for generating a computer model and said means for testing said sample device, for generating a physical circuit layout from said computer model when said expected output signals and said output signals from said sample device are compared to be substantially equal in said means for testing.

3. A system as in claim 1, wherein said means for generating a computer model comprises an expert system.

4. A system as in claim 1, wherein said means for generating a test program further comprises means for simulating faults.

5. A process for creating a factory-programmed device using a sample device and a logic description of said sample device, comprising the steps of:

generating from said logic description a computer model of a logic circuit;

generating a test program from said computer model, said test program including data representing stimulus signals for testing said sample device and expected output signals of said sample device when said stimulus signals are applied to said sample device;

applying said stimulus signals to said sample device in accordance with said test program to obtain output signals of said sample device; and comparing said output signals with said expected output signals.

6. A process as in claim 5, further comprising the step of generating a physical circuit layout of said logic circuit from said computer model when said step of comparing indicates that said output signals and said expected output signals are substantially equal.

7. A process as in claim 5, wherein said step of generating a computer model comprises the step of using an expert system.

8. A process as in claim 5, wherein said step of generating a test program further comprises the step of simulating faults.

* * * * *